(12) United States Patent
Castro et al.

(10) Patent No.: US 10,622,452 B2
(45) Date of Patent: Apr. 14, 2020

(54) TRANSISTORS WITH DUAL GATE CONDUCTORS, AND ASSOCIATED METHODS

(71) Applicant: Maxim Integrated Products, Inc., San Jose, CA (US)

(72) Inventors: Tom K. Castro, Santa Clara, CA (US); Marco A. Zuniga, Berkeley, CA (US); Badredin Fatemizadeh, Palo Alto, CA (US); Adam Brand, Palo Alto, CA (US); John Xia, Fremont, CA (US); Rajwinder Singh, Pleasanton, CA (US); Min Xu, San Jose, CA (US); Chi-Nung Ni, Foster City, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 4 days.

(21) Appl. No.: 16/000,719

(22) Filed: Jun. 5, 2018

(65) Prior Publication Data

US 2019/0371902 A1    Dec. 5, 2019

(51) Int. Cl.
*H01L 29/423*    (2006.01)
*H01L 29/417*    (2006.01)
(Continued)

(52) U.S. Cl.
CPC .... *H01L 29/42376* (2013.01); *H01L 23/5286* (2013.01); *H01L 27/0629* (2013.01); *H01L 28/60* (2013.01); *H01L 29/063* (2013.01); *H01L 29/0865* (2013.01); *H01L 29/0882* (2013.01); *H01L 29/1095* (2013.01); *H01L 29/41775* (2013.01); *H01L 29/4236* (2013.01); *H01L 29/42364* (2013.01); *H01L 29/66704* (2013.01); *H01L 29/7823* (2013.01); *H01L 29/7825* (2013.01); *H02M 3/158* (2013.01)

(58) Field of Classification Search
CPC .............. H02M 3/158; H01L 23/5286; H01L 27/0629; H01L 29/063; H01L 29/0865; H01L 29/0882; H01L 29/1095; H01L 29/41775; H01L 29/4236; H01L 29/42364; H01L 29/66704; H01L 29/7823; H01L 29/7825; H01L 29/42376
See application file for complete search history.

(56) References Cited

U.S. PATENT DOCUMENTS 4,774,556 A * 9/1988 Fujii ................. H01L 27/11556
                                                      257/316
4,989,055 A * 1/1991 Redwine ............... H01L 27/108
                                                      257/302
(Continued)

*Primary Examiner* — Yosef Gebreyesus
(74) *Attorney, Agent, or Firm* — Lathrop GPM LLP

(57) ABSTRACT

A lateral double-diffused metal-oxide-semiconductor (LD-MOS) transistor includes a silicon semiconductor structure and a vertical gate. The vertical gate includes (a) a first gate conductor and a second gate conductor each extending from a first outer surface of the silicon semiconductor structure into the silicon semiconductor structure in a thickness direction, (b) a first separation dielectric layer separating the first gate conductor from the second gate conductor within the vertical gate, and (c) a gate dielectric layer separating each of the first gate conductor and the second gate conductor from the silicon semiconductor structure.

15 Claims, 48 Drawing Sheets

(51) Int. Cl.
*H01L 29/10* (2006.01)
*H01L 29/08* (2006.01)
*H01L 29/78* (2006.01)
*H01L 49/02* (2006.01)
*H01L 23/528* (2006.01)
*H01L 29/66* (2006.01)
*H01L 29/06* (2006.01)
*H01L 27/06* (2006.01)
*H02M 3/158* (2006.01)

(56) References Cited

U.S. PATENT DOCUMENTS

| | | |
|---|---|---|
| 7,345,342 B2 | 3/2008 | Challa et al. |
| 8,709,899 B2 | 4/2014 | Zuniga et al. |
| 9,084,084 B2 | 7/2015 | Chiu |
| 9,721,806 B2 | 8/2017 | Fang |
| 2009/0273026 A1* | 11/2009 | Wilson ............... H01L 29/0847 257/330 |
| 2013/0105887 A1* | 5/2013 | Zuniga ............. H01L 29/66704 257/330 |
| 2017/0346477 A1 | 11/2017 | Xia et al. |
| 2019/0074349 A1* | 3/2019 | Lin ................... H01L 21/31111 |

* cited by examiner

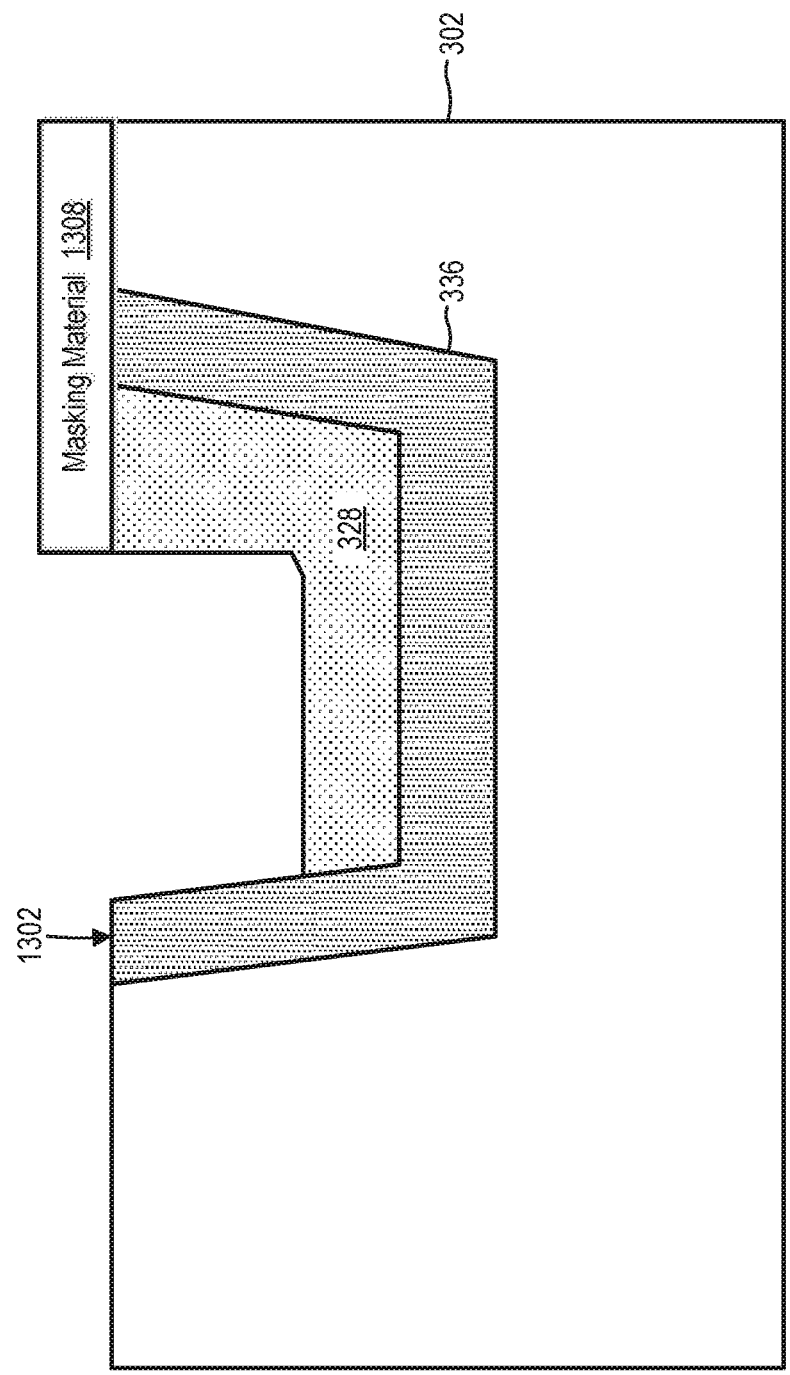

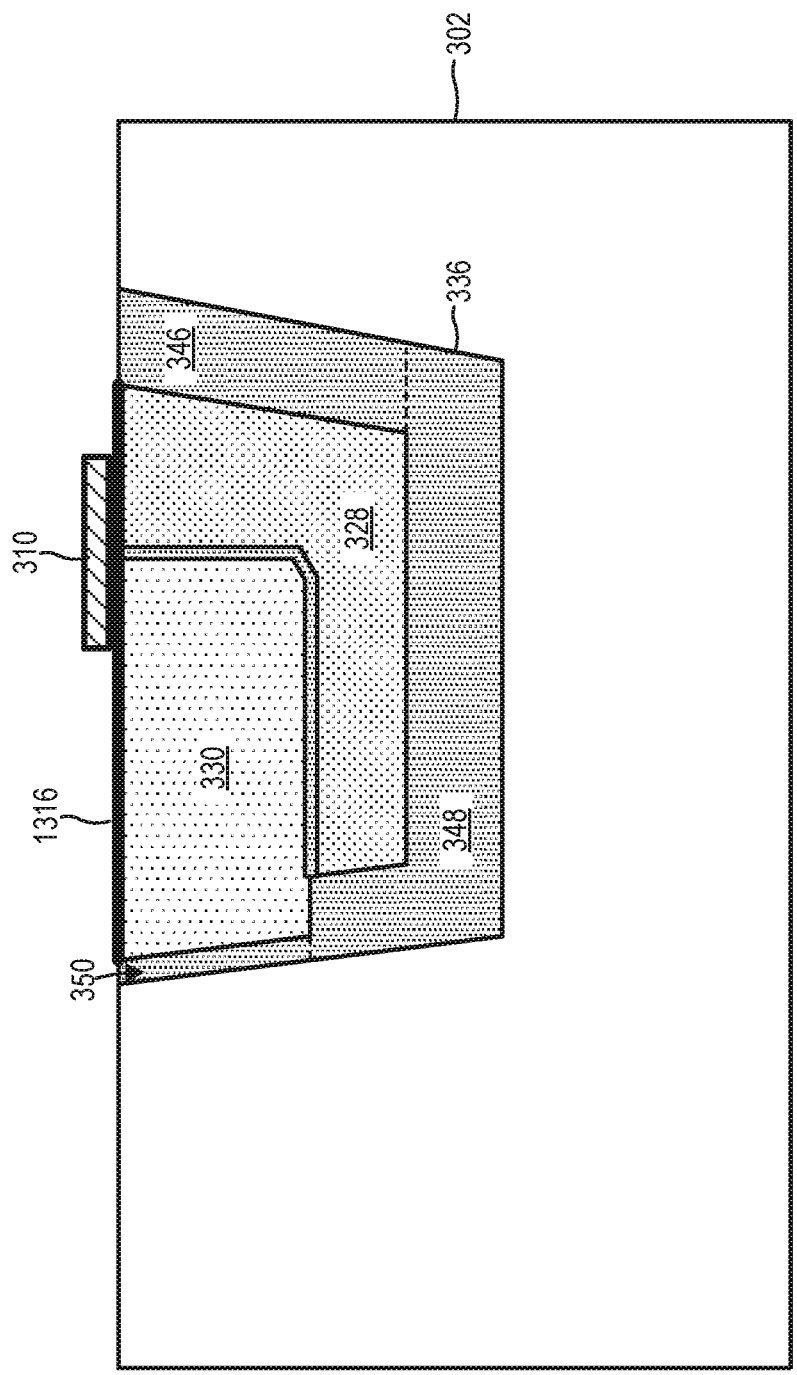

TRANSISTORS WITH DUAL GATE CONDUCTORS, AND ASSOCIATED METHODS

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is blocked within the transistors' semiconductor material primarily in a lateral direction. LDMOS transistors are often combined with other circuitry in integrated circuits, especially in power applications or radio-frequency applications.

FIG. 1 is a cross-sectional view of a conventional n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage $V_{DS}$ is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage $V_{DS}$, thereby enabling LDMOS transistor 100 to support a relatively large value of $V_{DS}$ without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. This channel has excess electrons and will therefore conduct current. Consequentially, current will flow in the lateral 138 direction through silicon semiconductor structure 102 from drain n+ region 132 to source n+ region 130 when $V_{GS}$ exceeds a threshold value and $V_{DS}$ is a positive value.

BRIEF DESCRIPTION OF THE DRAWINGS

FIGS. 13A-13K illustrate one example of using the FIG. 12 method to form a vertical gate including two gate conductors, according to an embodiment.

DETAILED DESCRIPTION OF THE EMBODIMENTS

Figure 1:
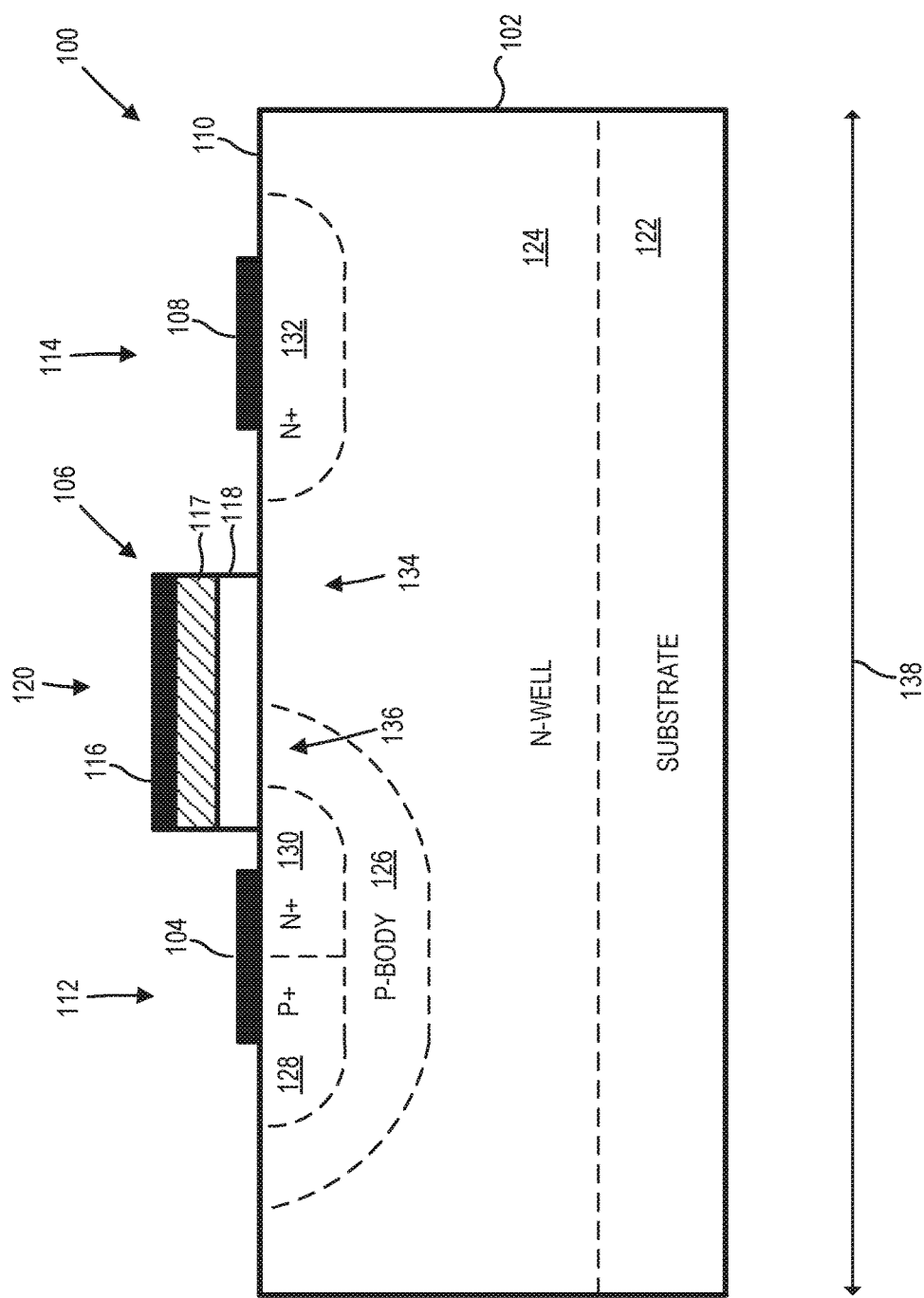
FIG. 1 is a cross-sectional view of a conventional LDMOS transistor.
Figure 2:
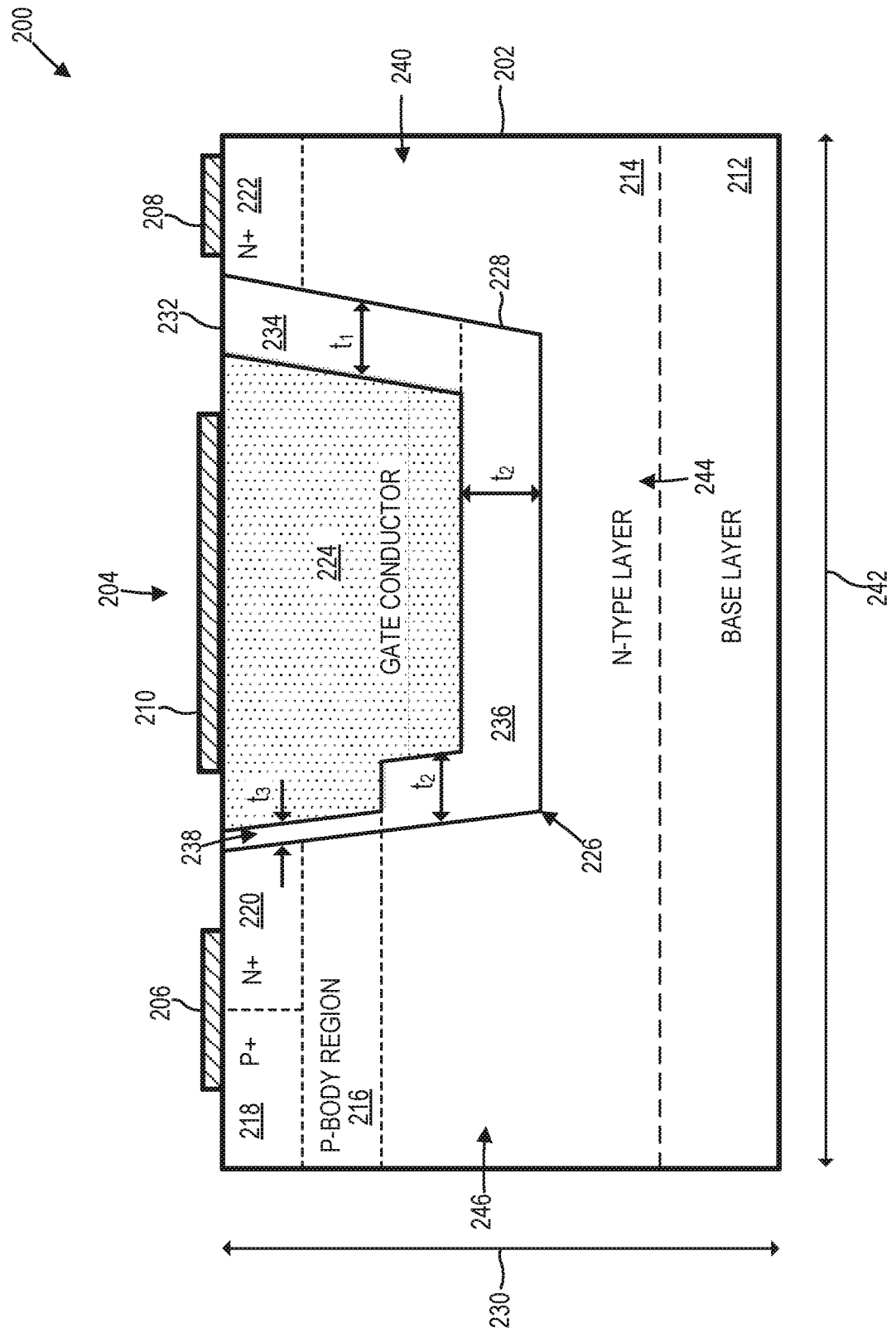
FIG. 2 is a cross-sectional view of a LDMOS transistor including a vertical gate with three dielectric sections.

A recent innovation in the field of LDMOS transistors is the development of vertical gate transistors with a dielectric layer including a plurality of dielectric sections, to promote high transistor performance and small transistor pitch. For example, FIG. 2 is a cross-sectional view of a LDMOS transistor 200 including a vertical gate with three dielectric sections. LDMOS transistor 200 includes a silicon semiconductor structure 202, a vertical gate 204, a source electrode 206, a drain electrode 208, and a gate electrode 210. Silicon semiconductor structure 202 includes a base layer 212, an n-type layer 214, a p-body region 216, a source p+ region 218, a source n+ region 220, and a drain n+ region 222.

Vertical gate 204 includes a gate conductor 224 and a gate dielectric layer 226 each disposed in a trench 228 of silicon semiconductor structure 202. Gate conductor 224 extends from an outer surface 232 into silicon semiconductor structure 202 in a thickness direction 230, and gate dielectric layer 226 includes a first dielectric section 234, a second dielectric section 236, and a third dielectric section 238.

Each dielectric section 234, 236, and 238 separates gate conductor 224 from silicon semiconductor structure 202 by a respective separation distance. In particular, first dielectric section 234 separates gate conductor 224 from a drain portion 240 of n-type layer 214 in lateral direction 242 by a first separation distance $t_1$. Additionally, second dielectric section 236 separates gate conductor 224 from a well portion 244 of n-type layer 214 in thickness direction 230 by a second separation distance $t_2$, and second dielectric section 236 also separates gate conductor 224 from a source portion 246 of n-type layer 214 in lateral direction 242 by second separation distance $t_2$. Third dielectric section 238 separates gate conductor 224 from p-body region 216 by a third separation distance $t_3$.

Each of first separation distance $t_1$, second separation distance $t_2$, and third separation distance $t_3$ is different from each other of first separation distance $t_1$, second separation distance $t_2$, and third separation distance $t_3$. Such differences in separation distances may advantageously enable achieving both high breakdown voltage and low on-resistance of LDMOS transistor 200. In particular, values of each of first, second, and third separation distances $t_1$, $t_2$, and $t_3$ affect different respective characteristics of LDMOS transistor 200. For example, gate-to-drain breakdown voltage of LDMOS transistor 200 increases with increasing value of first separation distance $t_1$, while value of second separation distance $t_2$ affects electric field distribution, gate-to-drain capacitance, and accumulation resistance in n-type layer 214. Value of third separation distance $t_3$, in turn, affects threshold voltage and gate-to-source breakdown voltage of LDMOS transistor 200. Specifically, threshold voltage decreases with decreasing value of third separation distance $t_3$, while gate-to-source breakdown voltage of LDMOS transistor 200 increases with increasing value of third separation distance $t_3$.

Forming gate dielectric layer 226 of first, second, and third dielectric sections 234, 236, and 238 enables each of respective first, second, and third separation distances $t_1$, $t_2$, and $t_3$ to be independently selected, thereby helping LDMOS transistor 200 achieve both high breakdown voltage and low on-resistance. For example, first separation distance $t_1$ may be selected to achieve a high gate-to-drain breakdown voltage, while second separation distance $t_2$ may be independently selected to achieve a desired balance between accumulation conductance and uniform electric field distribution, to promote low on-resistance while achieving high breakdown voltage. If gate dielectric layer 226 were instead formed of a single dielectric layer having uniform thickness, the dielectric layer thickness would need to be chosen to achieve a sufficiently high gate-to-drain breakdown voltage, thereby resulting in a less than optimum thickness of the dielectric layer adjacent to well portion 244 and source portion 246 of n-type layer 214, which would increase on-resistance. As another example, the ability of first, second, and third separation distances $t_1$, $t_2$, and $t_3$ to be independently selected enables $t_1$ and $t_2$ to be selected without being constrained by a value of $t_3$ required to achieve desired gate control, thereby further enabling $t_1$ and $t_2$ to be selected to achieve high breakdown voltage and low on-resistance, respectively. As yet another example, the ability to independently select first and second separation distances $t_1$ and $t_2$ enables doping profile of n-type layer 214 to be different in drain portion 240 of n-type layer 214 than in source portion 246 of n-type layer 214 and in well portion 244 of n-type layer 214, further enabling LDMOS transistor 200 to achieve high breakdown voltage and low on-resistance. Third separation distance $t_3$ is, for example, less than each of first separation distance $t_1$ and second separation distance $t_2$.

While LDMOS transistor 200 has significant advantageous features, LDMOS transistor 200 may be difficult to manufacture. For example, it may be difficult to form third dielectric section 238 without damaging first and second dielectric sections 234 and 236. As another example, it may be difficult to achieve a desired profile of trench 228 with gate dielectric layer 226 having a varying thickness.

Applicant has developed new LDMOS transistors and methods for forming the new transistors which at least partially overcome one or more of the drawbacks discussed above. These new LDMOS transistors include a plurality of gate conductors, which facilitate transistor production, promote flexibility in transistor configuration, and/or promote small transistor pitch. Additionally, certain embodiments of the transistor formation methods use one or more of the plurality of gate conductors to protect a drain portion and a well portion of a gate dielectric layer, while forming a source portion of the gate dielectric layer. Additionally, certain embodiments of the transistor formation methods are compatible with complementary metal oxide semiconductor (CMOS) processes and can be leveraged to form trench capacitors.

Figure 3:
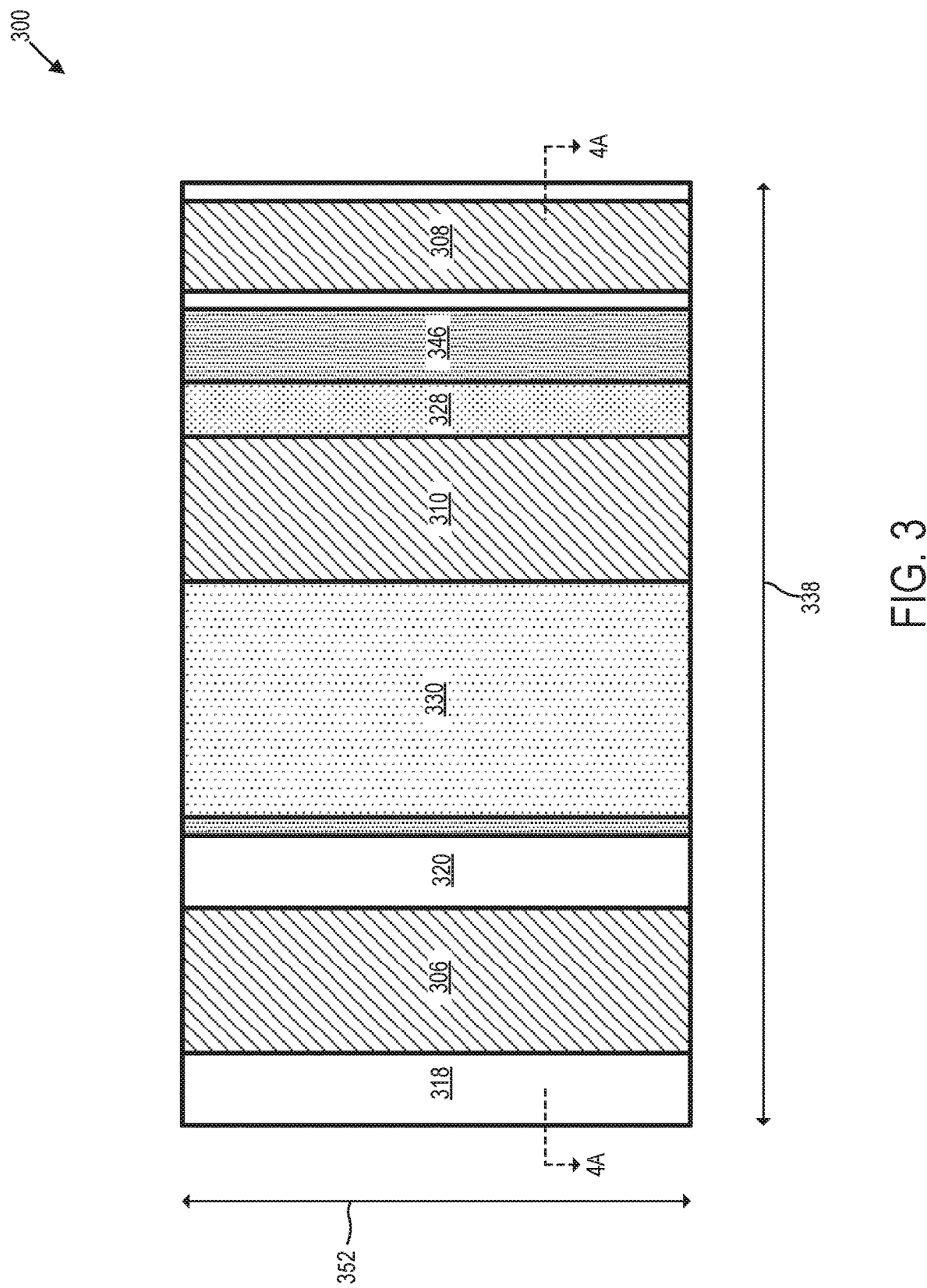
FIG. 3 is a top plan view of a LDMOS transistor including two gate conductors, according to an embodiment.
Figure 4:
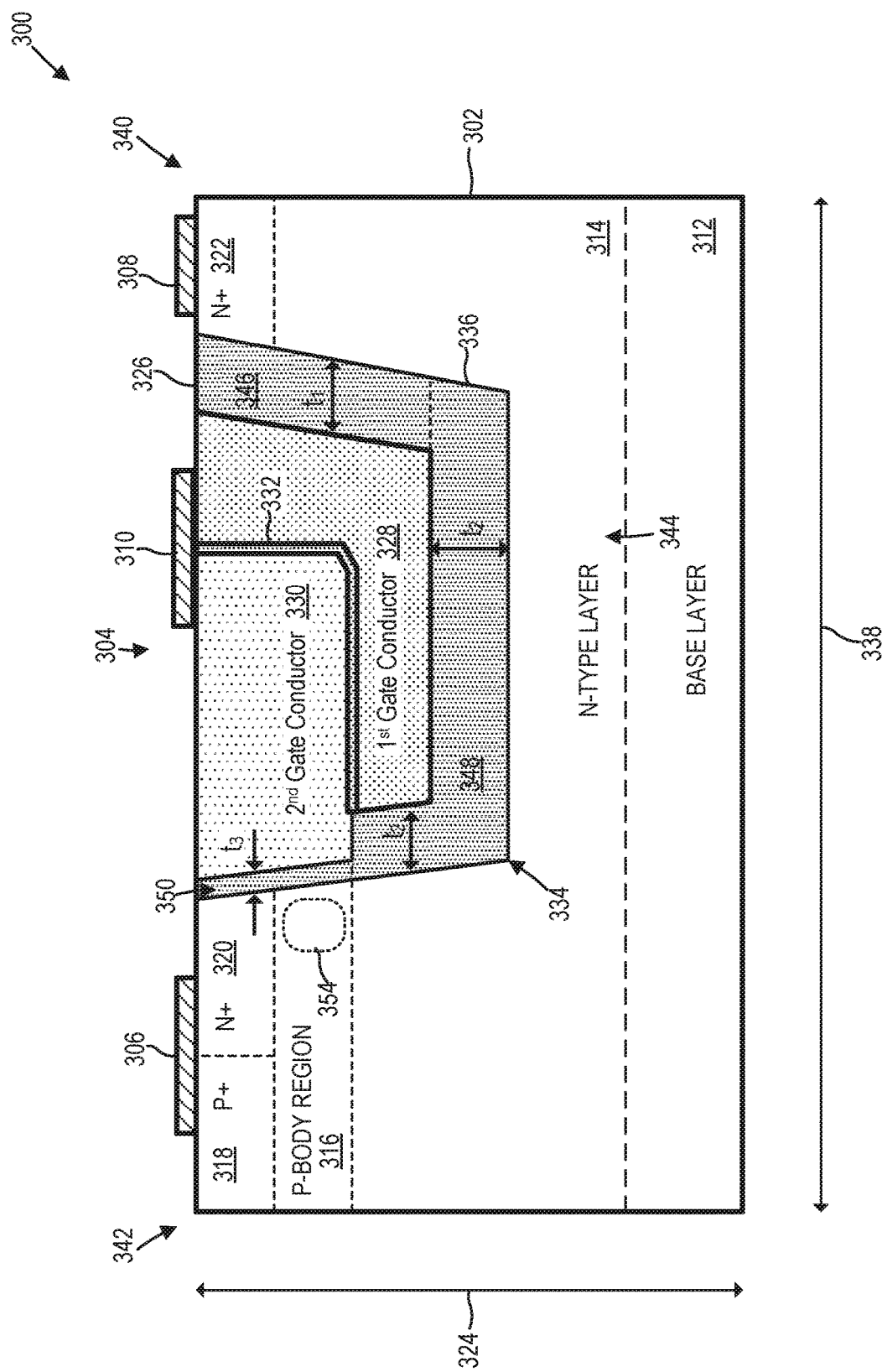
FIG. 4 is a cross-sectional view of the FIG. 3 LDMOS transistor taken along line 4A-4A of FIG. 3.

FIGS. 3 and 4 illustrate one embodiment of the new LDMOS transistors developed by Applicant. In particular, FIG. 3 is a top plan view of a LDMOS transistor 300 including a vertical gate with two gate conductors, and FIG. 4 is a cross-sectional view of LDMOS transistor 300 taken along line 4A-4A of FIG. 3. LDMOS transistor 300 includes a silicon semiconductor structure 302, a vertical gate 304, a source electrode 306, a drain electrode 308, and a first gate electrode 310.

Silicon semiconductor structure 302 includes a base layer 312, an n-type layer 314, a p-body region 316, a source p+ region 318, a source n+ region 320, and a drain n+ region 322. Base layer 312 is, for example, an n-type high-voltage well in a silicon substrate, a p-type silicon substrate, a p-type reduced surface field effect (RESURF) layer, or an n-type epitaxial layer grown over a p-type silicon substrate. N-type layer 314 is disposed over base layer 312 in a thickness direction 324, and p-body region 316 is disposed in n-type layer 314 adjacent to an outer surface 326 of silicon semiconductor structure 302. Source p+ region 318 and source n+ region 320 are each disposed in p-body region 316, and drain n+ region 322 is disposed in n-type layer 314 adjacent to outer surface 326. Source p+ region 318 has a greater p-type dopant concentration than p-body region 316, and each of source n+ region 320 and drain n+ region 322 has a greater n-type dopant concentration than n-type layer 314.

Silicon semiconductor structure 302 can include additional impurity regions without departing from the scope hereof. Additionally, the locations of source p+ region 318 and source n+ region 320 within p-body region 316 can be varied. For example, in an alternate embodiment (not illustrated), source p+ region 318 is disposed behind source n+ region 320 within p-body region 316. Furthermore, source p+ region 318 could be omitted without departing from the scope hereof.

One or more regions of silicon semiconductor structure 302 optionally has a graded dopant concentration. For example, in some embodiments, n-type layer 314 has a graded n-type dopant concentration where n-type dopant concentration is greatest near drain n+ region 322, and p-body region 316 has a graded p-type dopant concentration where p-type dopant concentration is greatest near source n+ region 320. In certain embodiments, n-type layer 314 is configured to have n-type dopant gradient concentrations which help maximize accumulation conductance while maintaining desired breakdown voltage of LDMOS transistor 300. Additionally, although the impurity regions of silicon semiconductor structure 302 are delineated by straight lines in FIGS. 3 and 4 for illustrative simplicity, the actual shape of impurity regions of silicon semiconductor structure 302 may vary from that illustrated without departing from the scope hereof. For example, p-body region 316 may have a rounded or irregular bottom surface instead of the straight-line bottom surface illustrated in FIG. 4.

Vertical gate 304 includes a first gate conductor 328, a second gate conductor 330, a first separation dielectric layer 332, and a gate dielectric layer 334, each disposed in a trench 336 of silicon semiconductor structure 302. Depth of trench 336 is selected, in part, according to required breakdown voltage of LDMOS transistor 300. Breakdown voltage magnitude increases with increasing depth of trench 336 in thickness direction 324. Each of first gate conductor 328 and second gate conductor 330 extends from outer surface 326 into silicon semiconductor structure 302 in thickness direction 324. First separation dielectric layer 332 separates first gate conductor 328 from second gate conductor 330 within trench 336 in each of thickness direction 324 and a lateral direction 338, where lateral direction 338 is orthogonal to thickness direction 324. First gate conductor 328 is adjacent to a drain region 340 of LDMOS transistor 300 in lateral direction 338, and first gate conductor 328 is also adjacent to a well region 344 of LDMOS transistor 300 in thickness direction 324. Second gate conductor 330 is adjacent to a source region 342 of LDMOS transistor 300 in lateral direction 338. Well region 344 is below vertical gate 304 in thickness direction 324. Source region 342 and drain region 340 are each disposed on opposite sides of vertical gate 304 in lateral direction 338.

Gate dielectric layer 334 includes a first dielectric section 346, a second dielectric section 348, and a third dielectric section 350. Gate dielectric layer 334 separates each of first gate conductor 328 and second gate conductor 330 from silicon semiconductor structure 302. Each of first gate conductor 328 and second gate conductor 330 is disposed between source n+ region 320 and drain n+ region 322 in lateral direction 338. The fact that LDMOS transistor 300 has a vertical gate instead of a horizontal gate minimizes length of LDMOS transistor 300 in lateral direction 338, thereby promoting small transistor size and high transformer performance. First dielectric section 346 separates first gate conductor 328 from drain region 340 of LDMOS transistor 300 in lateral direction 338 by a first separation distance $t_1$. Second dielectric section 348 separates first gate conductor 328 from well region 344 of LDMOS transistor 300 in thickness direction 324 by a second separation distance $t_2$, and second dielectric section 348 also separates first gate conductor 328 from source region 342 of LDMOS transistor 300 in lateral direction 338 by second separation distance $t_2$. Third dielectric section 350 separates second gate conductor 330 from source region 342 by a third separation distance $t_3$ in lateral direction 338, and third dielectric section 350 is adjacent to at least p-body region 316 and source n+ region 320 in lateral direction 338. Gate dielectric layer 334 could be modified to have additional dielectric sections, such as to enable further optimization of LDMOS transistor 300. For example, in one alternate embodiment, second dielectric section 348 is split into two dielectric sections, such that first gate conductor 328 is separated from source region 342 of LDMOS transistor 300 in lateral direction 338 by a separation distance different from second separation distance $t_2$. Additionally, gate dielectric layer 334 could be modified to have fewer dielectric sections, such as to reduce complexity of manufacturing LDMOS transistor 300, without departing from the scope hereof.

The values of each of first, second, and third separation distances $t_1$, $t_2$, and $t_3$ affect different respective characteristics of LDMOS transistor 300 in a manner similar to that discussed above with respect to FIG. 2. In certain embodiments, each of first separation distance $t_1$, second separation distance $t_2$, and third separation distance $t_3$ are different from each other, and separation distances $t_1$, $t_2$, and $t_3$ are selected, for example, as discussed above with respect to FIG. 2, to achieve both high breakdown voltage and low on-resistance of LDMOS transistor 300. In a particular embodiment, third separation distance $t_3$ is less than each of first separation distance $t_1$ and second separation distance $t_2$.

In certain embodiments, each of first gate conductor 328 and second gate conductor 330 are formed of a polysilicon material. First separation dielectric layer 332, first dielectric section 346, second dielectric section 348, and third dielectric section 350 are formed, for example, of silicon dioxide or a high-K dielectric material such as one or more of $HfO_2$, $TiO_2$, $ZrO_2$, and $HfAlO_x$. In some embodiments, first separation dielectric layer 332, first dielectric section 346, second dielectric section 348, and third dielectric section 350 are formed of a common dielectric material, while in some other embodiments, at least two of first separation dielectric layer 332, first dielectric section 346, second dielectric section 348, and third dielectric section 350 are formed of different dielectric materials.

Source electrode 306 is disposed on outer surface 326 and is electrically coupled to each of source p+ region 318 and source n+ region 320. Drain electrode 308 is disposed on outer surface 326 and is electrically coupled to drain n+ region 322, and first gate electrode 310 is disposed on outer surface 326 and is electrically coupled to each of first gate conductor 328 and second gate conductor 330. In some embodiments, a respective silicide layer (not shown) and/or other conductive layer is disposed between silicon semiconductor structure 302 and each of source electrode 306, drain electrode 308, and first gate electrode 310. In some alternate embodiments, source electrode 306 is replaced with two separate electrodes electrically coupled to source p+ region 318 and source n+ region 320, respectively.

When positive voltage $V_{DS}$ is applied between drain electrode 308 and source electrode 306, a p-n junction formed at the interface of n-type layer 314 and p-body region 316 is reversed biased, so that very little current flows between drain electrode 308 and source electrode 306 by default. However, a positive voltage $V_{GS}$ applied between first gate electrode 310 and source electrode 306 creates negative charges in semiconductor structure 302 adjacent to third dielectric section 350 in lateral direction 338, causing a minority-carrier channel to form in a portion of p-body region 316 approximately indicated by dashed-line 354. This channel has excess electrons and therefore conducts electric current through p-body region 316 from n-type layer 314 to source n+ region 320. Consequentially, current will flow from drain n+ region 322 to source n+ region 320 when $V_{GS}$ exceeds a threshold value and $V_{DS}$ is a positive value. The threshold value is established, in part, by the dopant concentration in p-body region 316 and by the value of third separation distance $t_3$. For example, threshold voltage can be reduced by decreasing p-type dopant concentration in p-body region 316 adjacent to third dielectric section 350 and/or by decreasing the value of third separation distance $t_3$. Source p+ region 318 forms an ohmic contact between p-body region 316 and source electrode 306 to help prevent a parasitic bipolar junction transistor (not shown) in silicon semiconductor substrate 302 from activating.

Figure 5:
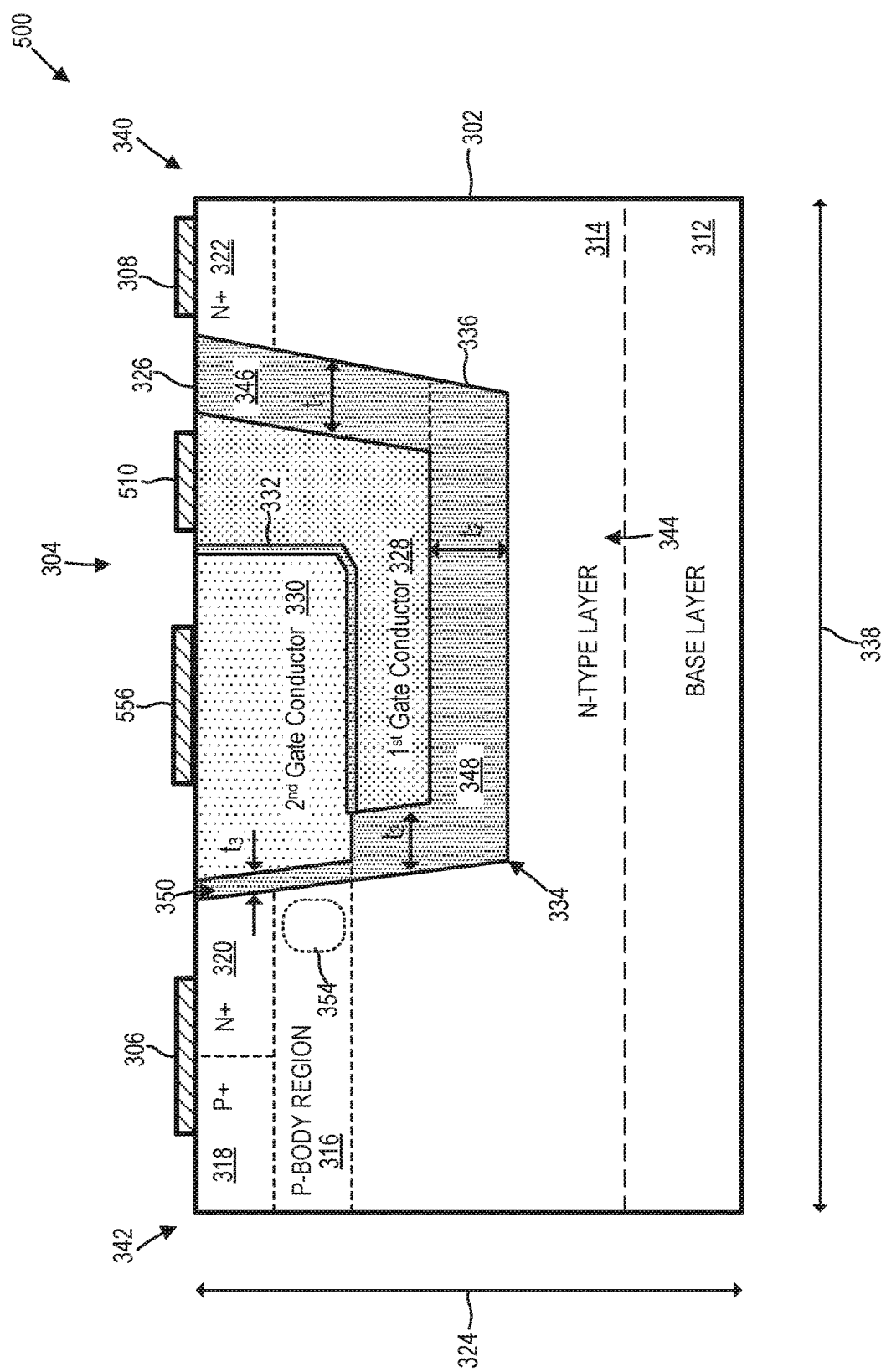
FIG. 5 is a cross-sectional view of a LDMOS transistor which is similar to the FIG. 3 LDMOS transistor, but with first and second gate conductors electrically coupled to different respective electrodes, according to an embodiment.

First gate conductor 328, for example, helps protect a drain portion (first dielectric section 346) and a well portion (second dielectric section 348) of gate dielectric layer 334 when forming a source portion (third dielectric layer 350) of the gate dielectric layer 334. Additionally, although first gate conductor 328 and second gate conductor 330 are electrically coupled to a common electrode, i.e., first gate electrode 310 in LDMOS transistor 300, first gater conductor 328 and second gate conductor 330 could alternately be electrically coupled to different respective electrodes to allow additional flexibility in configuring LDMOS transistor 300. For example, FIG. 5 is a cross-sectional view of an LDMOS transistor 500 which is similar to LDMOS transistor 300 but with first gate conductor 328 and second gate conductor 330 electrically coupled to different respective electrodes. In particular, first gate conductor 328 is electrically coupled to a first gate electrode 510, and second gate conductor 330 is electrically coupled to a second gate electrode 556. In certain applications of LDMOS transistor 500, LDMOS transistor 500 is switched via second gate electrode 556 by driving second gate electrode 556 between at least two different voltages, and first gate electrode 510 is connected to a steady-state voltage source, e.g., to ground or a non-zero power supply rail, to decouple gate capacitance from switching of LDMOS transistor 500.

Figure 6:
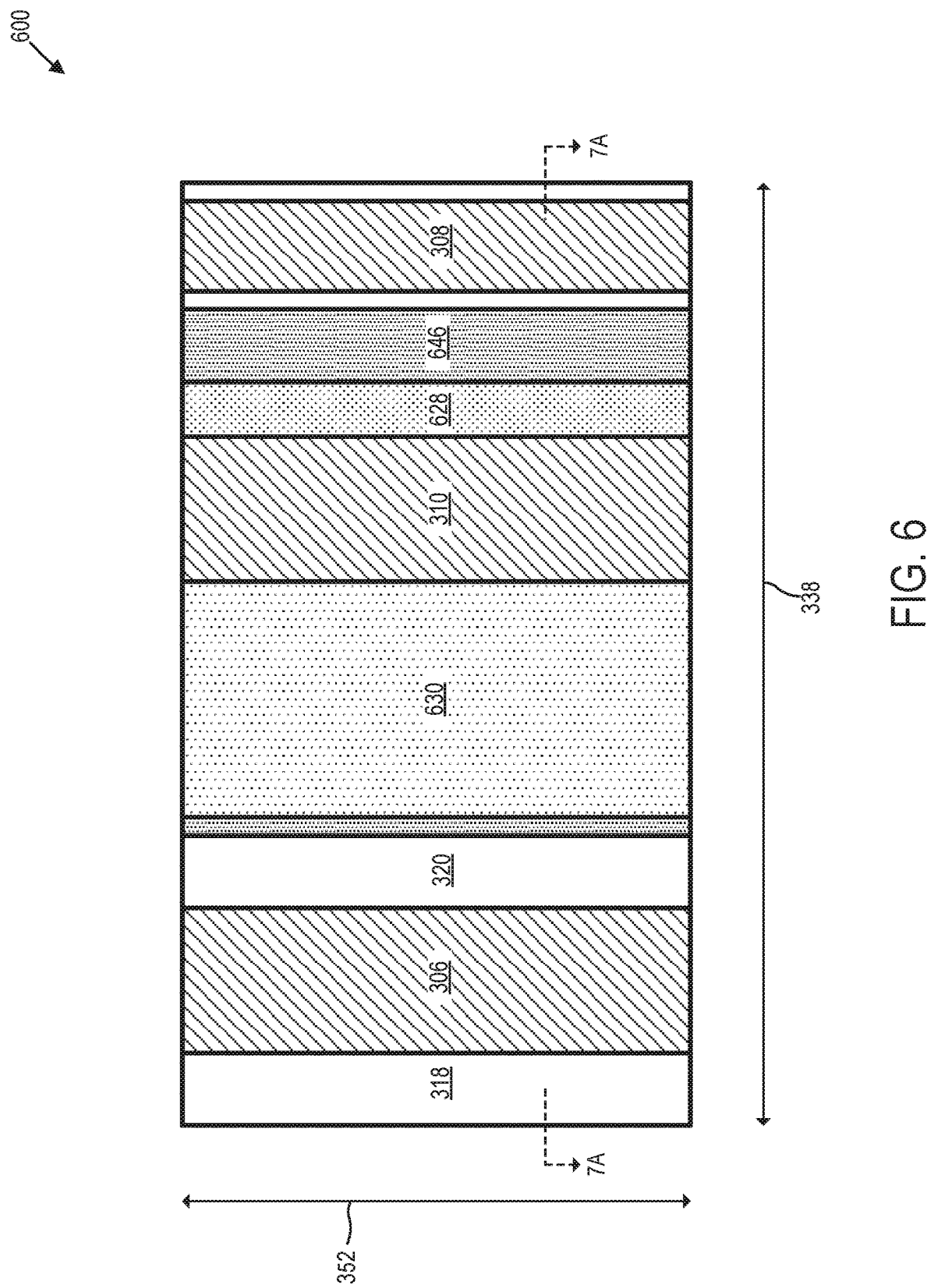
FIG. 6 is a top plan view of a LDMOS transistor including three gate conductors, according to an embodiment.
Figure 7:
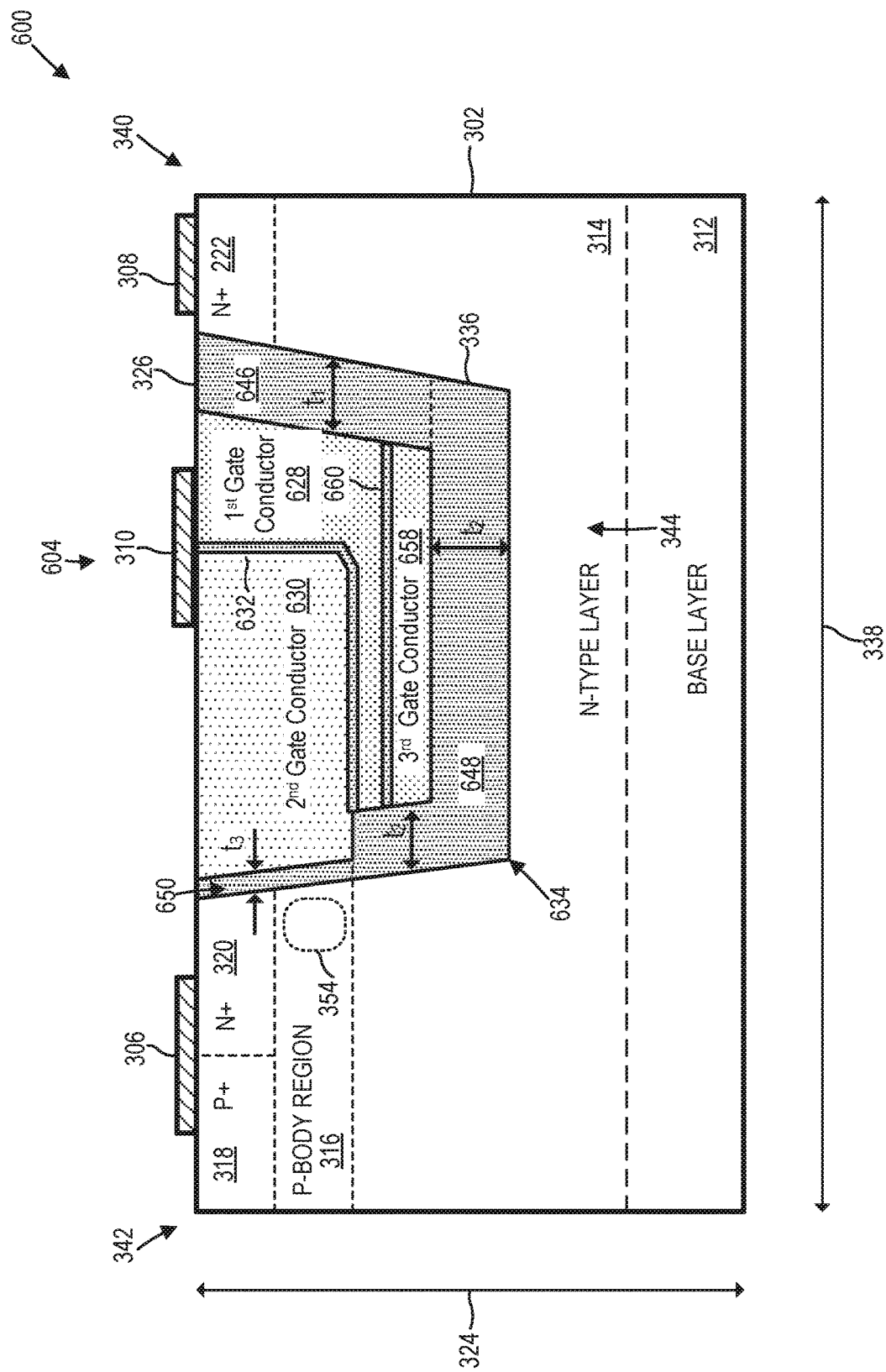
FIG. 7 is a cross-sectional view of the FIG. 6 LDMOS transistor taken along line 7A-7A of FIG. 6.

The new LDMOS transistors developed by Applicant are not limited to including two gate conductors but instead could include one or more additional gate conductors. For example, FIG. 6 is a top plan view of a LDMOS transistor 600 including a vertical gate with three gate conductors, and FIG. 7 is a cross-sectional view of LDMOS transistor 600 taken along line 7A-7A of FIG. 6. LDMOS transistor 600 is similar to LDMOS transistor 300 of FIGS. 3 and 4, but with vertical gate 304 replaced with a vertical gate 604. Vertical gate 604 includes a first gate conductor 628, a second gate conductor 630, a third gate conductor 658, a first separation dielectric layer 632, a second separation dielectric 660 layer, and a gate dielectric layer 634 each disposed in trench 336.

Gate dielectric layer 634 includes a first dielectric section 646, a second dielectric section 648, and a third dielectric section 650 which are analogous to first dielectric section 346, second dielectric section 348, and third dielectric section 350, respectively. Gate dielectric layer 634 separates each of first gate conductor 628, second gate conductor 630, and third gate conductor 658 from silicon semiconductor structure 302.

Third gate conductor 658 is disposed in a bottom of trench 336 such that third gate conductor is adjacent to well region 344 of LDMOS transistor 600 in thickness direction 324. Second gate conductor 628 is disposed over third gate conductor 658 in thickness direction 324, and second separation dielectric layer 660 separates first gate conductor 628 from third gate conductor 658 in vertical gate 604 in thickness direction 324. Each of first gate conductor 628 and second gate conductor 630 extends from outer surface 326 into silicon semiconductor structure 302 in thickness direction 324. First separation dielectric layer 632 separates first gate conductor 628 from second gate conductor 630 within trench 336 in each of thickness direction 324 and lateral direction 338. First gate conductor 628 is adjacent to drain region 340 of LDMOS transistor 300 in lateral direction 338, and second gate conductor 630 is adjacent to source region 342 of LDMOS transistor 300 in lateral direction 338. LDMOS transistor 600 optionally further includes a third gate electrode (not shown) electrically coupled to third gate conductor 658.

Figure 8:
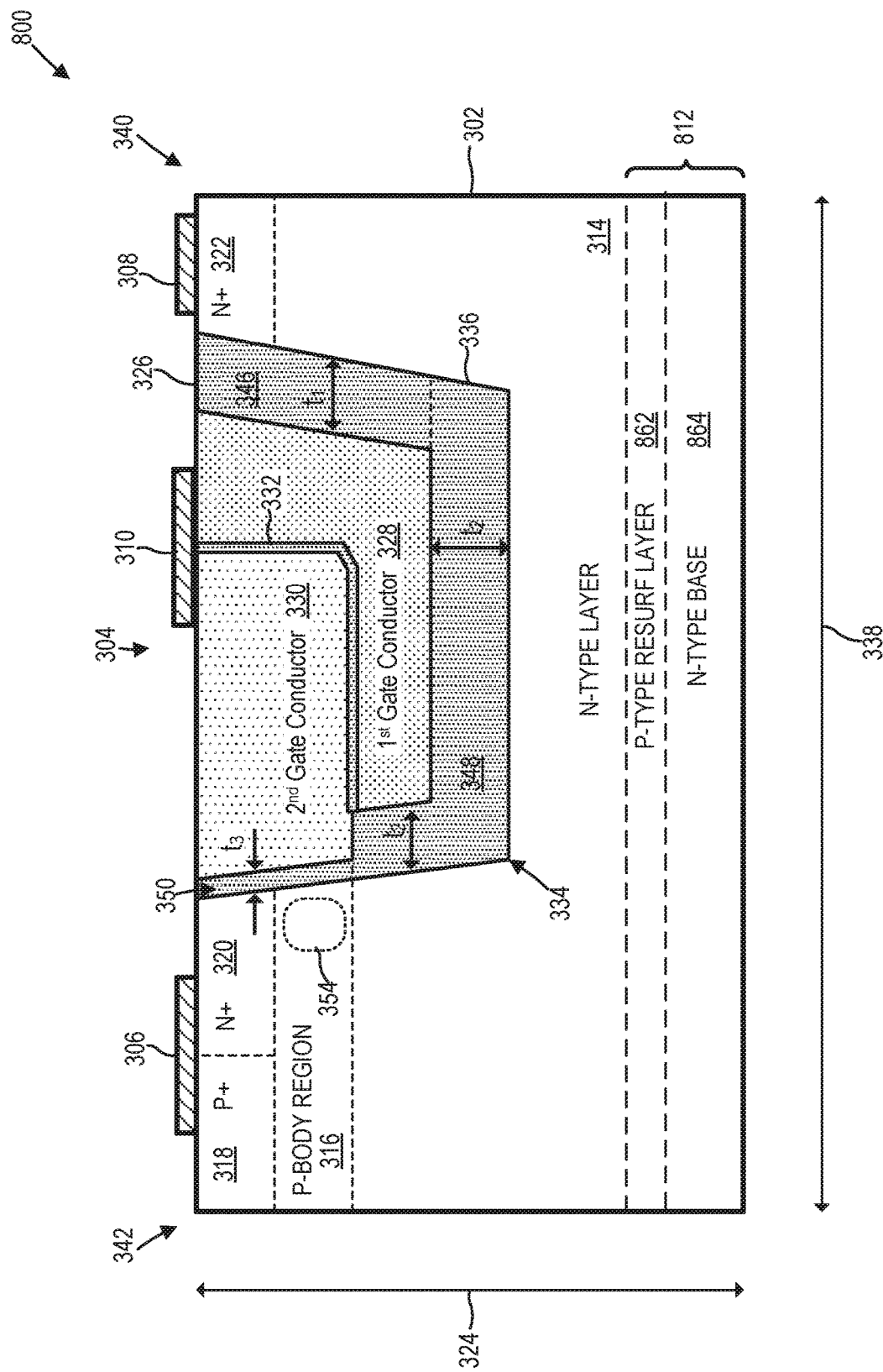
FIG. 8 is a cross-sectional view of a LDMOS transistor with two gate conductors and including a base layer with a p-type reduced surface field effect layer, according to an embodiment.
Figure 9:
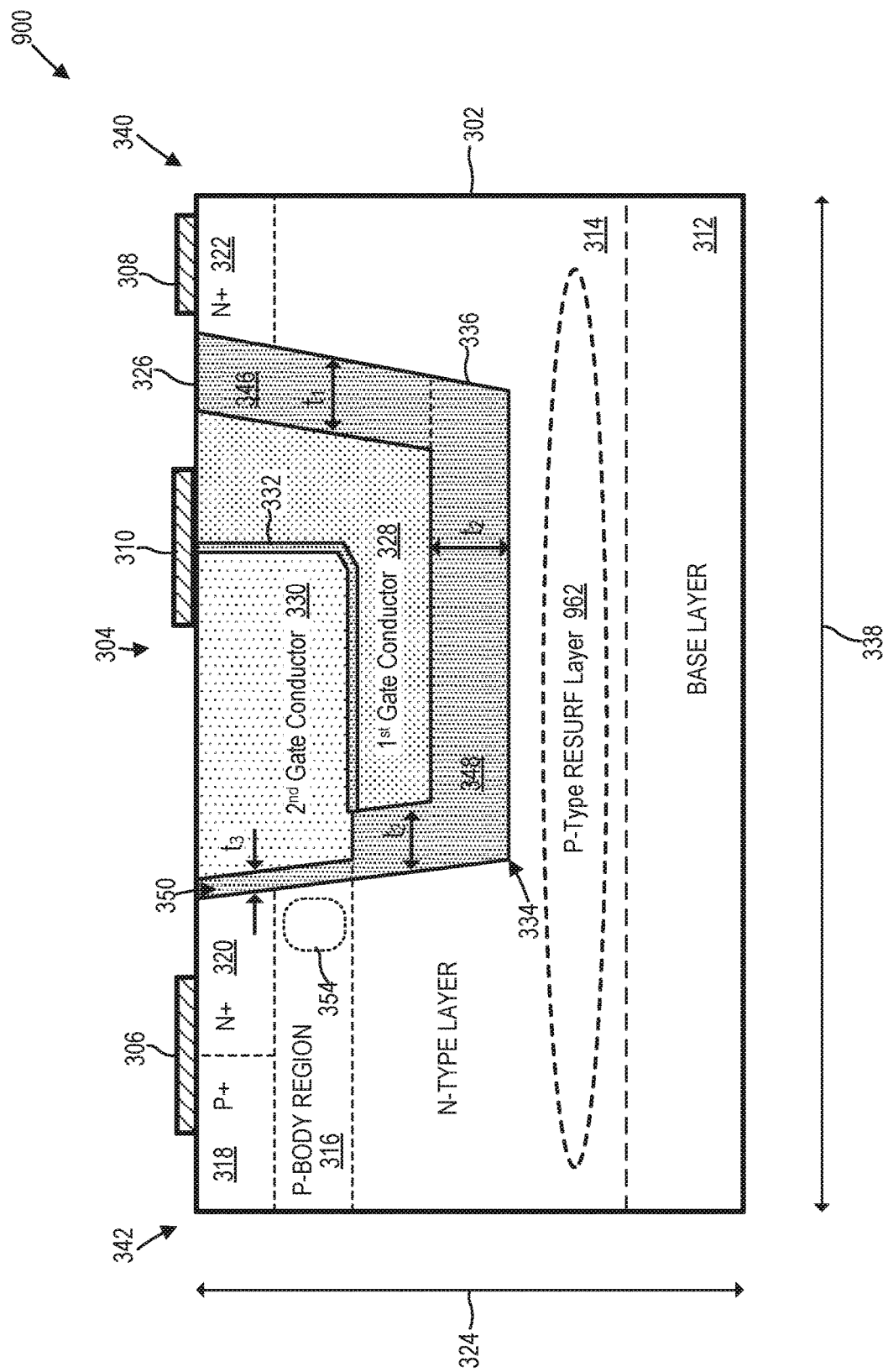
FIG. 9 is a cross-sectional view of a LDMOS transistor with two gate conductors and including a p-type reduced surface field effect layer disposed in an n-type layer, according to an embodiment.

The new LDMOS transistors disclosed herein could further include a p-type RESURF layer below the vertical gate in the thickness direction. For example, FIG. 8 is a cross-sectional view of a LDMOS transistor 800 which is similar to LDMOS transistor 300 of FIGS. 3 and 4 but with base layer 312 embodied by a base layer 812 including a p-type RESURF layer 862 disposed on an n-type base 864 in thickness direction 324. In LDMOS transistor 800, p-type RESURF layer 862 is adjacent to n-type layer 314, and p-type RESURF layer 862 and n-type layer 314 collectively create an additional depletion region to promote uniform electric field distribution in n-type layer 314. As another example, FIG. 9 is a cross-sectional view of a LDMOS transistor 900, which is similar to LDMOS transistor 300 of FIGS. 3 and 4 but further including a p-type RESURF layer 962 disposed in n-type layer 314 below vertical gate 304. P-type RESURF layer 962 and n-type layer 314 collectively create an additional depletion region to promote uniform electric field distribution in n-type layer 314.

Figure 10:
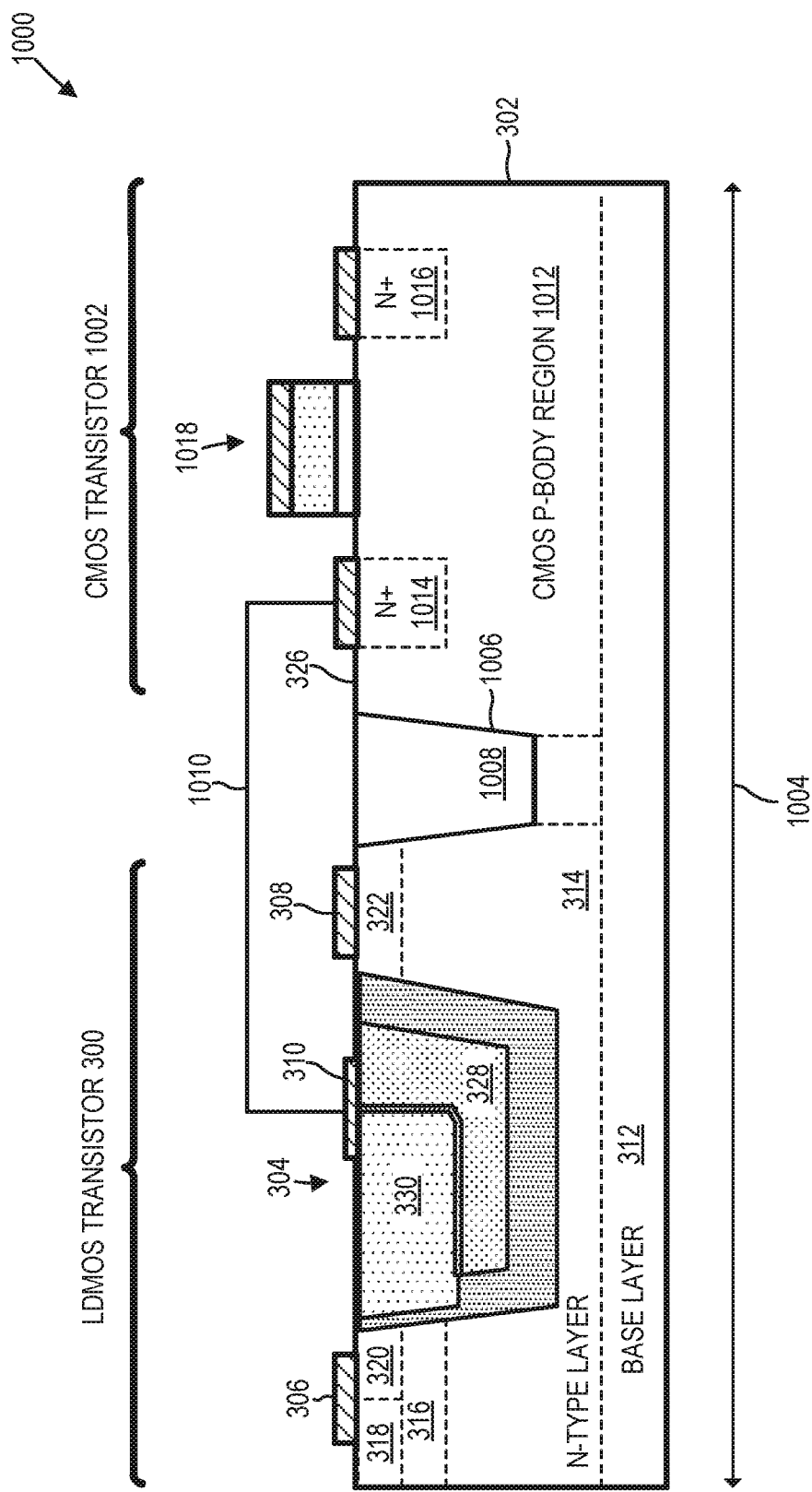
FIG. 10 is a cross-sectional view of a portion of an integrated circuit including an instance of the FIG. 3 LDMOS transistor and a complementary metal oxide semiconductor transistor, according to an embodiment.

One possible application of the LDMOS transistors disclosed herein is in an integrated circuit, such as an integrated circuit including one or more instances of the present LDMOS transistors along with one or more other type of transistors. For example, FIG. 10 is a cross-sectional view of a portion of an integrated circuit 1000 including an instance of LDMOS transistor 300 and a complementary metal oxide semiconductor (CMOS) transistor 1002 sharing silicon semiconductor structure 302 and partially separated in a lateral direction 1004 by a shallow isolation trench 1006. Shallow isolation trench 1006 is filled with a dielectric material 1008. CMOS transistor 1002 is, for example, part of driver circuit (not shown) which controls switching of LDMOS transistor 300. CMOS transistor 1002 is optionally electrically coupled to LDMOS transistor 300 via one or more electrical conductors 1010 of integrated circuit 1000, as symbolically illustrated in FIG. 10. CMOS transistor 1002 includes a CMOS p-body-region 1012, a CMOS source n+ region 1014, a CMOS drain n+ region 1016, and a CMOS gate structure 1018. CMOS p-body region 1012 is disposed in silicon semiconductor structure 302, and each of CMOS source n+ region 1014 and CMOS drain n+ region 1016 is disposed in CMOS p-body region 1012 adjacent to outer surface 326. CMOS gate structure 1018 is disposed on outer surface 326 between CMOS source n+ region 1014 and CMOS drain n+ region 1016 in lateral direction 1004.

Figure 11:
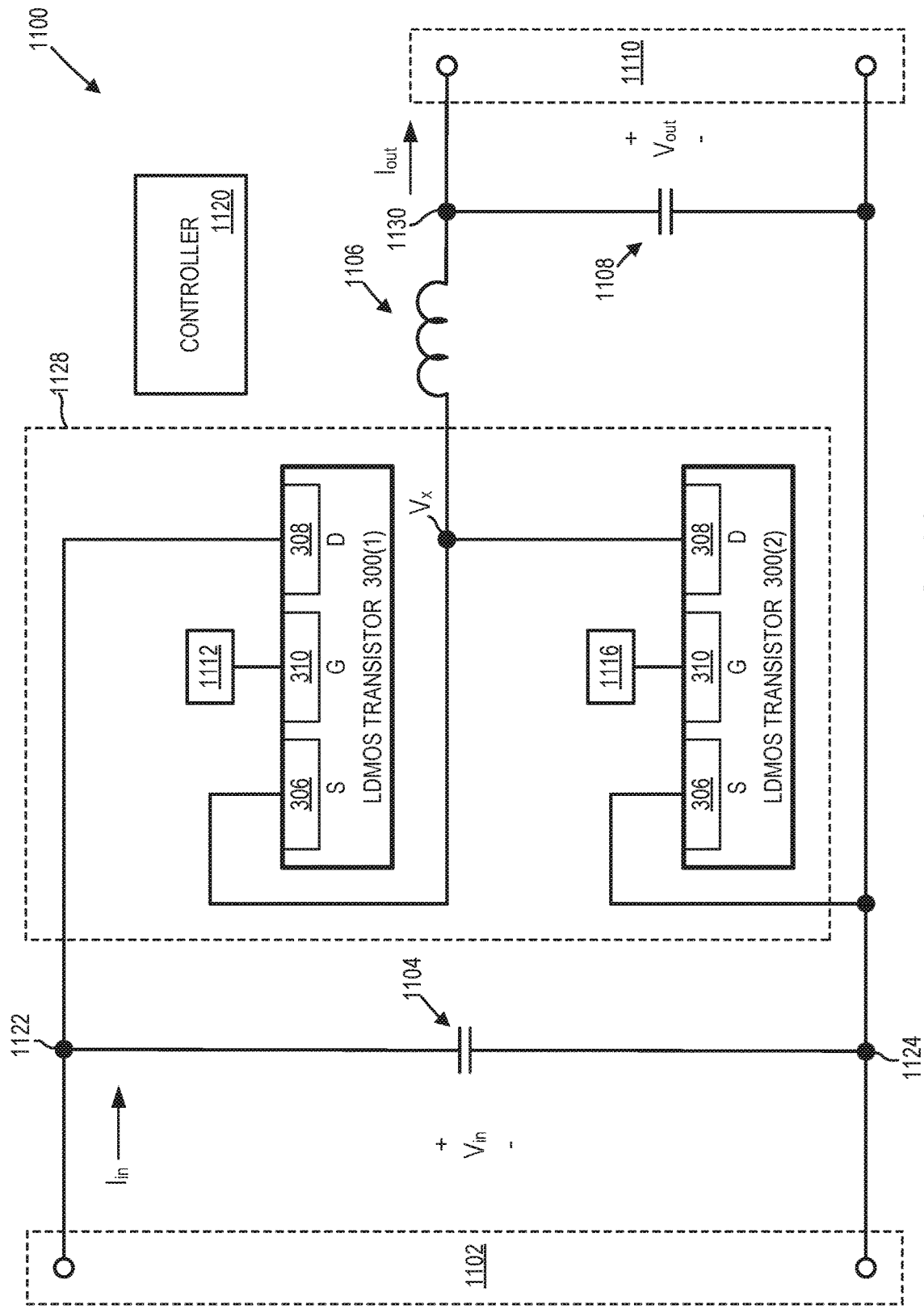
FIG. 11 schematically illustrates a buck converter including two instances of the FIG. 3 LDMOS transistor, according to an embodiment.

One possible application of the LDMOS transistors disclosed herein is in a switching power converter. For example, FIG. 11 schematically illustrates a buck converter 1100 including two instances of LDMOS transistor 300, hereinafter referred to as LDMOS transistor 300(1) and LDMOS transistor 300(2). LDMOS transistors 300(1) and 300(2) are schematically illustrated in FIG. 11 to promote illustrative clarity. Buck converter 1100 further includes an input port 1102 electrically coupled to an input power source (not shown), an input capacitor 1104, an inductor 1106, an output capacitor 1108, an output port 1110 electrically coupled to a load (not shown), first driver circuitry 1112, second driver circuitry 1116, and a controller 1120.

Input port 1102 is electrically coupled across a positive input node 1122 and a reference node 1124. Input capacitor 1104 is electrically coupled across positive input node 1122 and reference node 1124, and input capacitor 1104 provides a path for input ripple current drawn by buck converter 1100. Drain electrode 308 of LDMOS transistor 300(1) is electrically coupled to positive input node 1122, and source electrode 306 of LDMOS transistor 300(1) is electrically coupled to a switching node $V_x$. Gate electrode 310 of LDMOS transistor 300(1) is electrically coupled to first driver circuitry 1112. Drain electrode 308 of LDMOS transistor 300(2) is electrically coupled to switching node $V_x$, and source electrode 306 of LDMOS transistor 300(2) is electrically coupled to reference node 1124. Gate electrode 310 of LDMOS transistor 300(2) is electrically coupled to second driver circuitry 1116. LDMOS transistors 300(1) and 300(2), first driver circuitry 1112, and second driver circuitry 1116 collectively form a switching circuit 1128. Inductor 1106 is electrically coupled between switching node $V_x$ and a positive output node 1130, and output port 1110 is electrically coupled across positive output node 1130 and reference node 1124. Output capacitor 1108 is electrically coupled across positive output node 1130 and reference node 1124, and output capacitor 1108 provides a path for output ripple current generated by buck converter 1100.

Controller 1120 controls switching of switching circuit 1128 to transfer power from the power source (electrically coupled to input port 1102) to the load (electrically coupled to output port 1110). In particular, controller 1120 controls first driver circuitry 1112 to repeatedly switch gate electrode 310 of LDMOS transistor 300(1) between two different voltage magnitudes, to repeatedly create and destroy a minority-carrier channel in p-body region 316 of LDMOS transistor 300(1). Consequentially, LDMOS transistor 300(1) repeatedly switches between its conductive and non-conductive states under the control of controller 1120. Controller 1120 also controls second driver circuitry 1116 to repeatedly switch gate electrode 310 of LDMOS transistor 300(2) between two different voltage magnitudes to cause LDMOS transistor 300(2) to repeatedly switch between its conductive and non-conductive states. Controller 1120 controls switching of LDMOS transistor 300(2) such that it provides a freewheeling function, or in other words, so that LDMOS transistor 300(2) provides a path for current flowing through inductor 1106 when LDMOS transistor 300(1) is in its non-conductive state. In some embodiments, controller 1120 controls switching of switching circuit 1128 to regulate one or more parameters of buck converter 1100, such as input voltage $V_{in}$, input current $I_{in}$, input power $P_{in}$, output voltage $V_{out}$, output current $I_{out}$, and output power $P_{out}$. Connections between controller 1120 and other components of buck converter 1100 are not shown to promote illustrative clarity.

One or more of LDMOS transistors 300(1) and 300(2) could be replaced with an instance of LDMOS transistor 500, LDMOS transistor 600, LDMOS transistor 800, or LDMOS transistor 900. Additionally, it should be appreciated that the LDMOS transistors disclosed herein are not limited to use in a buck converter, or even to use in a switching power converter. For example, the LDMOS transistors disclosed herein could alternately be used in an amplifier.

Discussed below are several methods for manufacturing vertical gates of LDMOS transistors, where the vertical gates include a plurality of gate conductors. The methods may be used, for example, to form the vertical gates of LDMOS transistors 300, 500, 600, 800, and 900. It should be appreciated, however, that the vertical gates of LDMOS transistors 300, 500, 600, 800, and 900 could be manufactured by methods other than those discussed below. Additionally, the manufacturing methods discussed below could be used to manufacture vertical gates of LDMOS transistors other than LDMOS transistors 300, 500, 600, 800, and 900.

Figure 12:
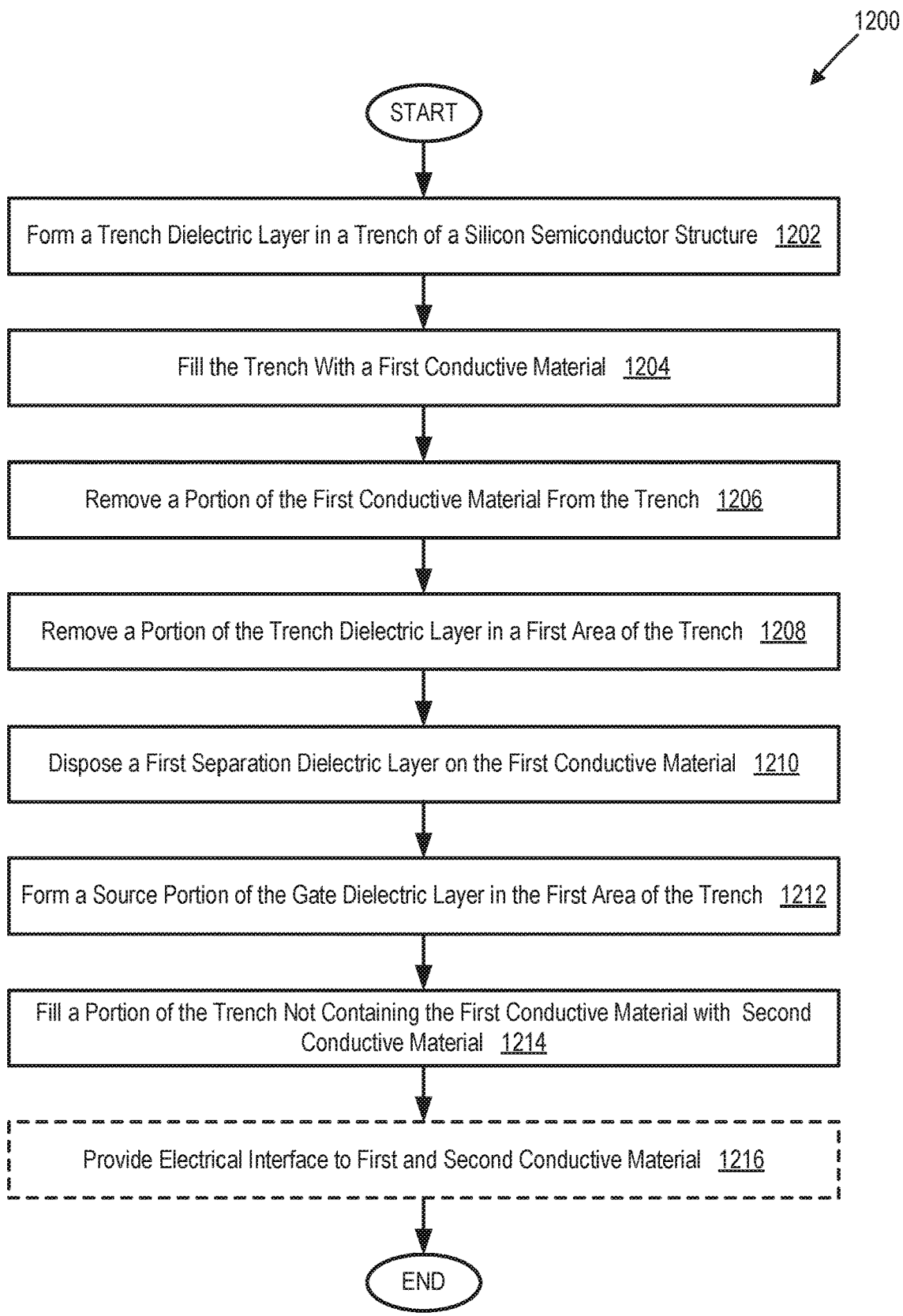
FIG. 12 illustrates a method for forming a vertical gate of a LDMOS transistor including two gate conductors, according to an embodiment.
Figure 13A:
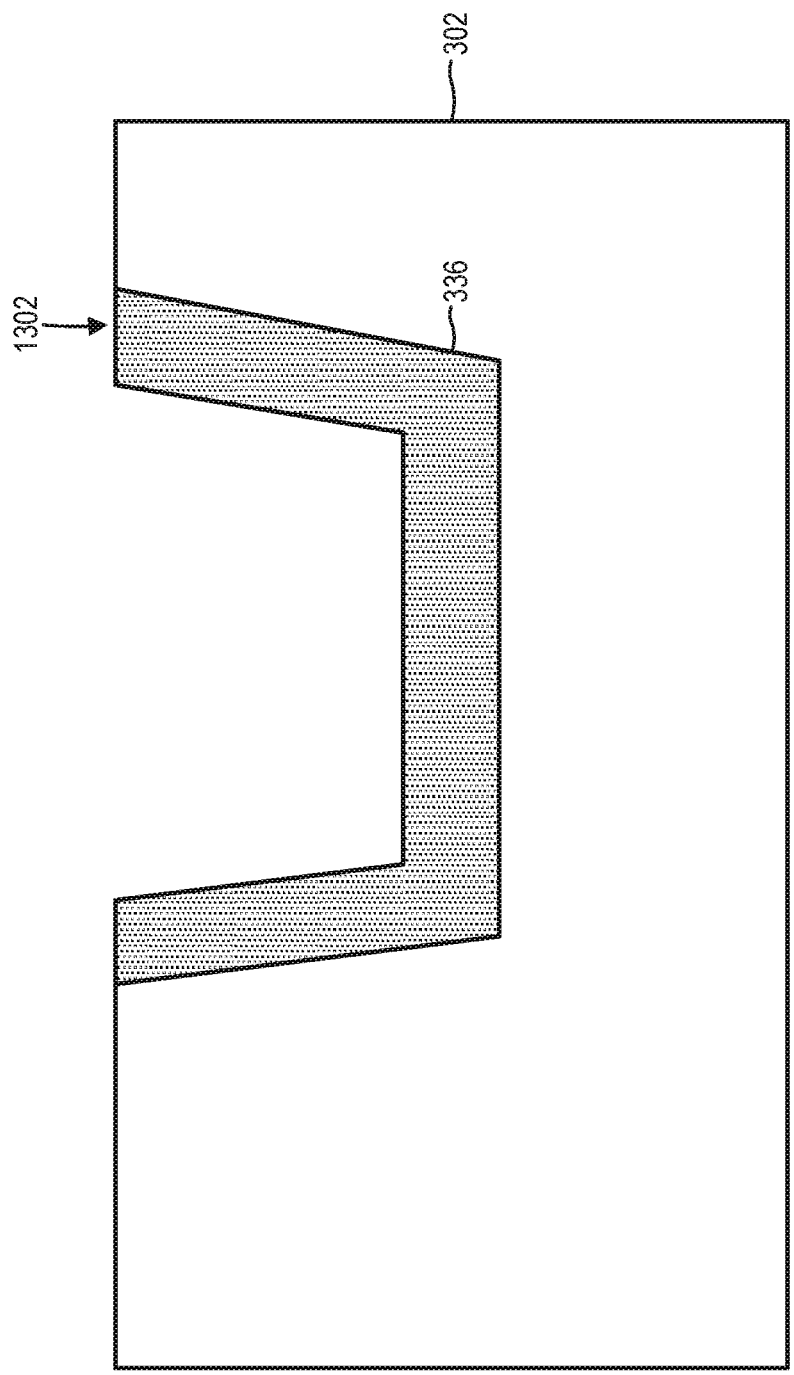
Figure 13B:
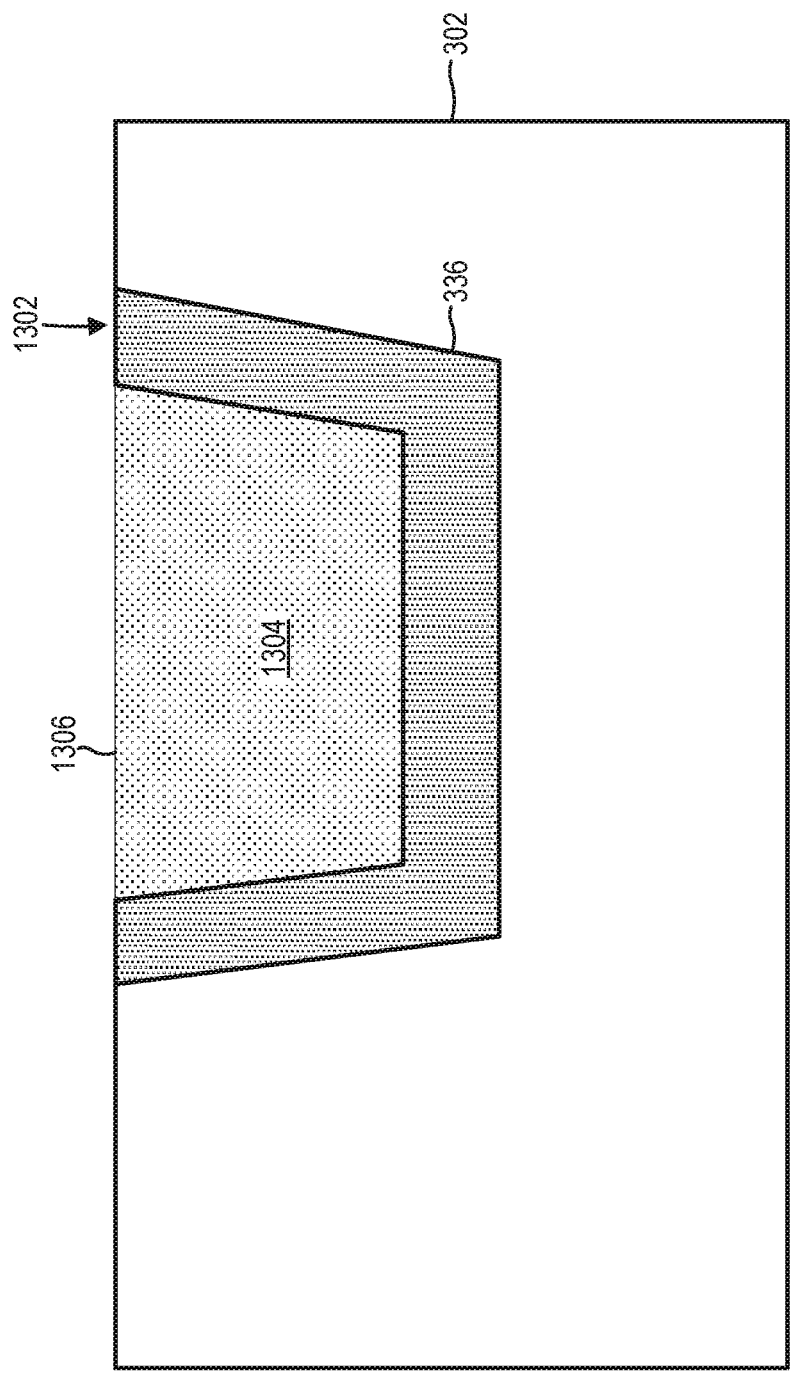
Figure 13C:
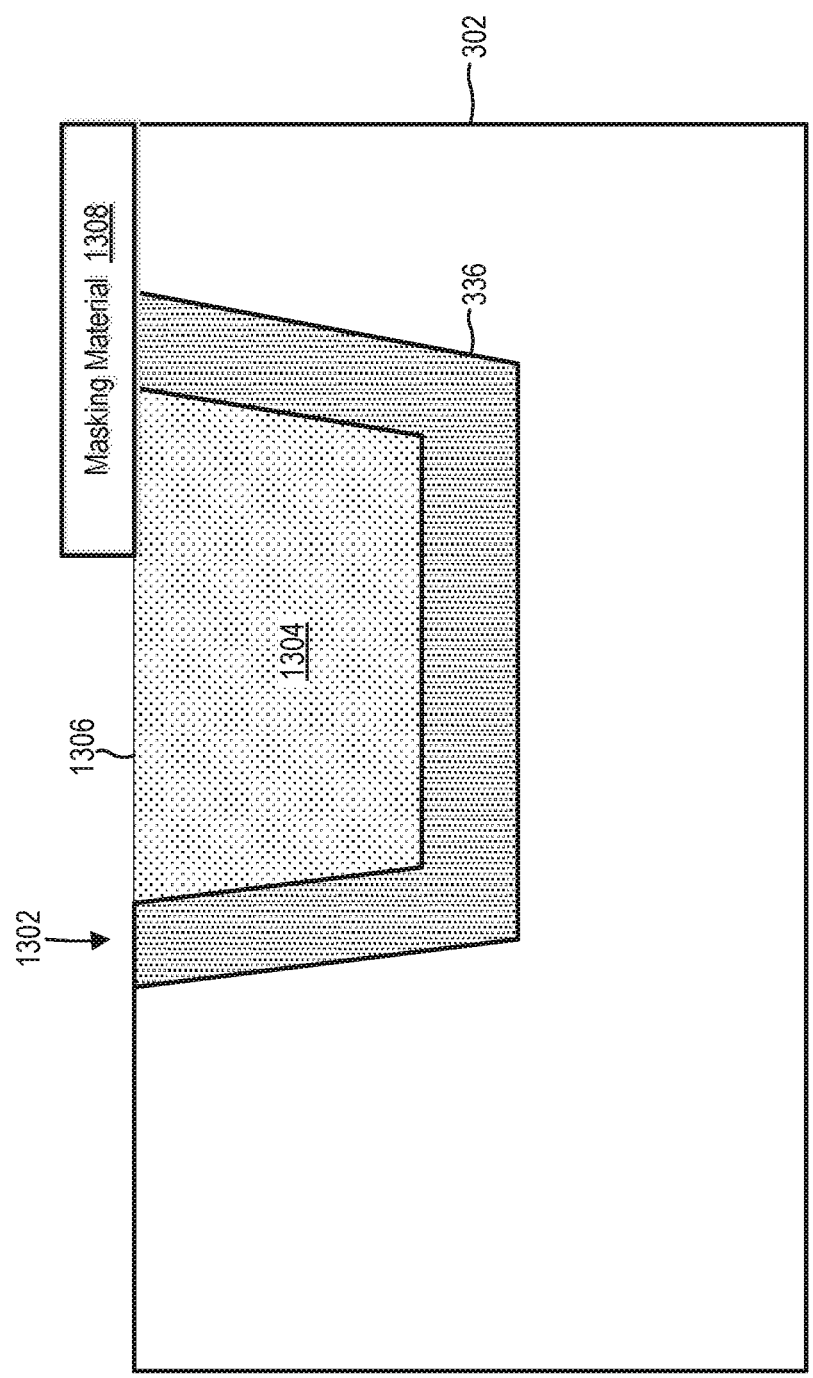
Figure 13E:
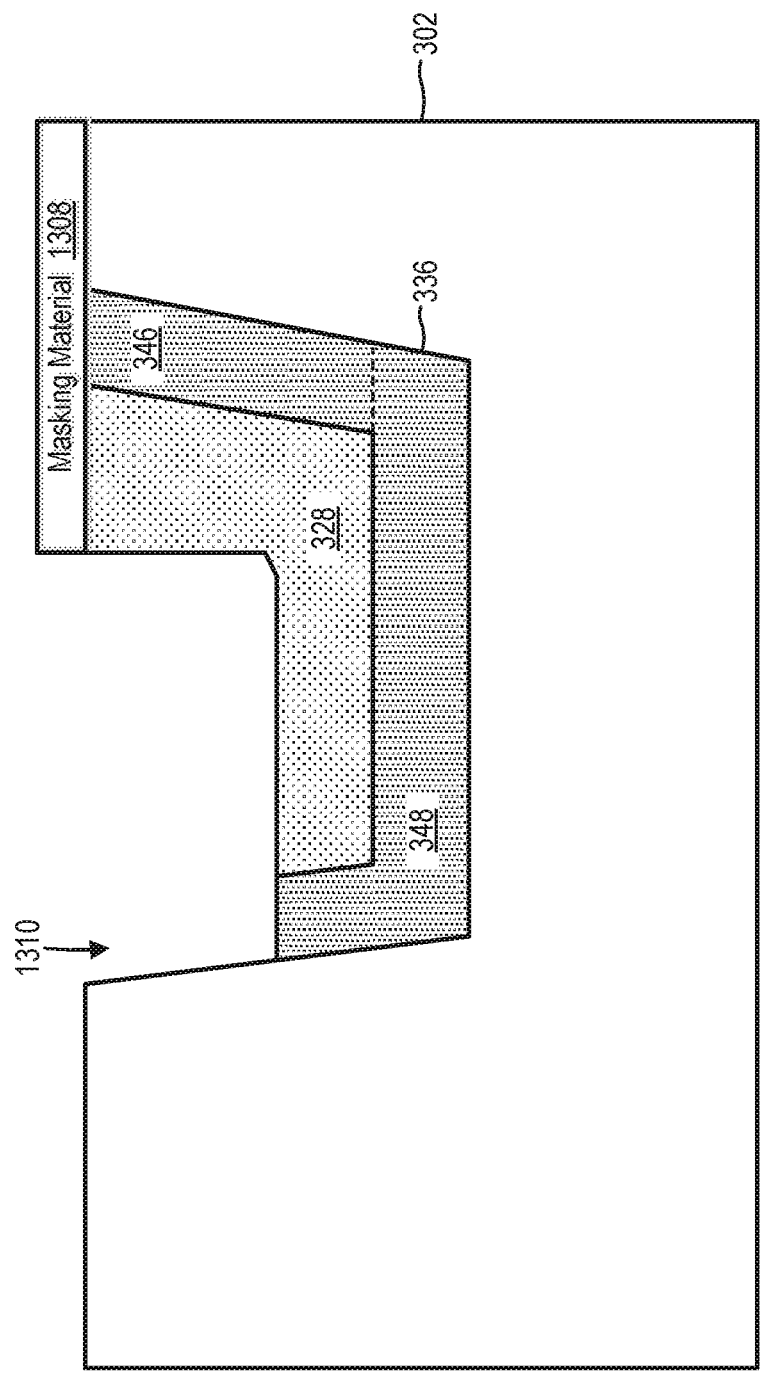
Figure 13F:
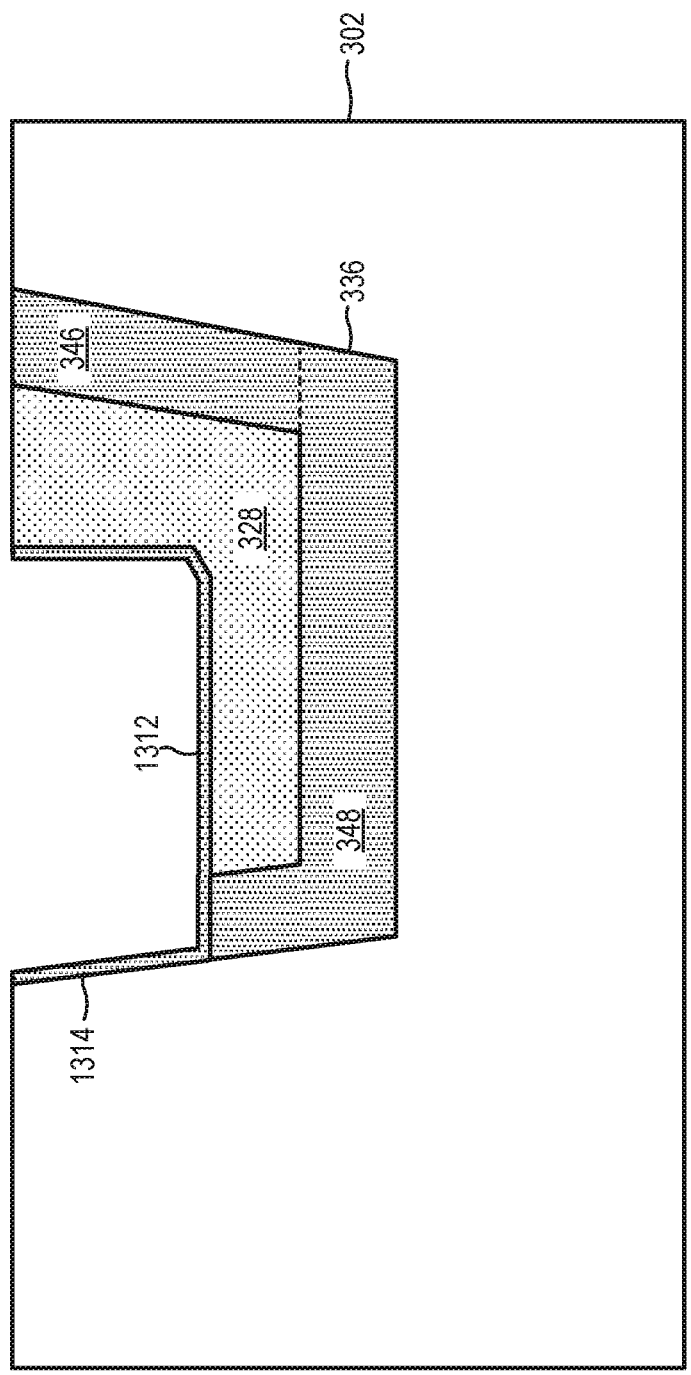
Figure 13G:
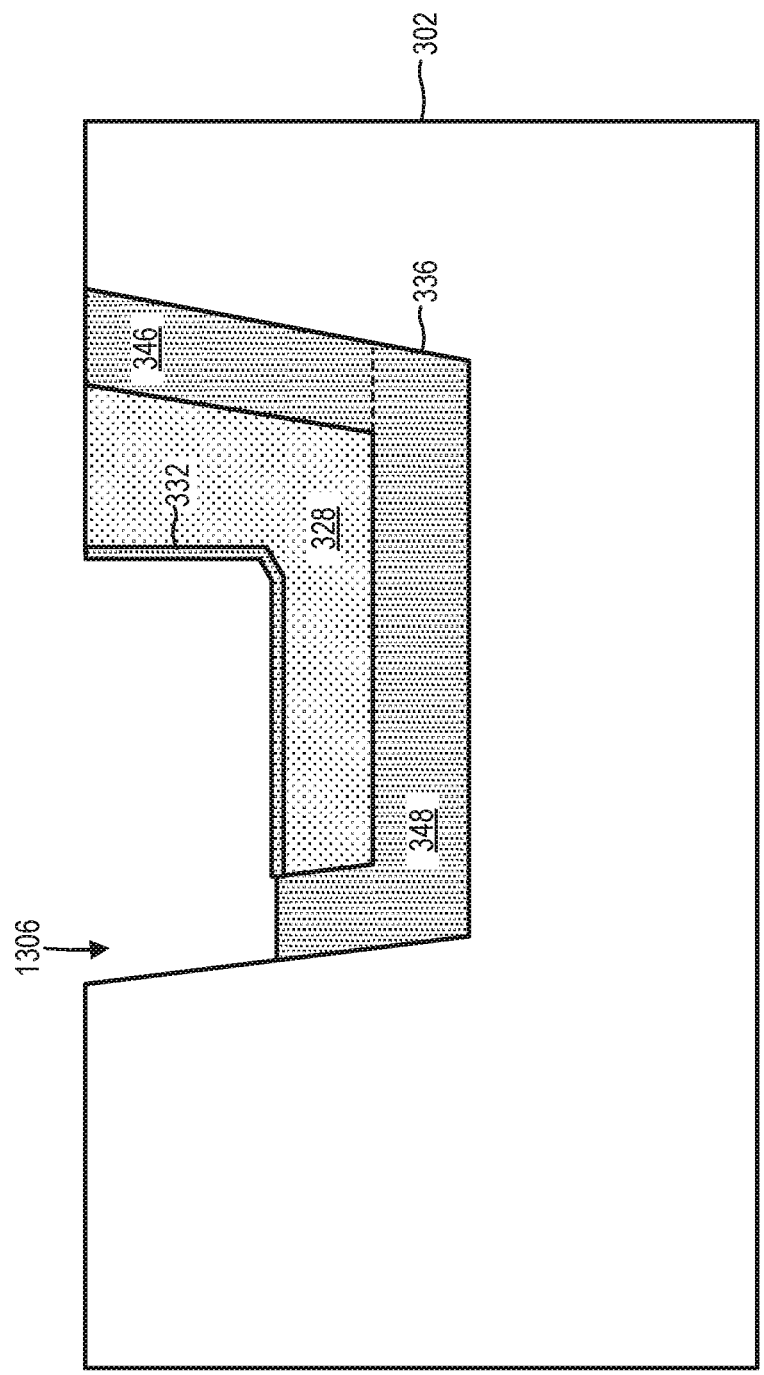
Figure 13H:
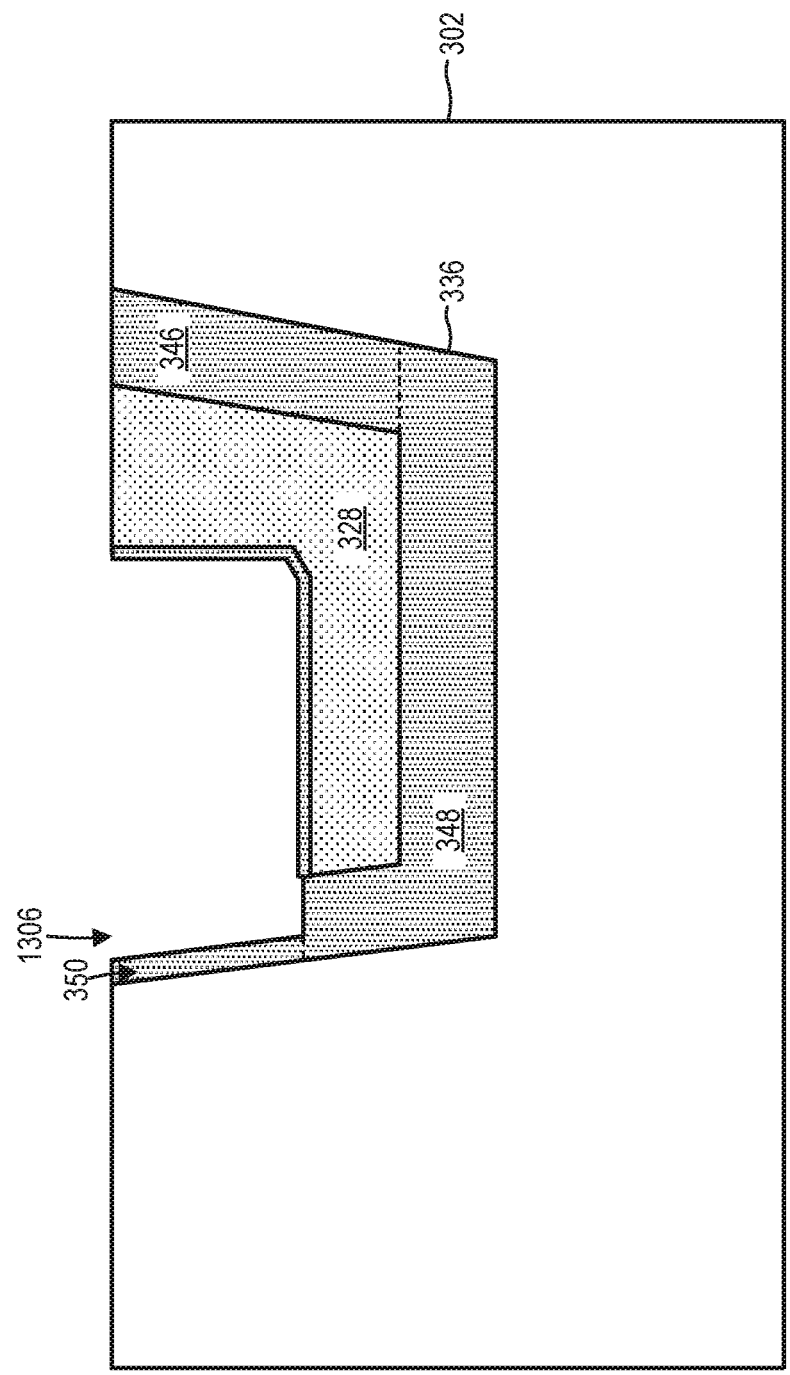
Figure 13I:
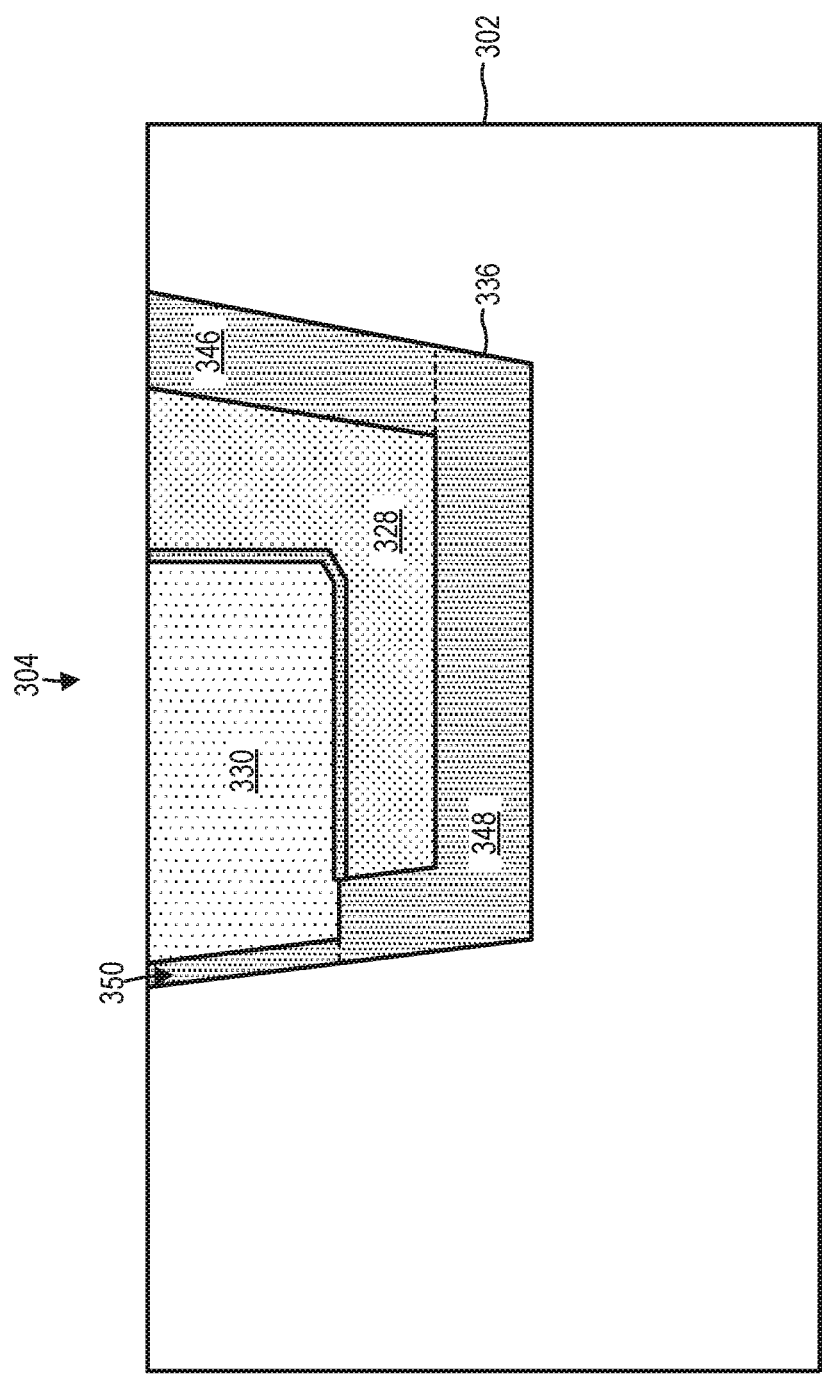
Figure 13K:
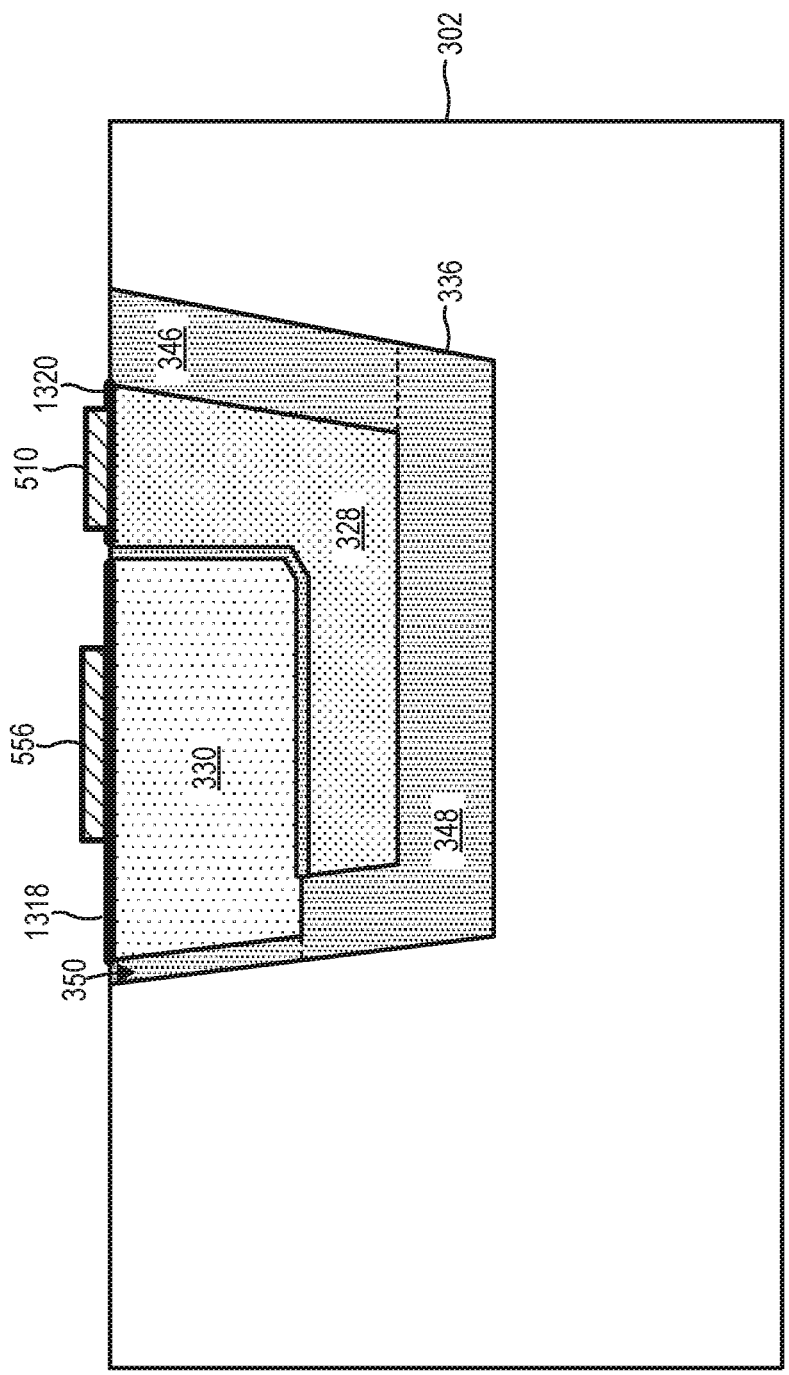

FIG. 12 illustrates a method 1200 for forming a vertical gate of a LDMOS transistor including two gate conductors, and FIG. 13A-13K illustrates in cross-sectional views one example of using method 1200 to form a vertical gate similar to vertical gate 304 of LDMOS transistor 300. FIGS. 12 and 13 are best viewed together. In step 1202, a trench dielectric layer is formed in a trench of a silicon semiconductor structure. In one example of step 1202 illustrated in FIG. 13A, a trench dielectric layer 1302 is formed in trench 336 of silicon semiconductor structure 302. Trench dielectric layer 1302 is formed, for example, of silicon dioxide or a high-K dielectric material such as one or more of $HfO_2$, $TiO_2$, $ZrO_2$, and $HfAlO_x$. In step 1204, the trench is filled with a first conductive material. In one example of step 1204 illustrated in FIG. 13B, trench 336 is filled with a first conductive material 1304. First conductive material 1304 is, for example, polysilicon, and in one embodiment, step 1304 includes planarizing first conductive material 1304 to form a flat top surface 1306.

In step 1206, a portion of the first conductive material is removed from the trench. In one example of step 1206 illustrated in FIGS. 13C and 13D, first conductive material 1304 is patterned with a masking material 1308, e.g., with photoresist, and a portion of first conductive material 1304 not covered by masking material 1308 is removed to from first gate conductor 328. Presence of first gate conductor layer 328 after completion of step 1206 advantageously helps protect portions of trench dielectric layer 1302 covered by first gate conductor layer 328 during subsequent steps of method 1200.

Step 1208 is performed after step 1206. In step 1208, a portion of the trench dielectric layer is removed in a first area of the trench. In one example of step 1208 illustrated in FIG. 13E, a portion of trench dielectric layer 1302 is removed in an area 1310 of trench 336, using remaining masking material 1308 as a mask, to leave first dielectric section 346 and second dielectric section 348. The remaining masking material 1308 is subsequently removed. In step 1210, a first separation dielectric layer is disposed on the first conductive material in the trench. In one example of step 1210 illustrated in FIGS. 13F and 13G, dielectric material 1312 is disposed in trench 336, and extraneous dielectric material 1312 is removed from sidewall 1314 of trench 336 to form first dielectric separation layer 332. In step 1212, a source portion of a gate dielectric layer is formed in the first area of the trench. In one example of step 1212 illustrated in FIG. 13H, third dielectric section 350 is formed in area 1306 of trench 336. In step 1214, a portion of the trench not containing the first conductive material is filled with a second conductive material. In one example of step 1214 illustrated in FIG. 13I, the remaining unfilled portion of trench 336 is filled with a second conductive material to form second gate conductor 330.

Step 1216 in optional. In step 1216, electrical interface to the first and second conductive material is provided. In one example of step 1216 illustrated in FIG. 13J, a silicide layer 1316 or other conductive layer is disposed on each of first gate conductor 328 and second gate conductor 330, and first gate electrode 310 is disposed on silicide layer 1316, such that first gate electrode 310 is electrically coupled to each of first gate conductor 328 and second gate conductor 330. In another example of step 1216 illustrated in FIG. 13K, respective silicide layers 1318 and 1320 are disposed on first gate conductor 328 and second gate conductor 330, and first gate electrode 510 and second gate electrode 556 are respectively disposed on silicide layers 1318 and 1320 to obtain a vertical gate similar to that illustrated in FIG. 5.

Method 1200 is optionally performed in parallel with and/or in serial with one or more additional methods for forming other elements of an LDMOS transistor. For example, in one embodiment, method 1200 is performed with one or more additional methods to form a source region and a drain region of an LDMOS transistor.

Figure 14:
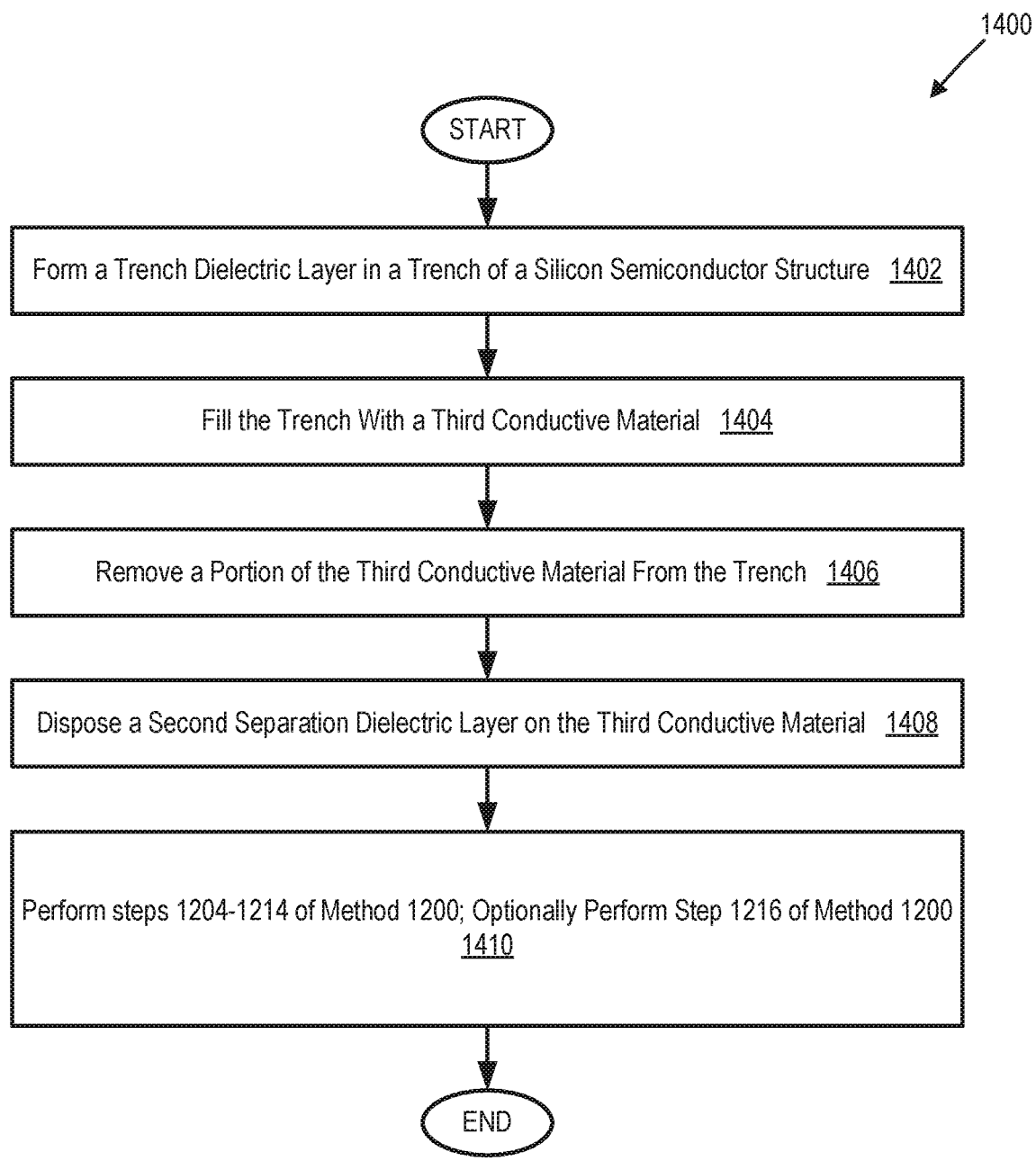
FIG. 14 illustrates a method for forming a vertical gate of a LDMOS transistor including three gate conductors, according to an embodiment.
Figure 15A:
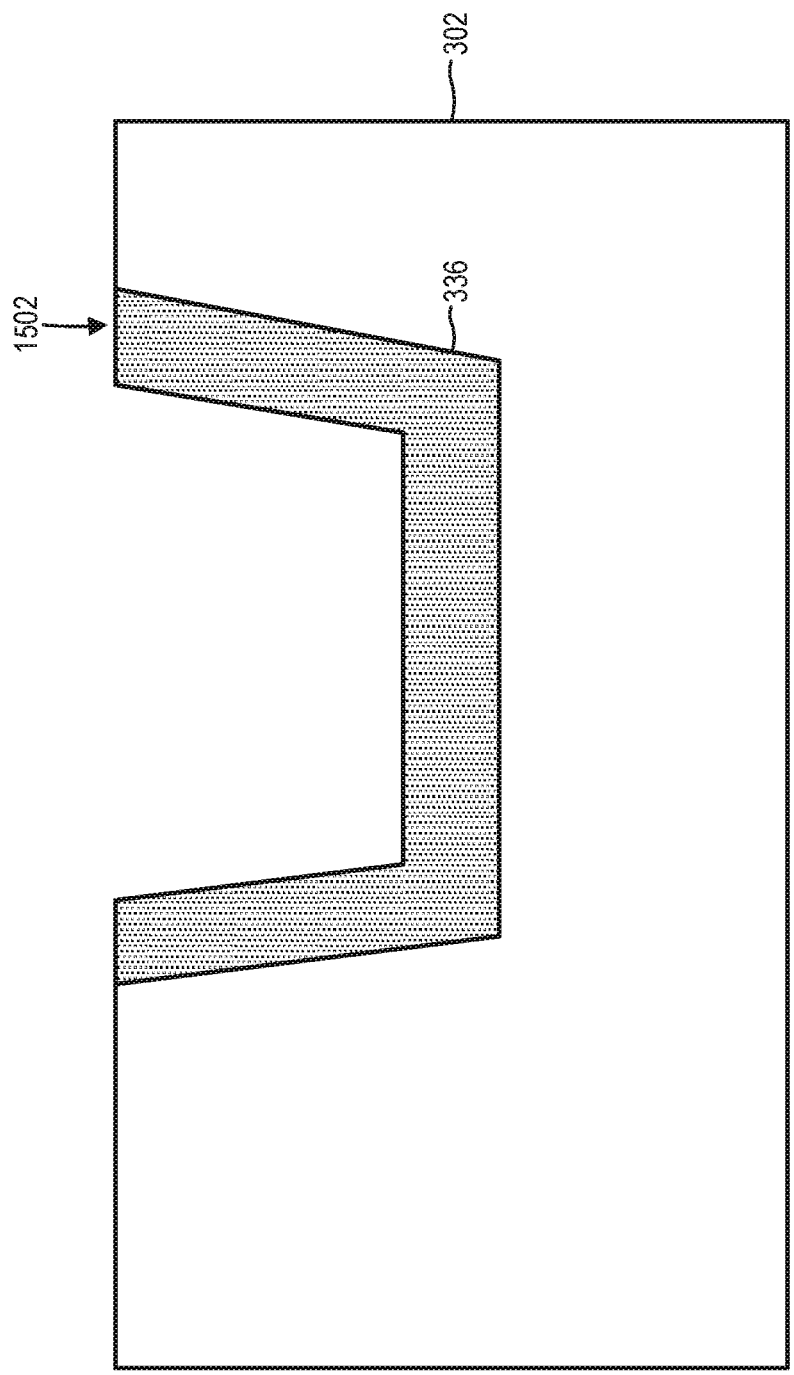
FIGS. 15A-15E illustrate one example of using the FIG. 14 method to form a vertical gate including three gate conductors, according to an embodiment.
Figure 15B:
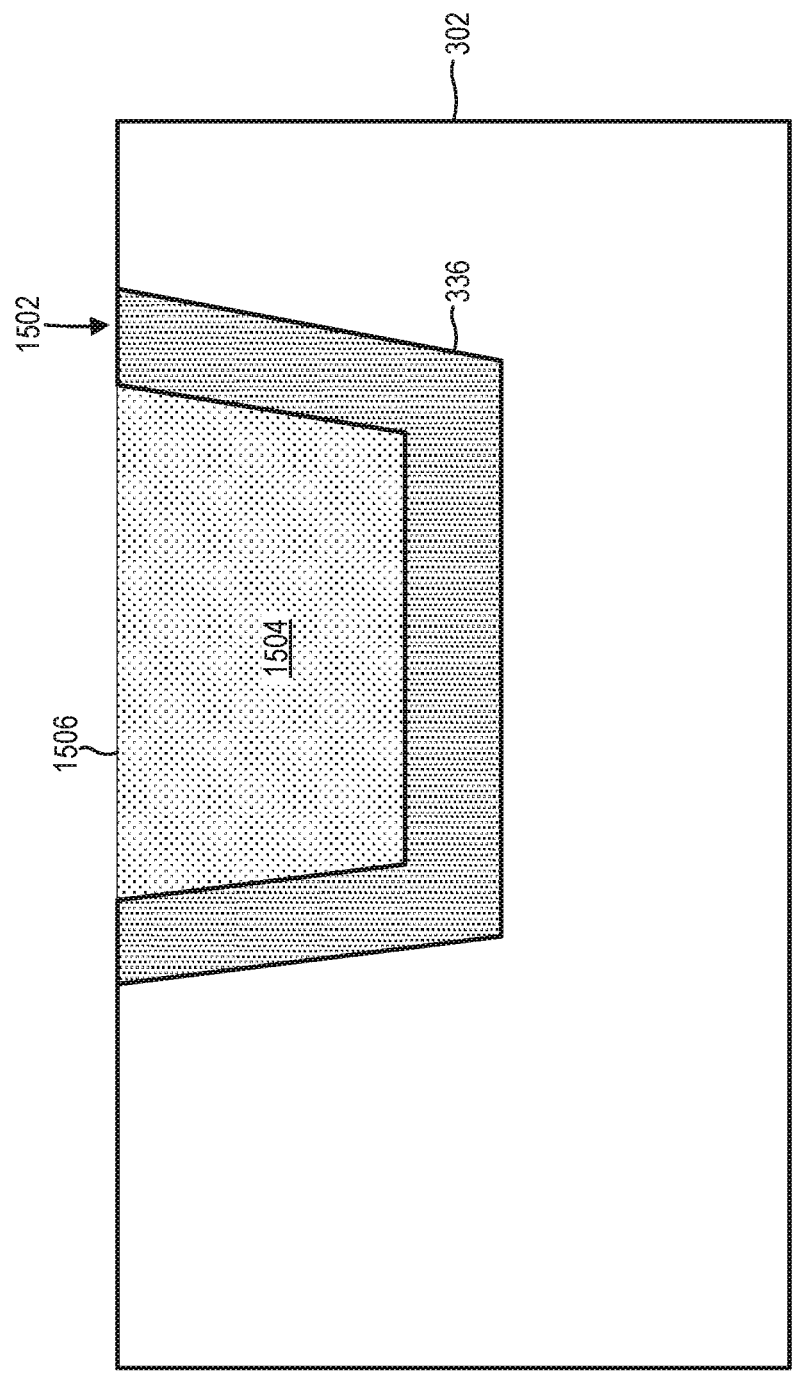
Figure 15C:
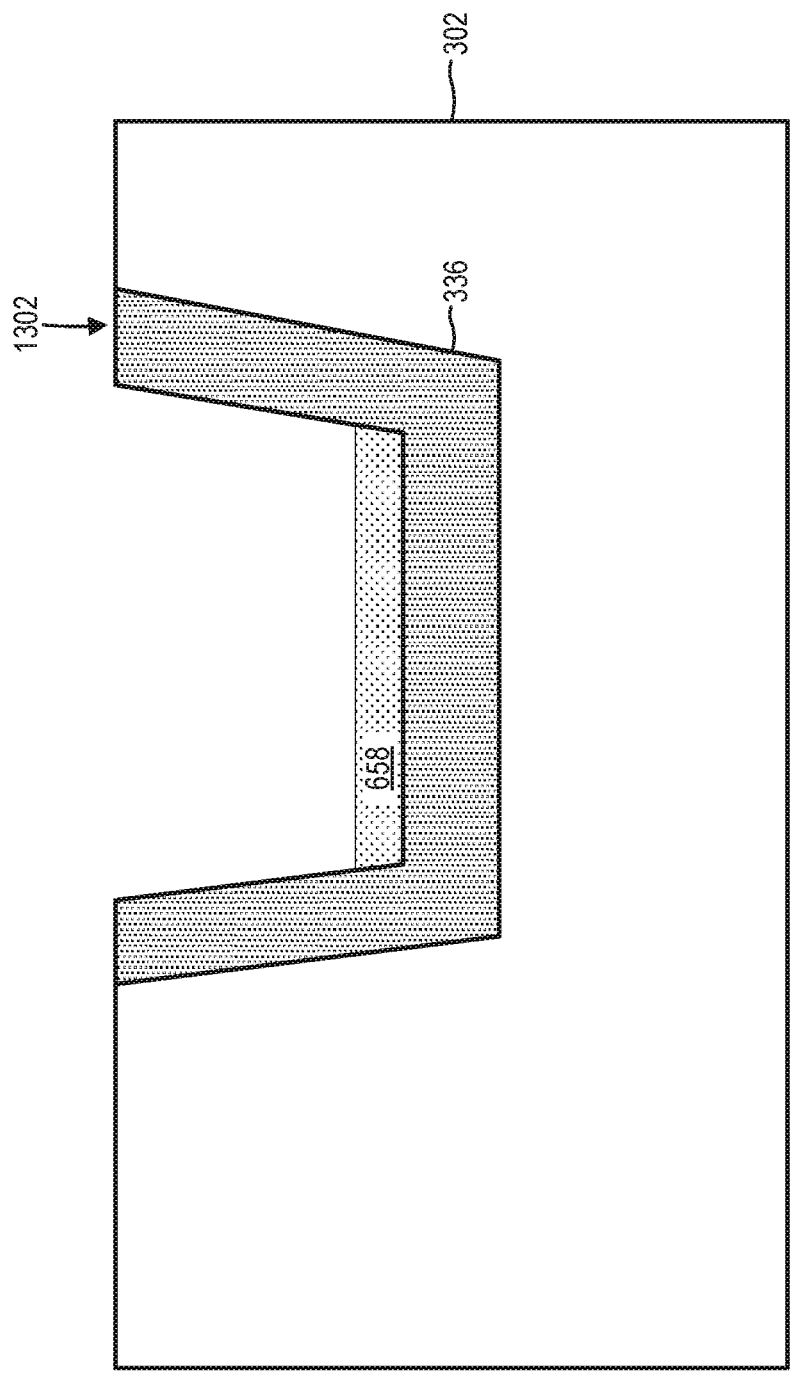
Figure 15D:
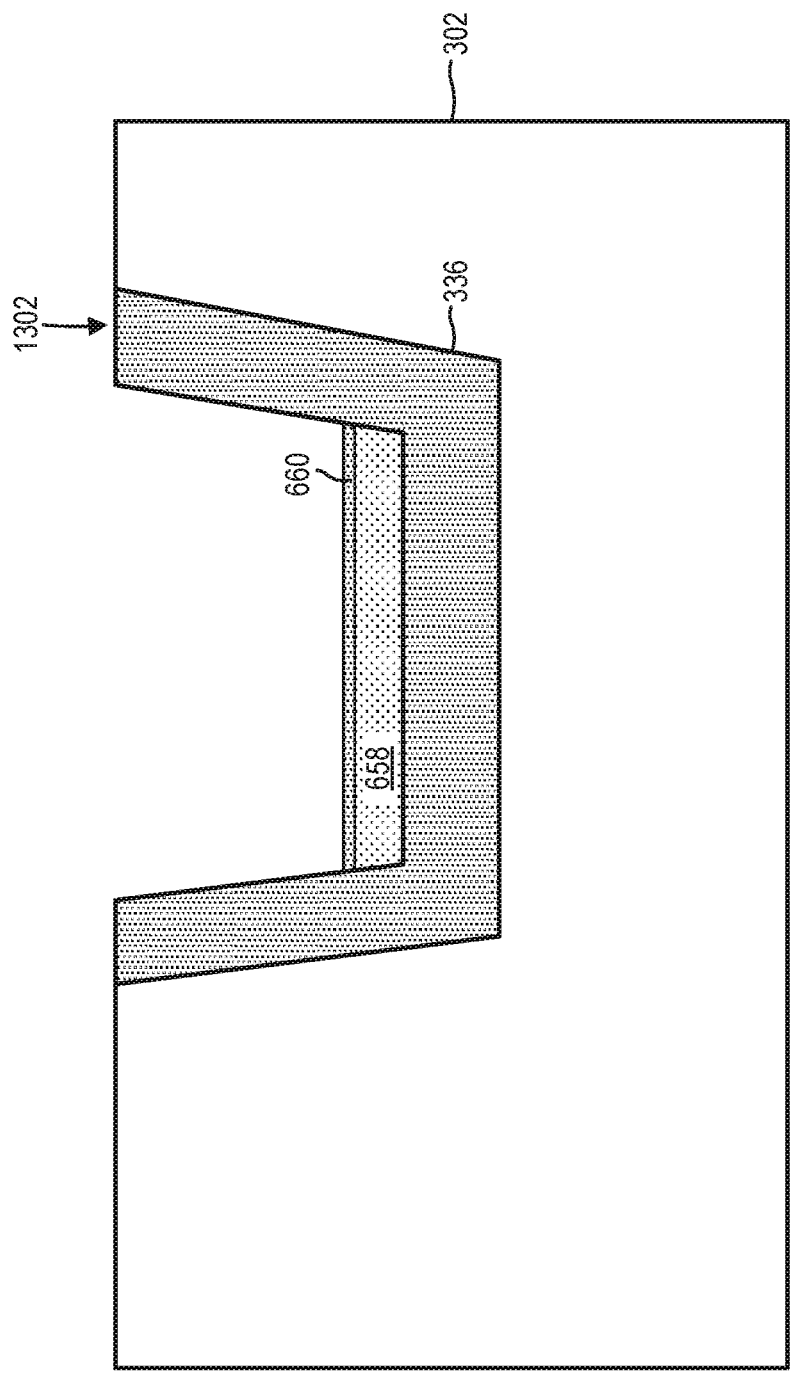
Figure 15E:
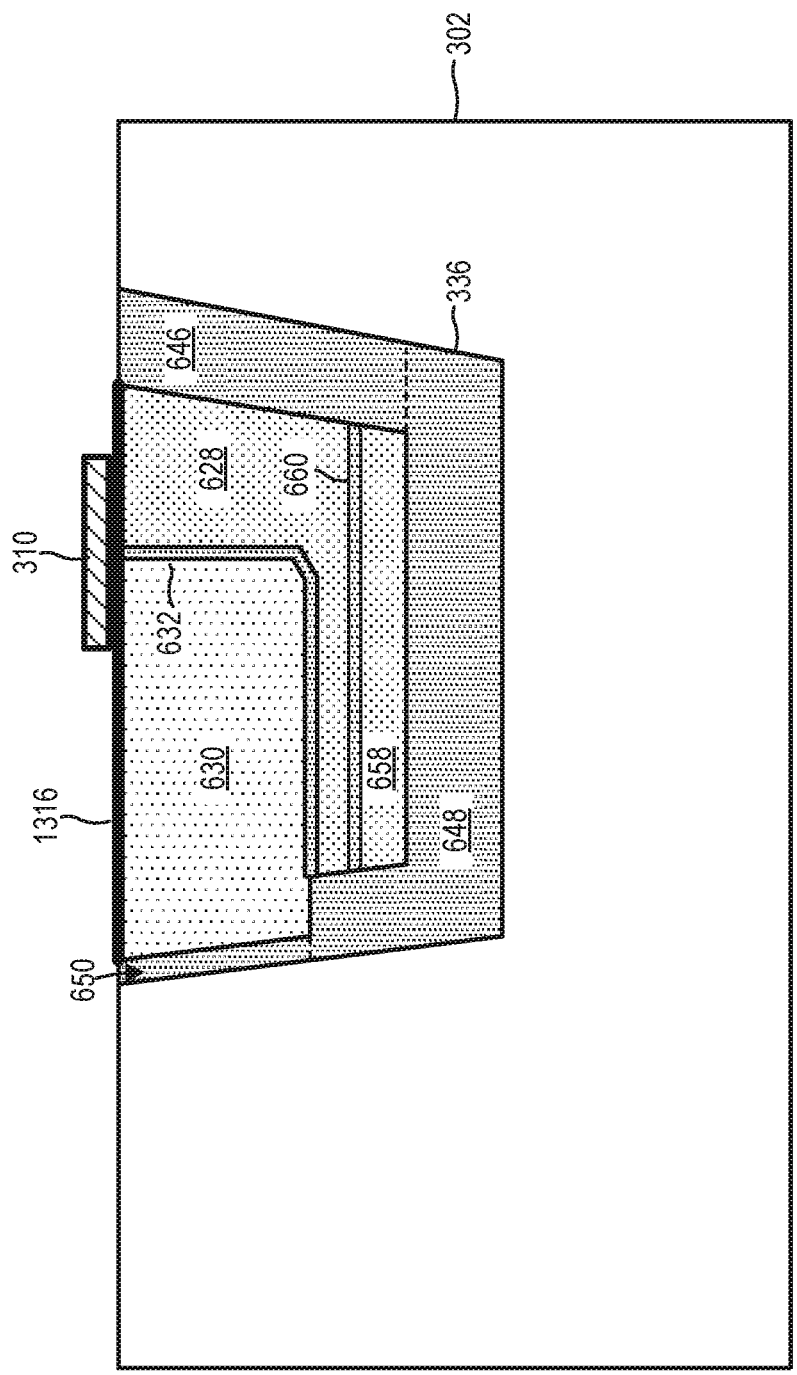

FIG. 14 illustrates a method 1400 for forming a vertical gate of a LDMOS transistor including three gate conductors, and FIG. 15A-15E illustrates in cross-sectional views one example of using method 1400 to form a vertical gate similar to vertical gate 604 of LDMOS transistor 600. FIGS. 14 and 15 are best viewed together. As discussed below, third conductive material is first disposed in a trench to form a third gate conductor, and certain steps of method 1200 (FIG. 12) are then performed to form first and second gate conductors.

In step 1402, a trench dielectric layer is formed in a trench of a silicon semiconductor structure. In one example of step 1402 illustrated in FIG. 15A, a trench dielectric layer 1502 is formed in trench 336 of silicon semiconductor structure 302. Trench dielectric layer 1502 is formed, for example, of silicon dioxide or a high-K dielectric material such as one or more of $HfO_2$, $TiO_2$, $ZrO_2$, and $HfAlO_x$. In step 1404, the trench is filled with a third conductive material. In one example of step 1404 illustrated in FIG. 15B, trench 336 is filled with a third conductive material 1504. Third conductive material 1504 is, for example, polysilicon, and in one embodiment, step 1404 includes planarizing third conductive material 1504 to form a flat top surface 1506.

In step 1406, a portion of the third conductive material is removed from the trench to form a third gate conductor. In one example of step 1406 illustrated in FIG. 15C, a portion of third conductive material 1504 is removed from trench 336 to form third gate conductor 658. In step 1408, a second separation dielectric layer is disposed on the third conductive material. In one example of step 1408 illustrated in FIG. 15D, second separation dielectric layer 660 is disposed on third gate conductor 658. In step 1410, steps 1204-1214 of method 1200 are performed to form first and second gate conductors, and step 1216 of method 1200 is optionally also performed. In one example of step 1410 illustrated in FIG. 15E, steps 1204-1216 of method 1200 are performed to form a vertical gate similar to vertical gate 604 of FIG. 6.

Figure 16:
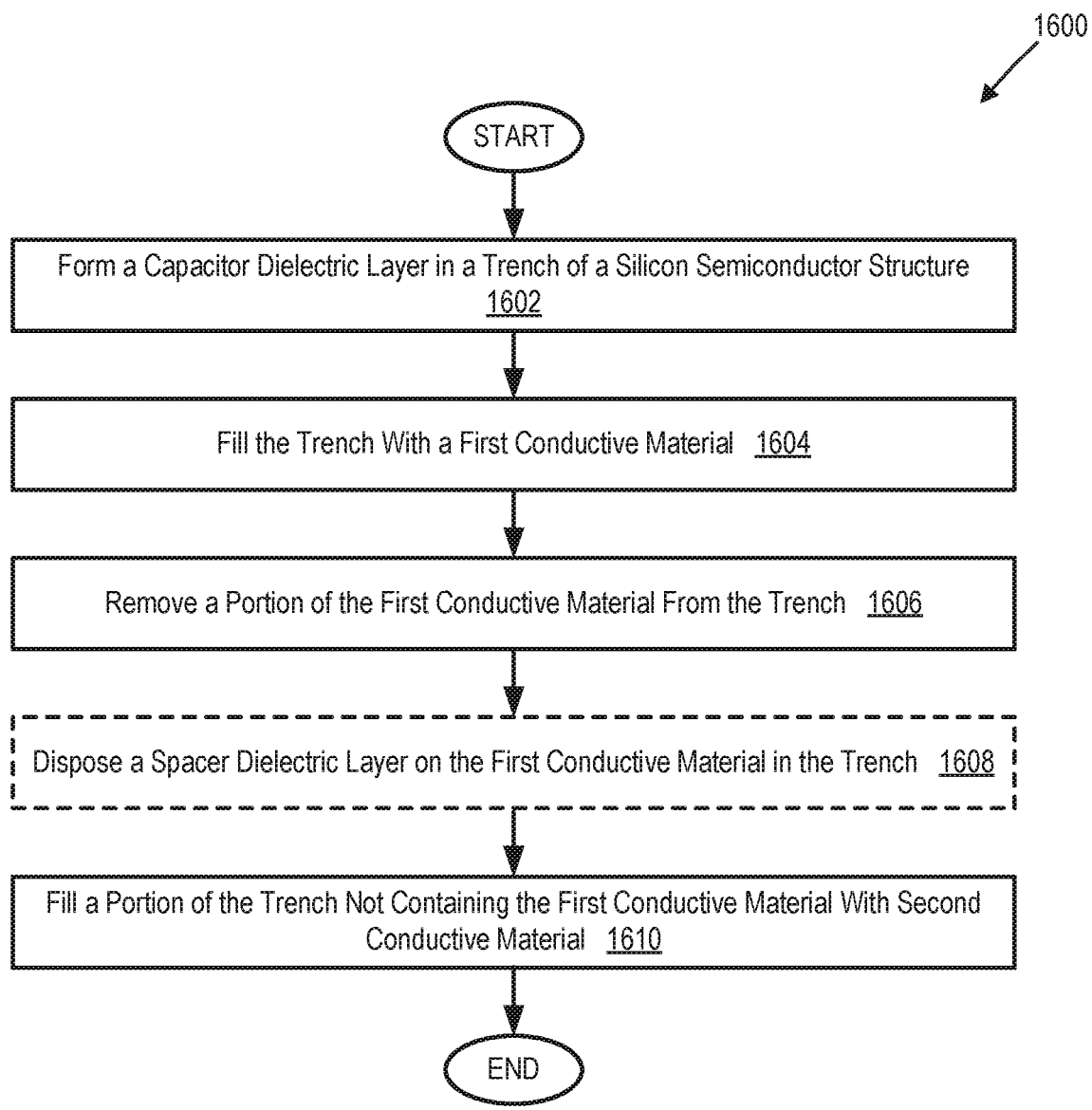
FIG. 16 illustrates a method for forming a trench capacitor, according to an embodiment.
Figure 17A:
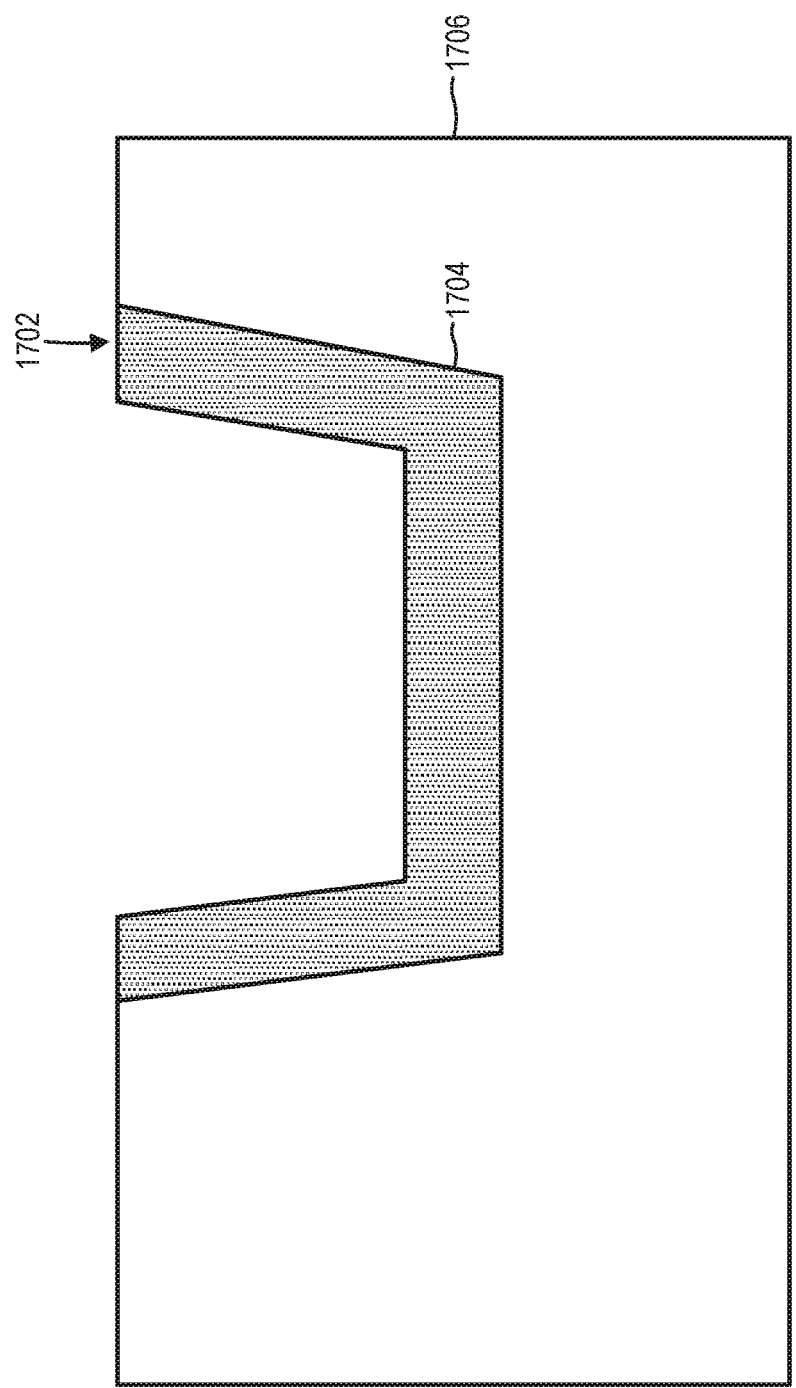
FIGS. 17A-17E illustrates one example of using the FIG. 16 method to form a trench capacitor, according to an embodiment.
Figure 17B:
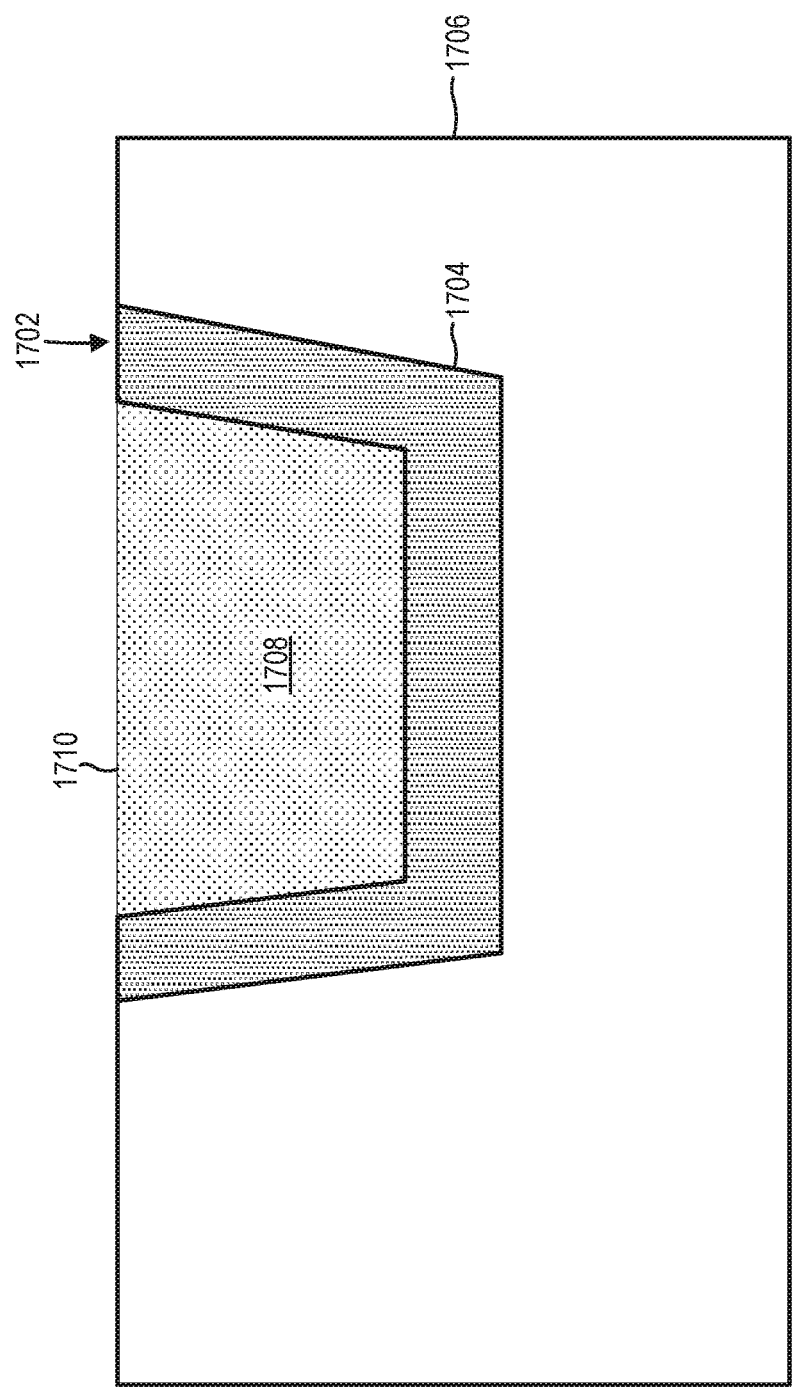
Figure 17C:
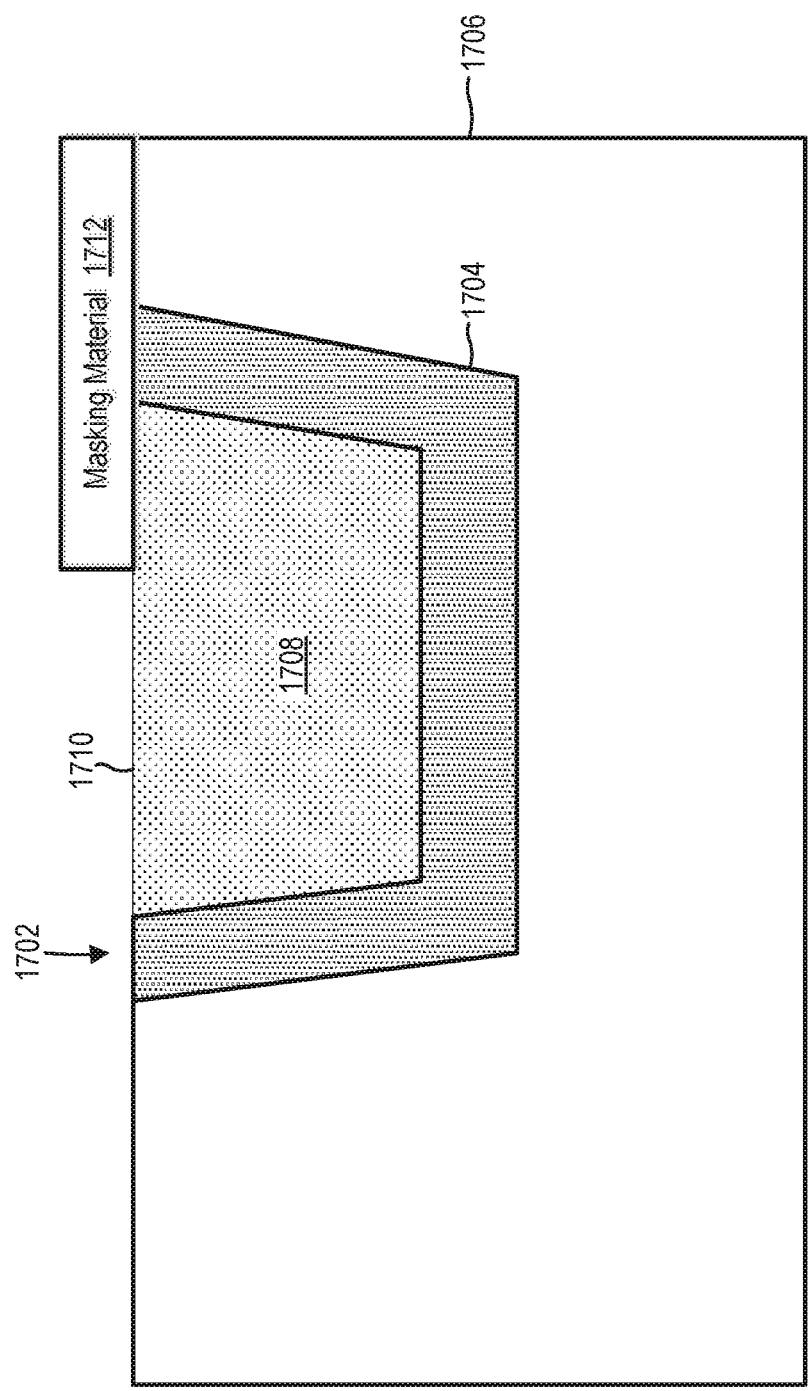
Figure 17D:
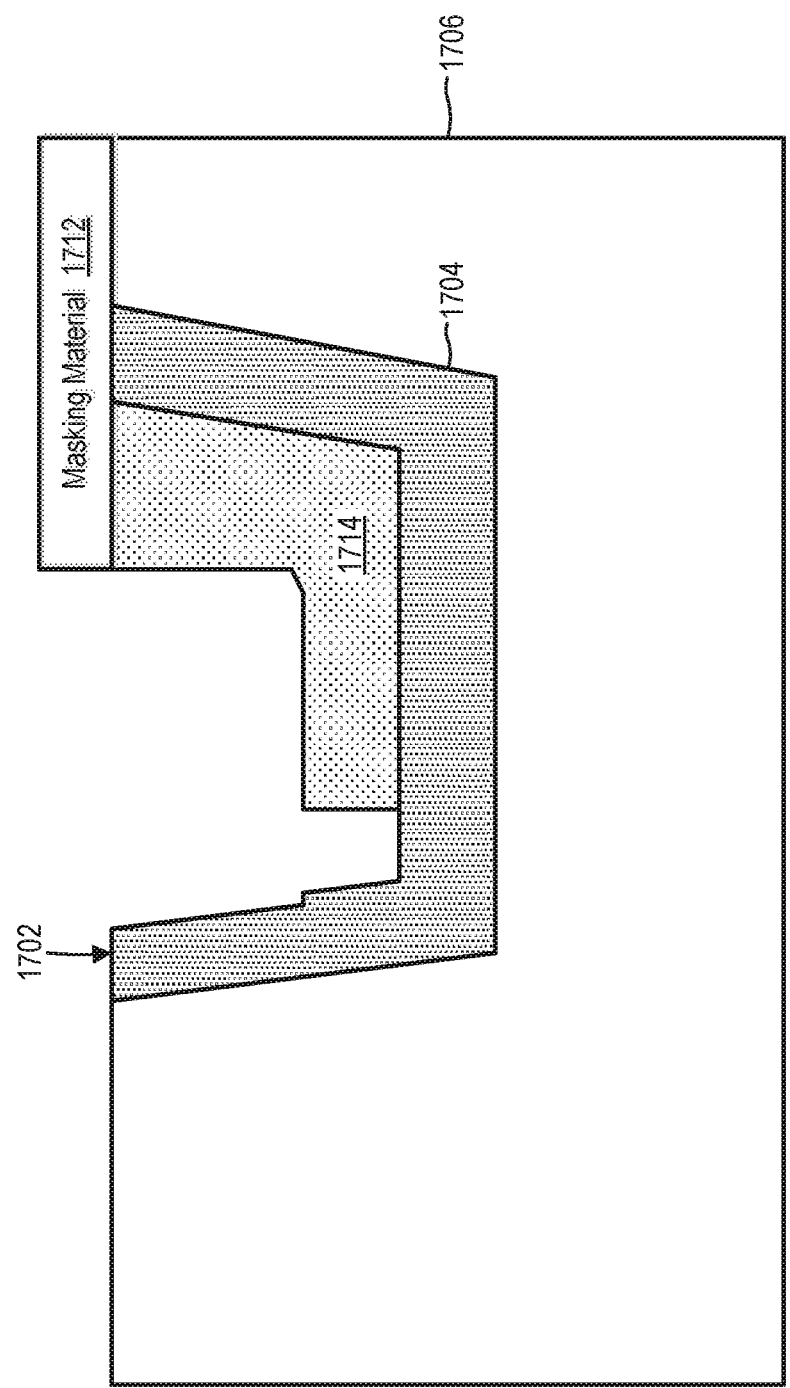
Figure 17E:
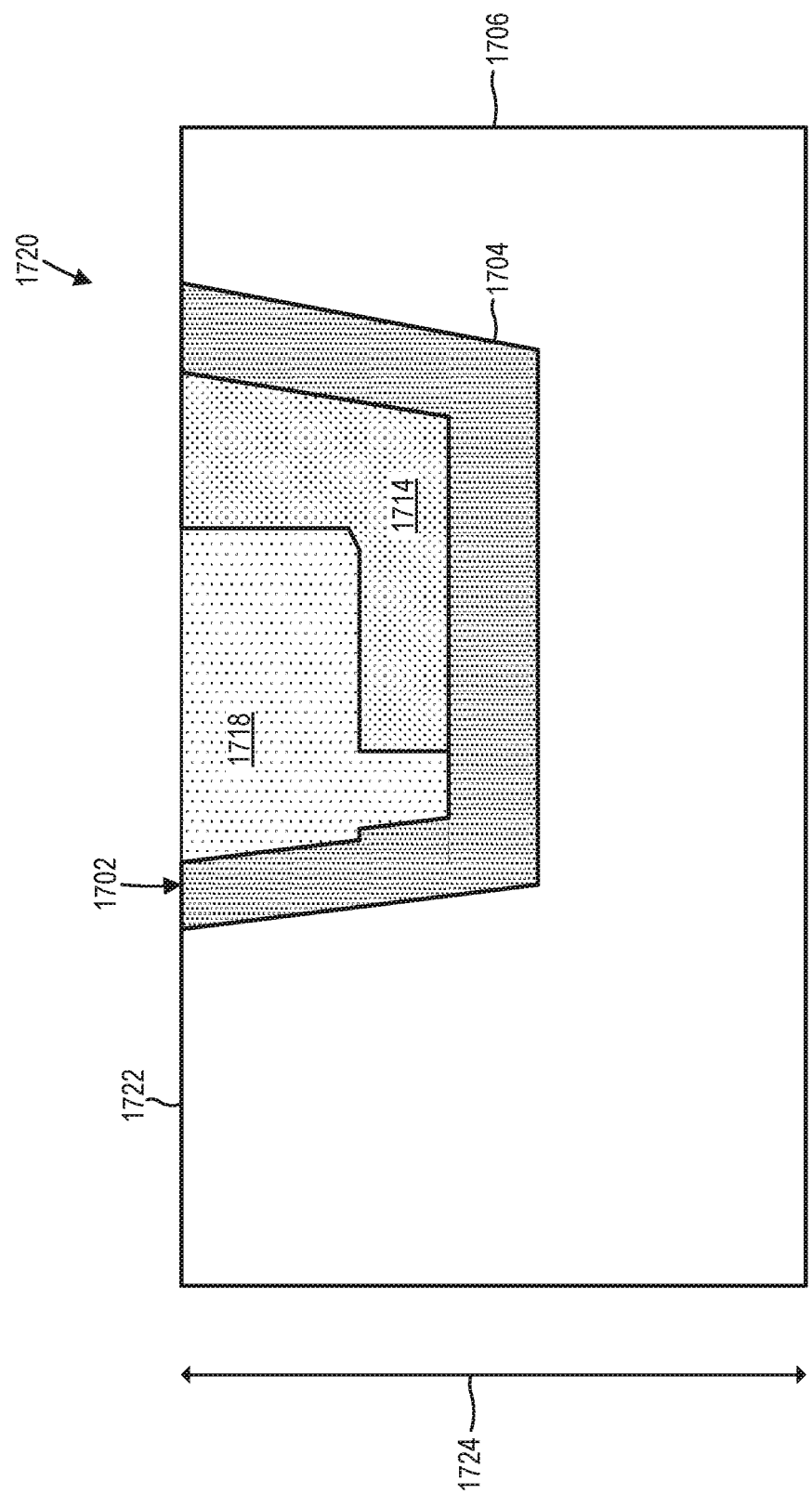
Figure 18A:
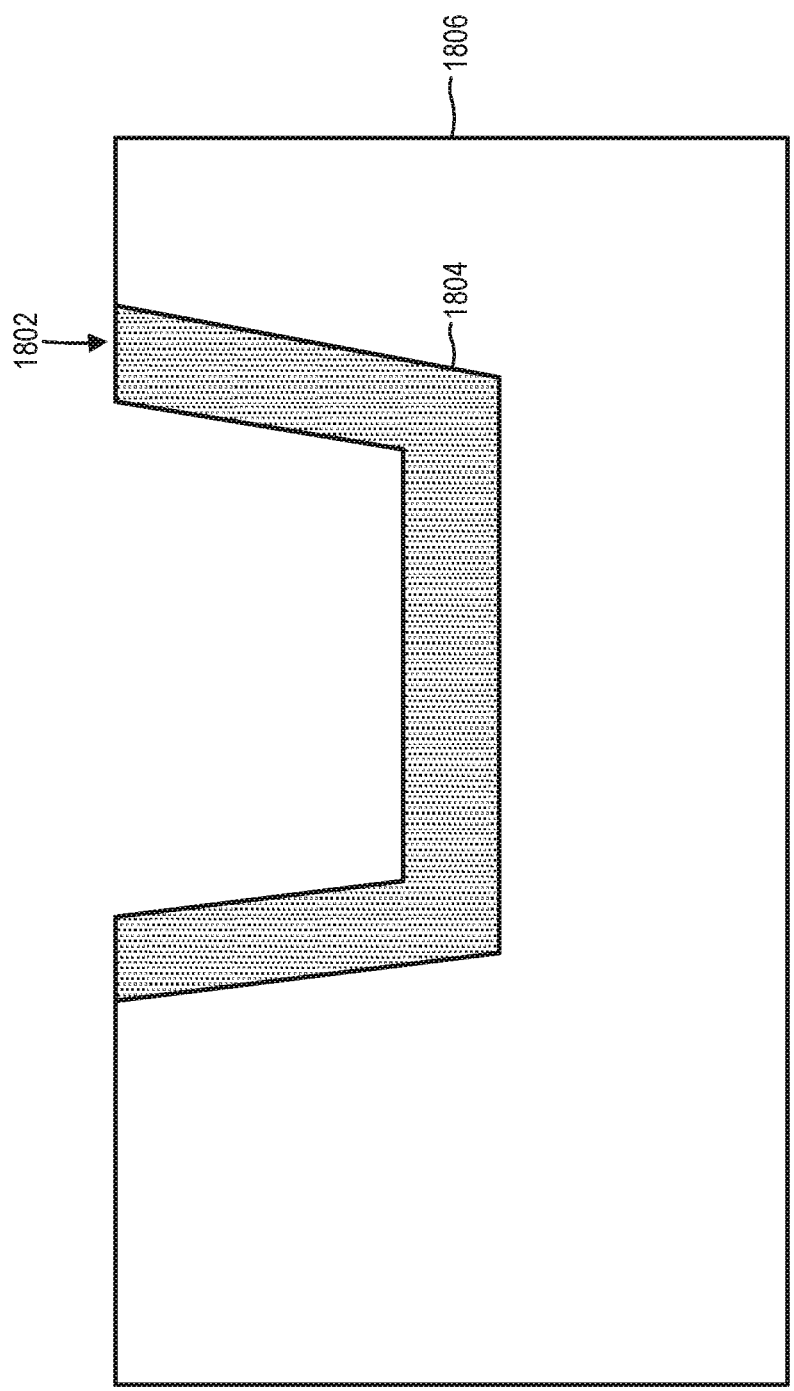
FIGS. 18A-18F illustrate another example of using the FIG. 16 method to form a trench capacitor, according to an embodiment.
Figure 18B:
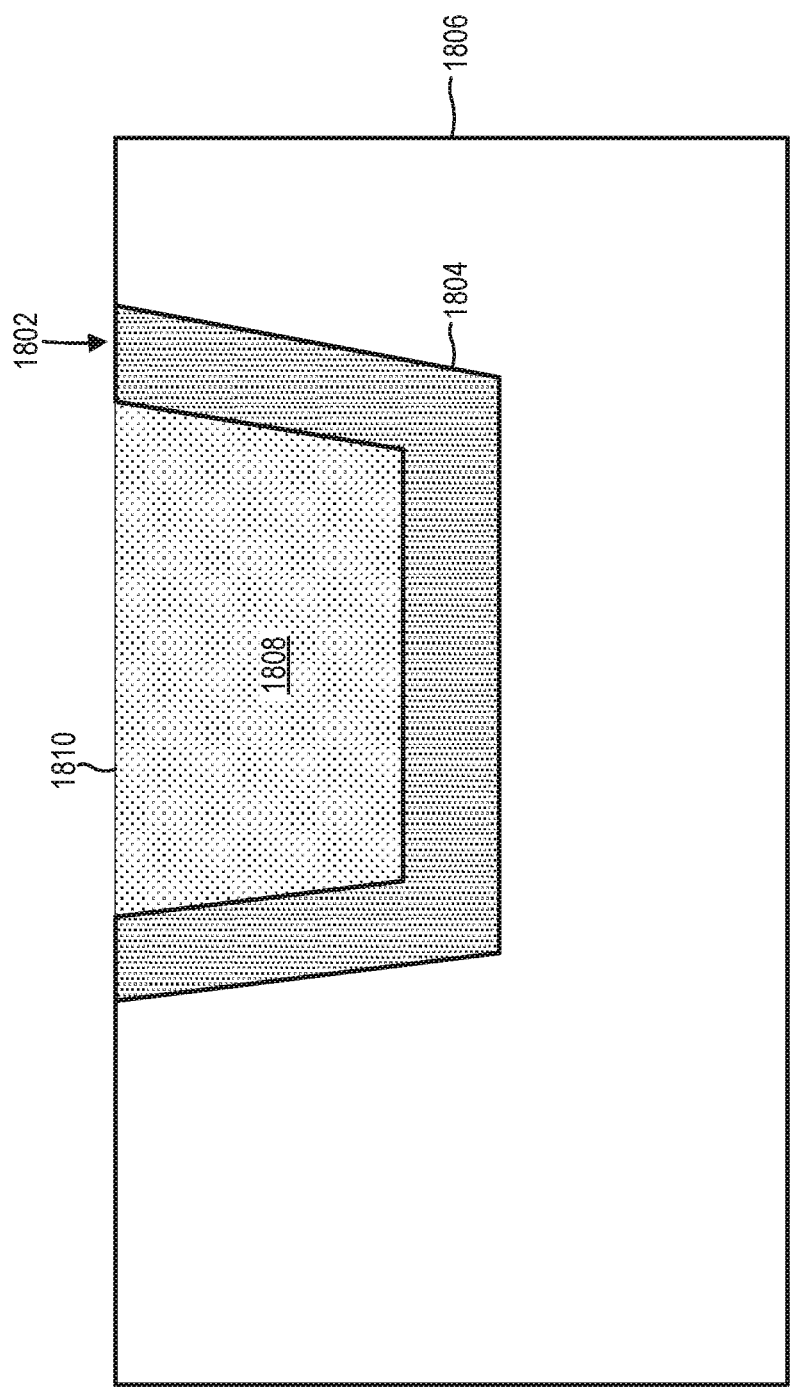
Figure 18C:
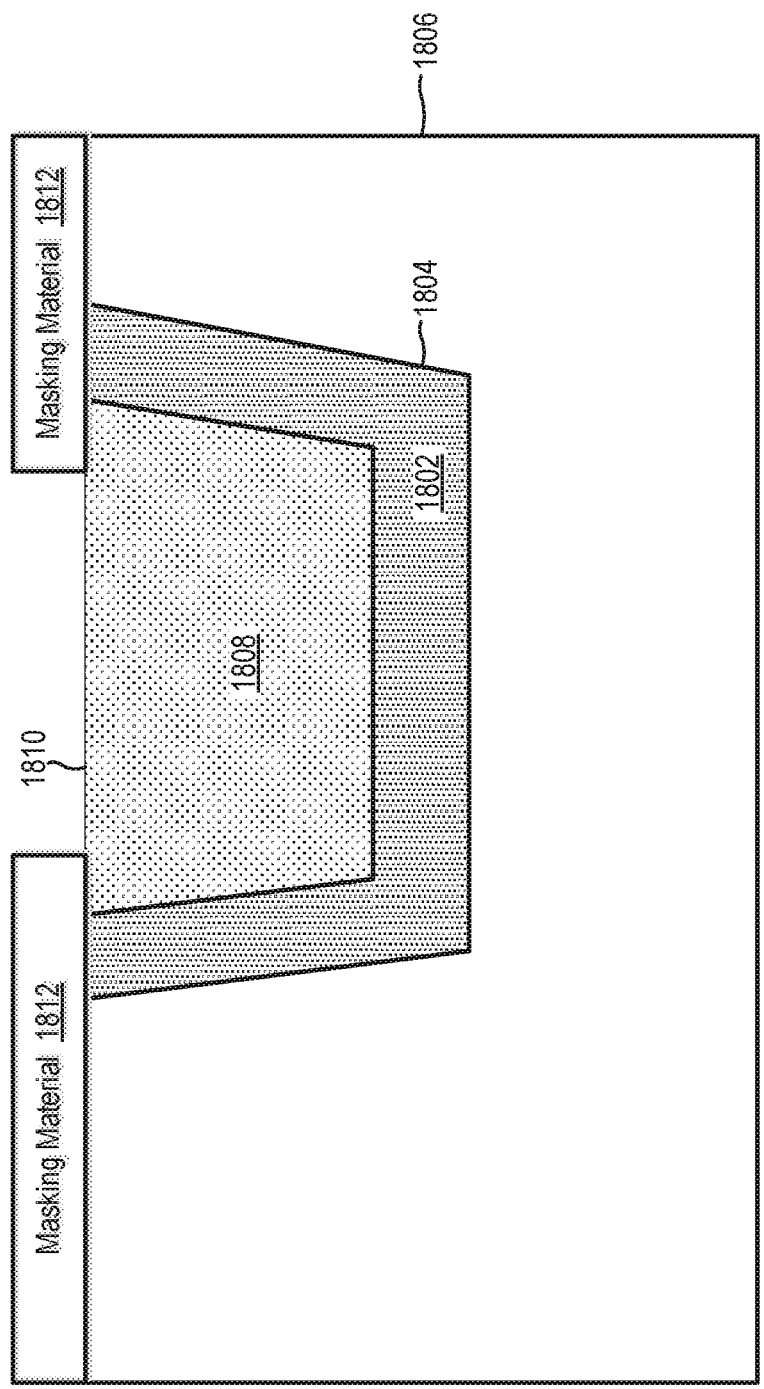
Figure 18D:
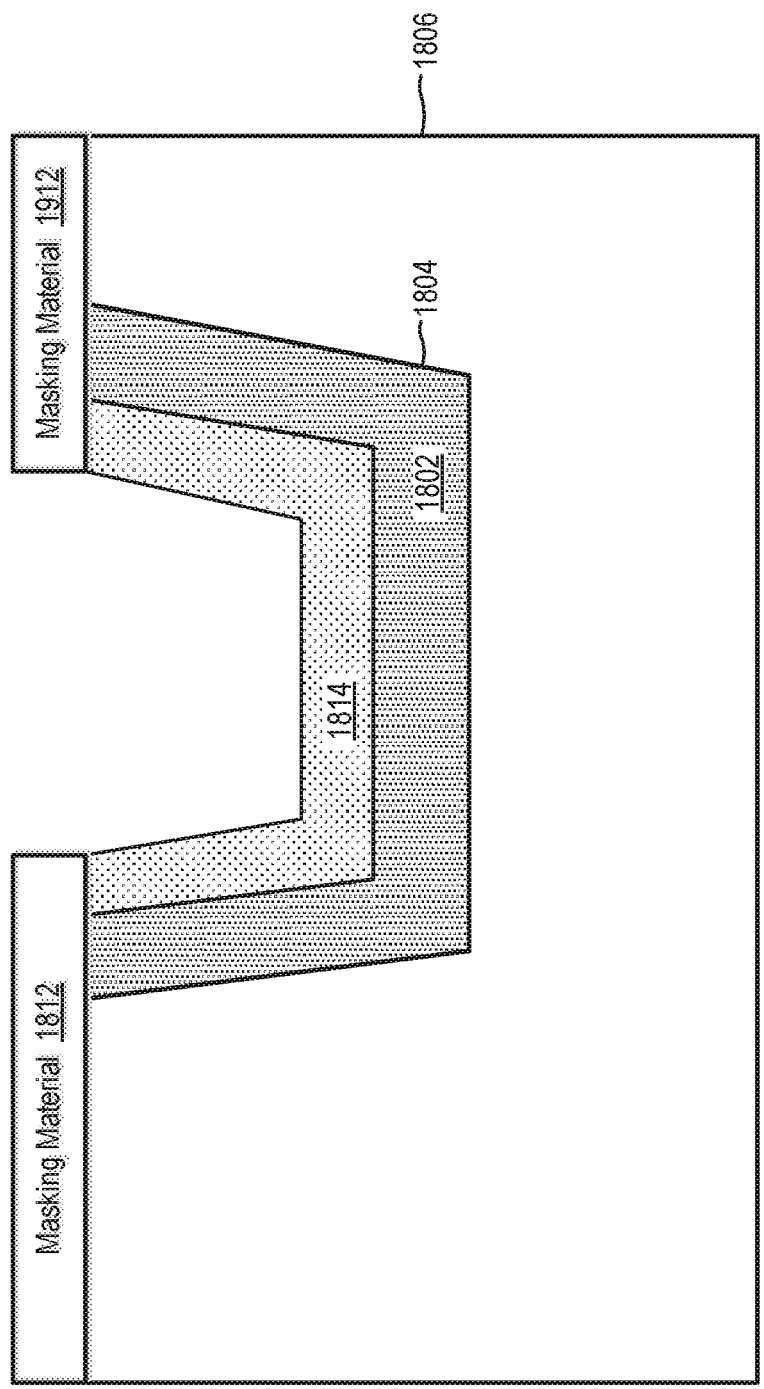
Figure 18E:
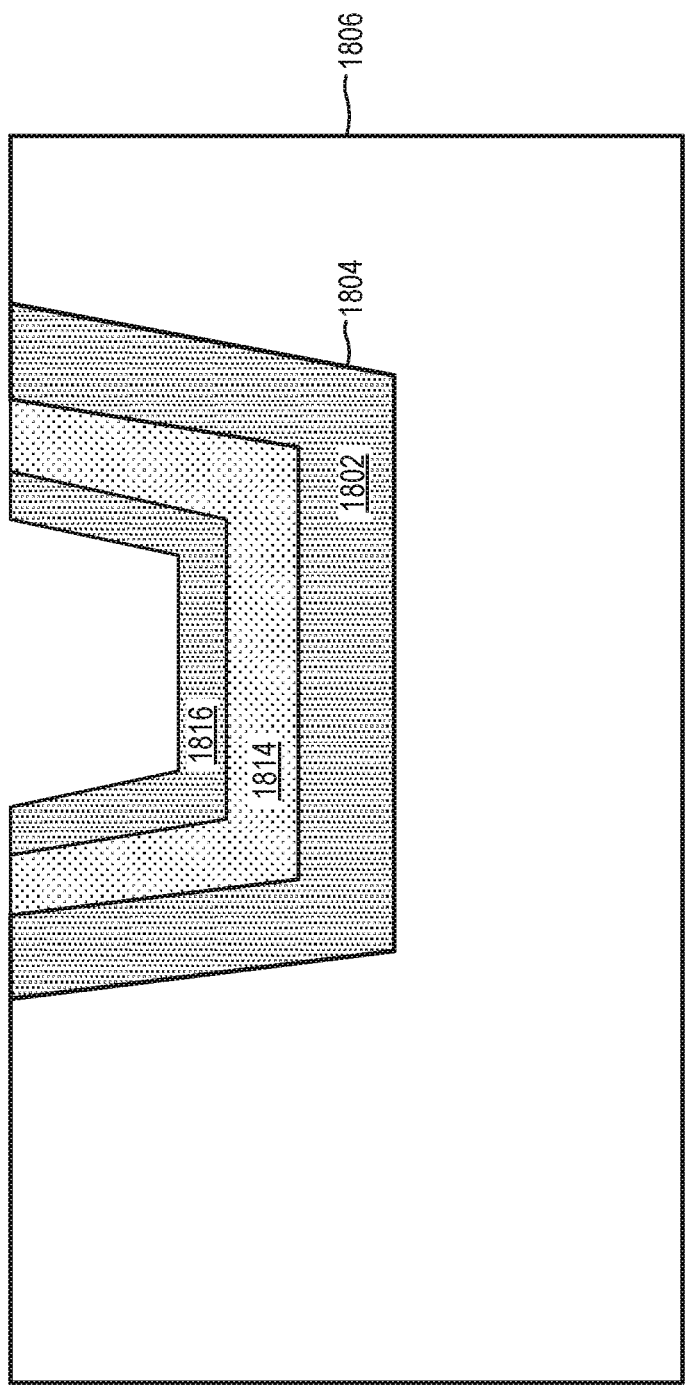
Figure 18F:
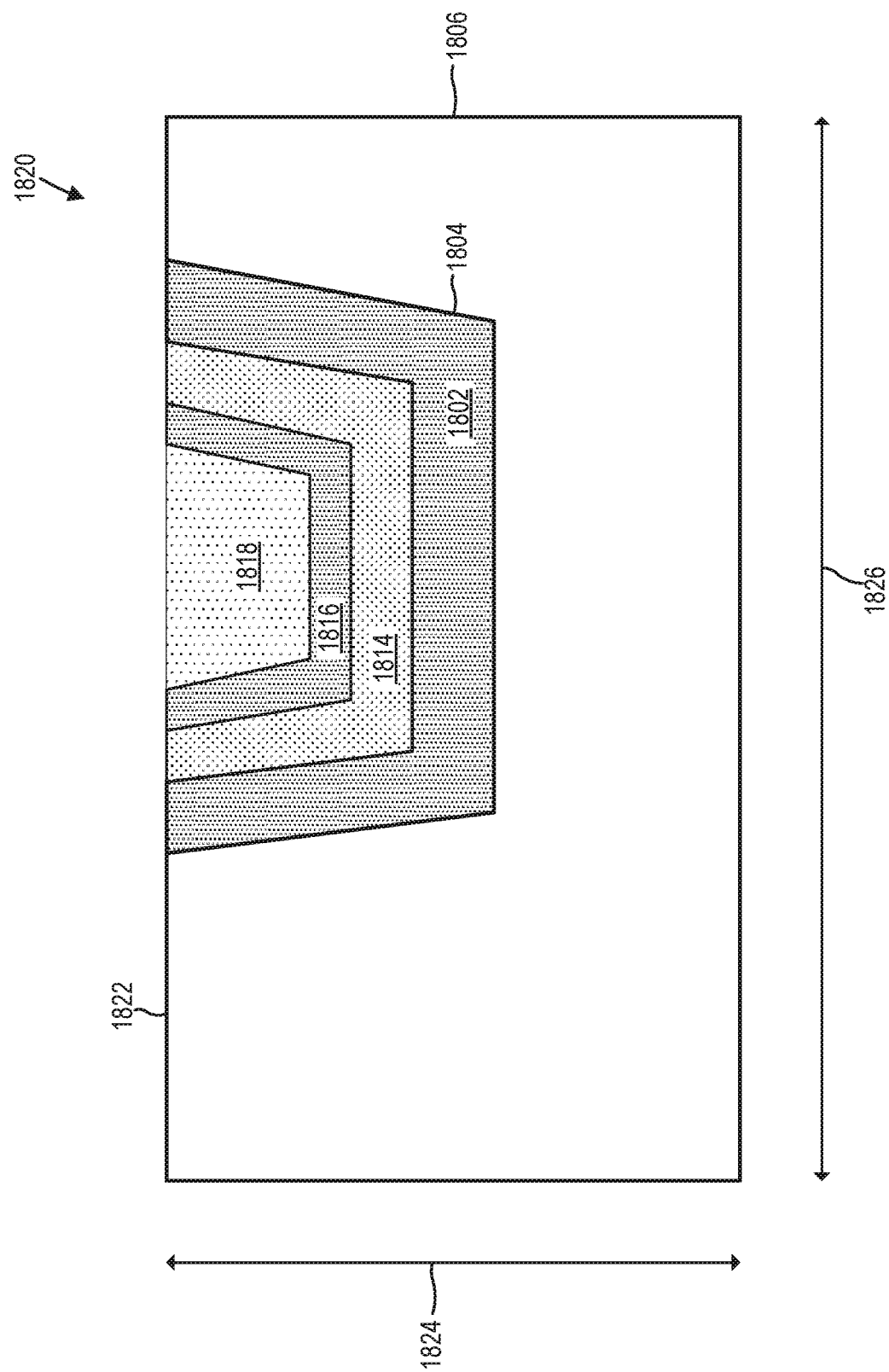

Certain embodiments of the above-discussed methods for forming vertical gates of LDMOS transistors may be adapted to form trench capacitors. For example, FIG. 16 illustrates a method 1600 for forming a trench capacitor, and FIG. 17A-17E illustrates in cross-sectional views an example of forming a trench capacitor according to method 1600. FIG. 18A-18F illustrates in cross-sectional views another example of forming a trench capacitor according to method 1600. FIGS. 16-18 are best viewed together.

In step 1602, a capacitor dielectric layer is formed in a trench of a silicon semiconductor structure. In one example of step 1602 illustrated in FIG. 17A, a capacitor dielectric layer 1702 is formed in a trench 1704 of a silicon semiconductor structure 1706. In another example of step 1602 illustrated in FIG. 18A, a capacitor dielectric layer 1802 is formed in a trench 1804 of a silicon semiconductor structure 1806. Capacitor dielectric layers 1702 and 1802 are formed, for example, of silicon dioxide or a high-K dielectric material such as one or more of $HfO_2$, $TiO_2$, $ZrO_2$, and $HfAlO_x$. In step 1604, the trench is filled with a first conductive material. In one example of step 1604 illustrated in FIG. 17B, trench 1704 is filled with a first conductive material 1708. In another example of step 1604 illustrated in FIG. 18B, trench 1804 is filled with a first conductive material 1808. First conductive materials 1708 and 1808 are, for example, polysilicon, and in one embodiment, step 1604 includes planarizing first conductive material 1708 and first conductive material 1808 to form flat top surfaces 1710 and 1810, respectively.

In step 1606, a portion of the first conductive material is removed from the trench to form a first capacitor conductor. In one example of step 1606 illustrated in FIGS. 17C and 17D, first conductive material 1708 is patterned with a masking material 1712, e.g., with photoresist, and a portion of first conductive material 1708 not covered by masking material 1712 is removed to form first capacitor conductor 1714. In another example of step 1606 illustrated in FIGS. 18C and 18D, first conductive material 1808 is patterned with a masking material 1812, e.g., with photoresist, and a portion of first conductive material 1808 not covered by masking material 1812 is removed to form first capacitor conductor 1814.

Step 1608 is optional. In step 1608, a spacer dielectric layer is disposed on the first conductive material in the trench. Step 1608 is not performed in the example of FIG. 17, but step 1608 is performed in the example of FIG. 18. In one example of step 1608 illustrated in FIG. 18E, a spacer dielectric layer 1816 is disposed on first capacitor conductor 1814. In step 1810, a portion of the trench not containing the first conductive material is filled with a second conductive material to form a second capacitor conductor. In one example of step 1610 illustrated in FIG. 17E, a portion of trench 1704 not containing first capacitor conductor 1714 is filled with second conductive material to form a second capacitor conductor 1718 and yield a trench capacitor 1720. In another example of step 1610 illustrated in FIG. 18F, a portion of trench 1804 not containing first capacitor conductor 1814 is filled with second conductive material to form a second capacitor conductor 1818 to yield a trench capacitor 1820.

In trench capacitor 1720, first capacitor conductor 1714 and second capacitor conductor 1718 each extend from an outer surface 1722 of silicon semiconductor structure 1706 in a thickness direction 1724. Capacitor dielectric layer 1702 separates each of first capacitor conductor 1714 and second capacitor conductor 1718 from silicon semiconductor structure 1706. In trench capacitor 1820, first capacitor conductor 1814 and second capacitor conductor 1818 each extend from an outer surface 1822 of silicon semiconductor structure 1806 in a thickness direction 1824. First capacitor conductor 1814 has an U-shape, and second capacitor conductor 1818 is disposed within first capacitor conductor 1814, as seen when the trench capacitor is viewed cross-sectionally in a plane extending in a lateral direction 1826 and in thickness direction 1824.

Figure 19:
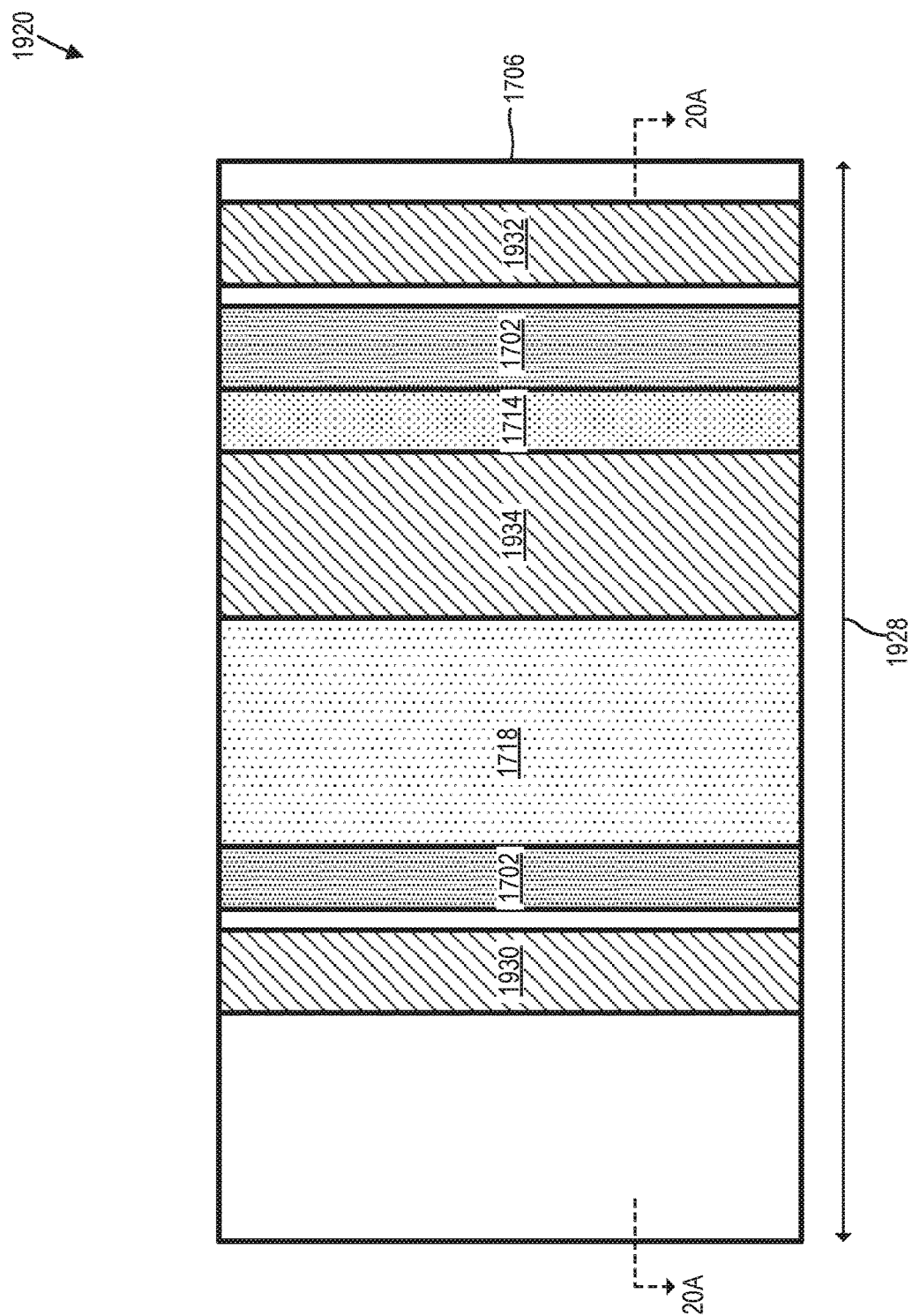
FIG. 19 is a top plan view of a trench capacitor where electrical interface to one side of a dielectric layer is achieved using a silicon semiconductor structure, according to an embodiment.
Figure 20:
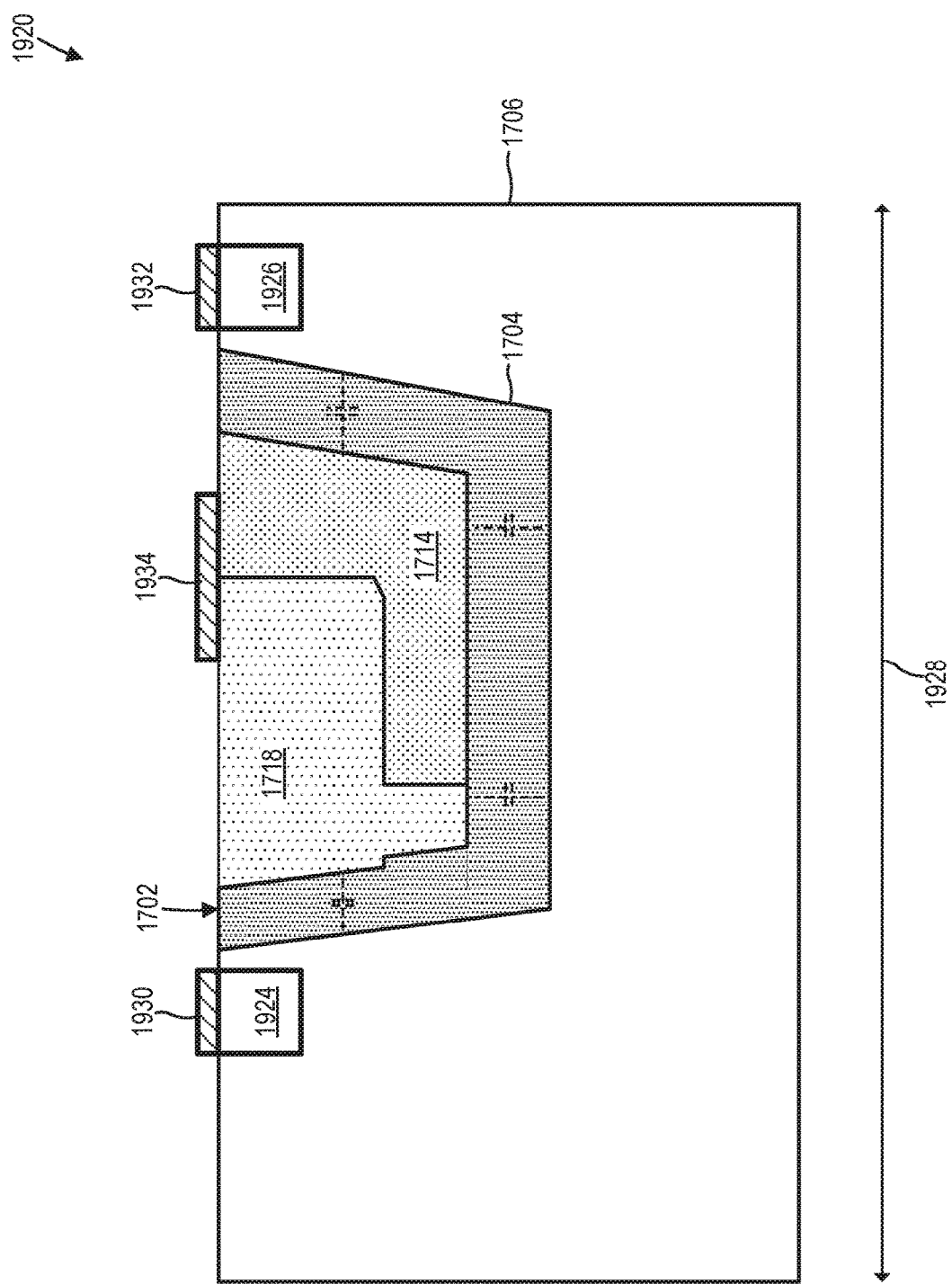
FIG. 20 is a cross-sectional view of the FIG. 19 trench capacitor taken along lines 20A-20A of FIG. 19.

Electrical interface to trench capacitors 1720 and 1820 can be achieved in several possible manners. For example, FIG. 19 is a top plan view of a trench capacitor 1920, and FIG. 20 is a cross-sectional view of trench capacitor 1920 taken along lines 20A-20A of FIG. 19. Trench capacitor 1920 is an embodiment of trench capacitor 1720 where electrical interface to one side of a dielectric layer is achieved using silicon semiconductor structure 1706. In particular, trench capacitor 1920 includes first and second impurity regions 1924 and 1926 in silicon semiconductor structure 1706, where first and second impurity regions 1924 and 1926 are either p-doped or n-doped. First impurity region 1924 and second impurity region 1926 are disposed on opposite sides of trench 1704 in a lateral direction 1928. Trench capacitor 1922 further includes a first electrode 1930, a second electrode 1932, and a third electrode 1934. First electrode 1930 is electrically coupled to first impurity region 1924, second electrode 1932 is electrically coupled to second impurity region 1926, and third electrode 1934 is electrically coupled to each of first capacitor conductor 1714 and second capacitor conductor 1718. Capacitor dielectric layer 1702 serves as a capacitive dielectric layer in trench capacitor 1920, as symbolically shown by capacitor symbols in FIG. 20.

Figure 21:
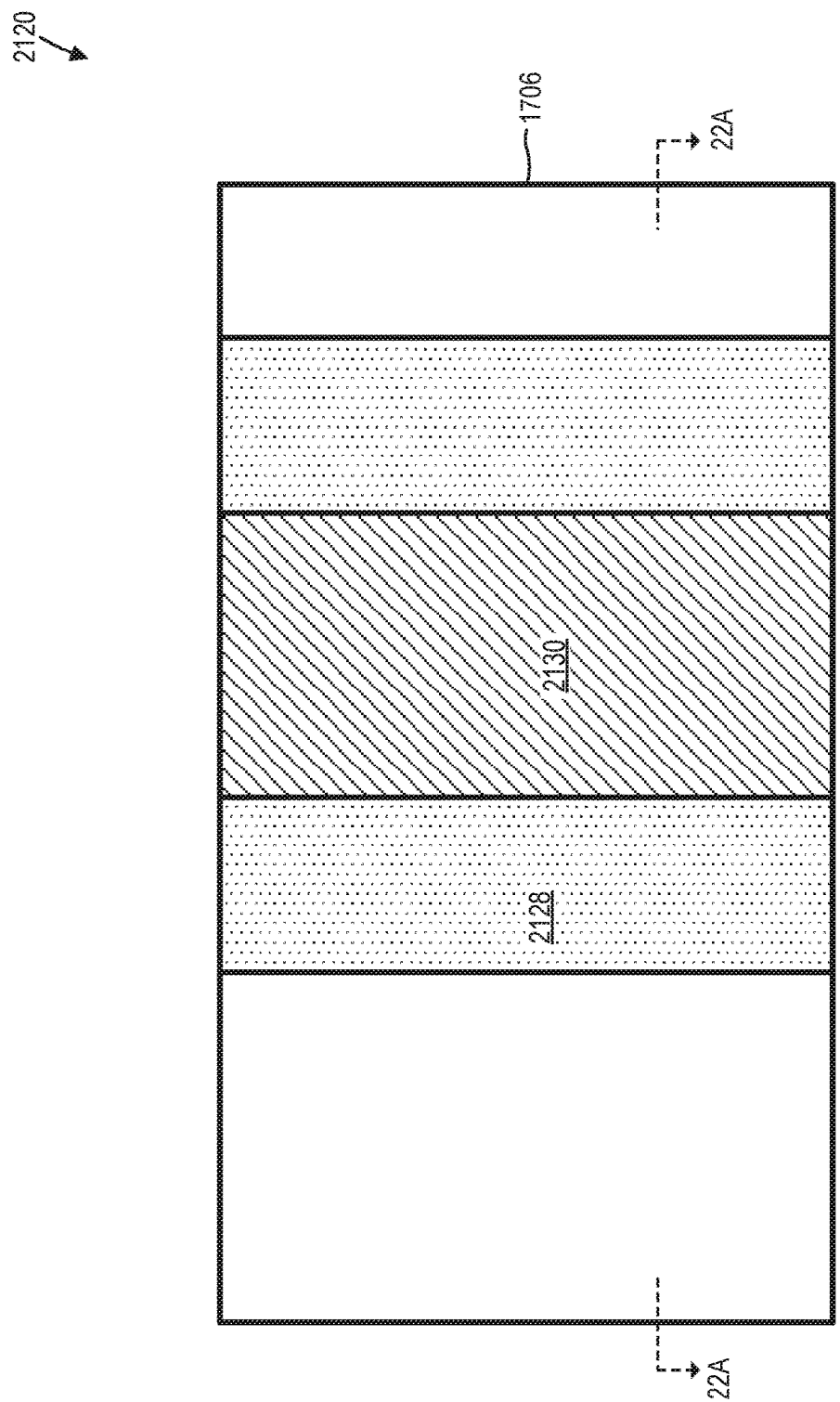
FIG. 21 is a top plan view of a trench capacitor where electrical interface to a dielectric layer is achieved without using silicon semiconductor structure, according to an embodiment.
Figure 22:
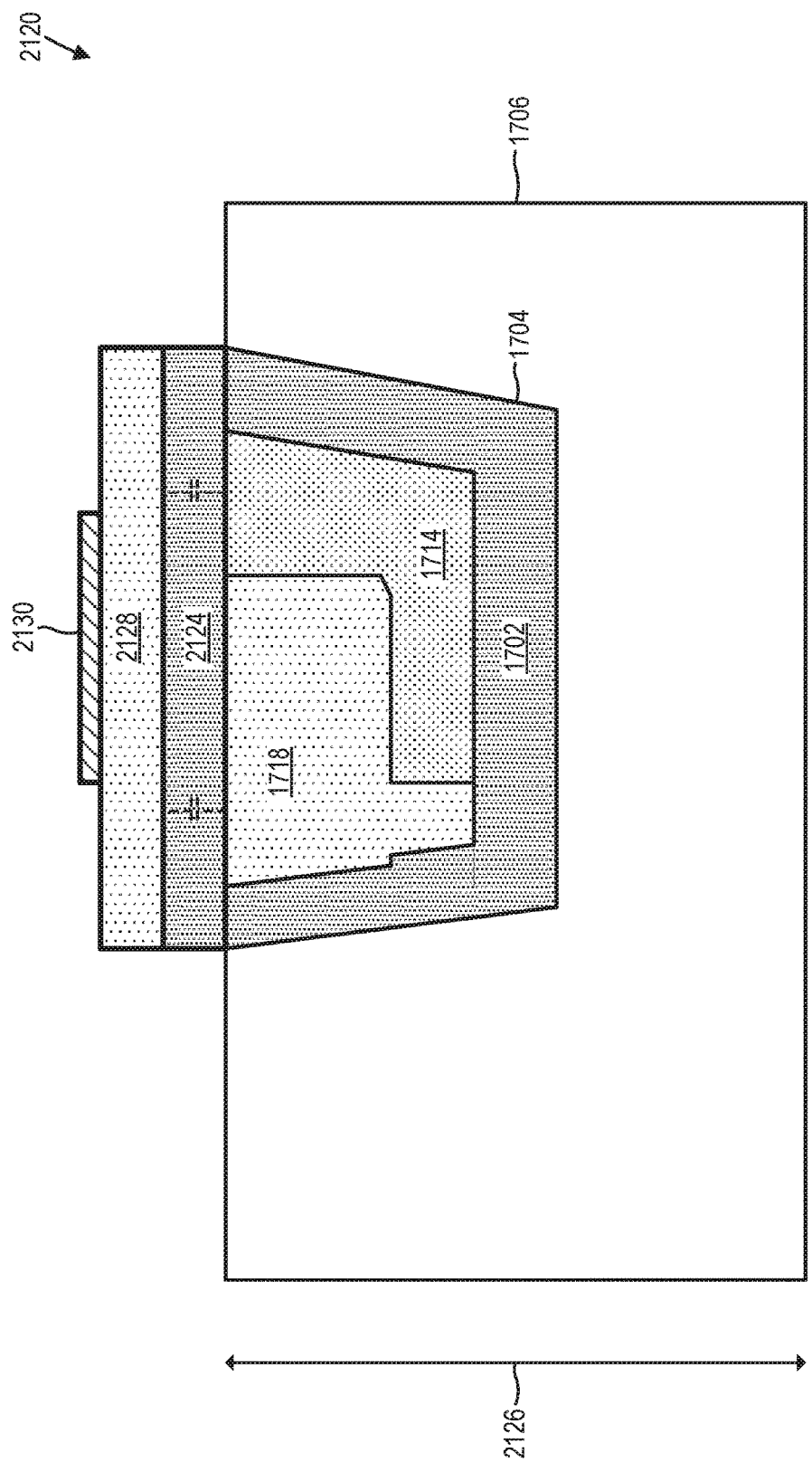
FIG. 22 is a cross-sectional view of the FIG. 21 trench capacitor taken along lines 22A-22A of FIG. 21.

Current flows from first and second electrodes 1930 and 1932 through silicon semiconductor structure 1706 to reach capacitor dielectric layer 1702 in trench capacitor 1920, and silicon semiconductor structure 1706 may exhibit non-linear conductivity as a function of voltage. Consequently, the capacitance value of trench capacitor 1920 may vary as a function of voltage applied to trench capacitor 1920. Such non-linearity in capacitance can be significantly reduced, or even essentially eliminated, by reducing or eliminating need for capacitor current to flow through semiconductor material. FIG. 21 is a top plan view of a trench capacitor 2120, and FIG. 22 is a cross-sectional view of trench capacitor 2120 taken along lines 22A-22A of FIG. 21. Trench capacitor 2120 is an embodiment of trench capacitor 1720 where electrical interface to a dielectric layer is achieved without using silicon semiconductor structure 1706.

Trench capacitor 2120 includes an additional dielectric layer 2124 disposed over each of first capacitor conductor 1714 and second capacitor conductor 1718 in a thickness direction 2126. Additional dielectric layer 2124 is formed, for example, of silicon dioxide or a high-K dielectric material such as one or more of $HfO_2$, $TiO_2$, $ZrO_2$, and $HfAlO_x$. Trench capacitor 2120 additionally includes an electrically conductive interface layer 2128 disposed on additional dielectric layer 2124 in thickness direction 2126. In some embodiments, electrically conductive interface layer 2128 is formed of polysilicon. Additionally, in particular embodiments, trench capacitor 2120 is part of an integrated circuit including both LDMOS and CMOS devices, and first capacitor conductor 1714 and second capacitor conductor 1718 are formed using method 1600, and electrically conductive interface layer 2128 is formed using a CMOS process. Additional dielectric layer 2124 serves as a capacitive dielectric layer in trench capacitor 2120, as symbolically shown by capacitor symbols in FIG. 22. Electrical interface to first capacitor conductor 1714 and second capacitor conductor 1718 is achieved via an electrode 2130 electrically coupled to electrically conductive interface layer 2128 and one or more additional electrodes (not shown) electrically coupled to first capacitor conductor 1714 and second capacitor conductor 1718.

Figure 23:
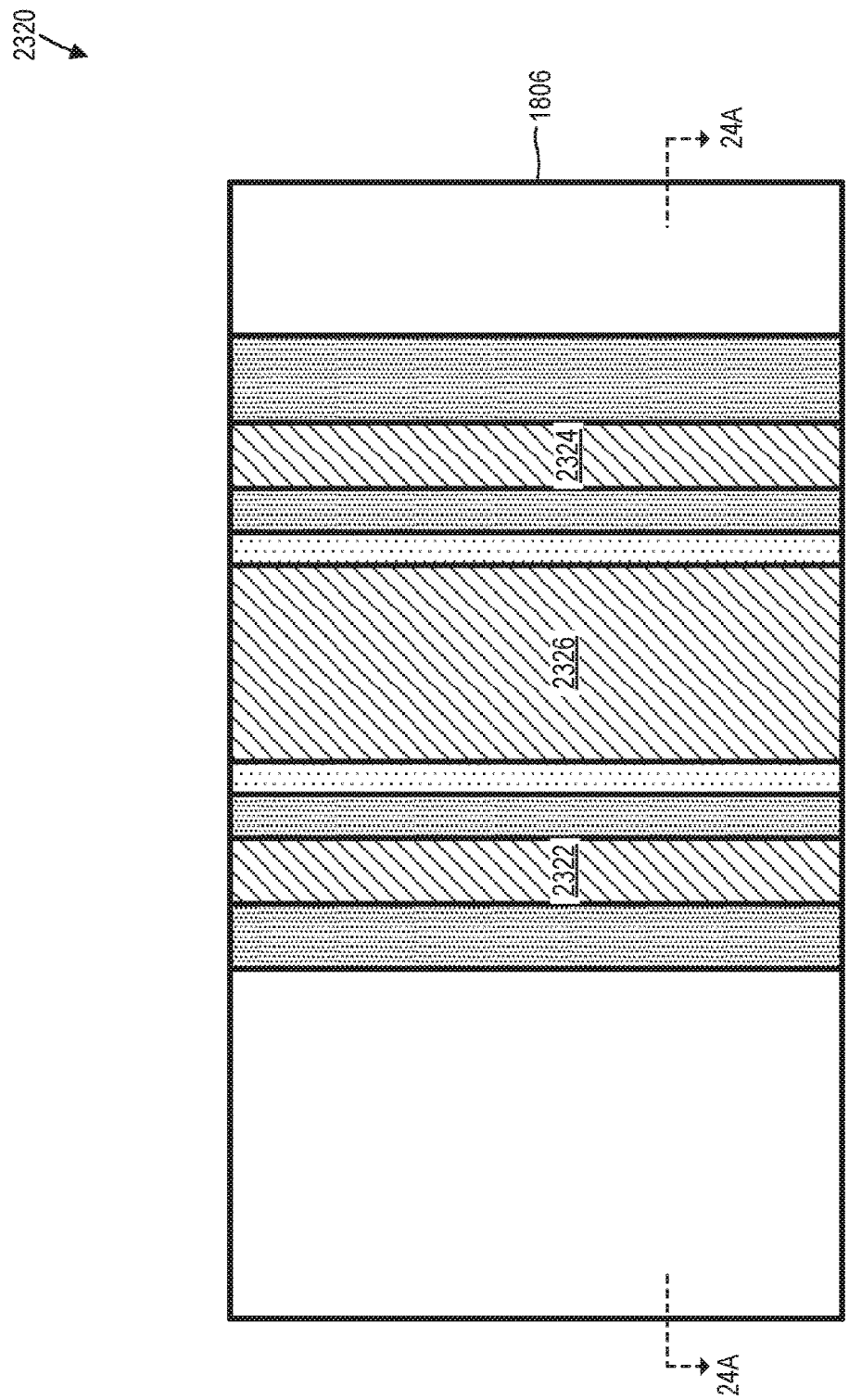
FIG. 23 is a top plan view of another trench capacitor where electrical interface to a dielectric layer is achieved without using silicon semiconductor structure, according to an embodiment.
Figure 24:
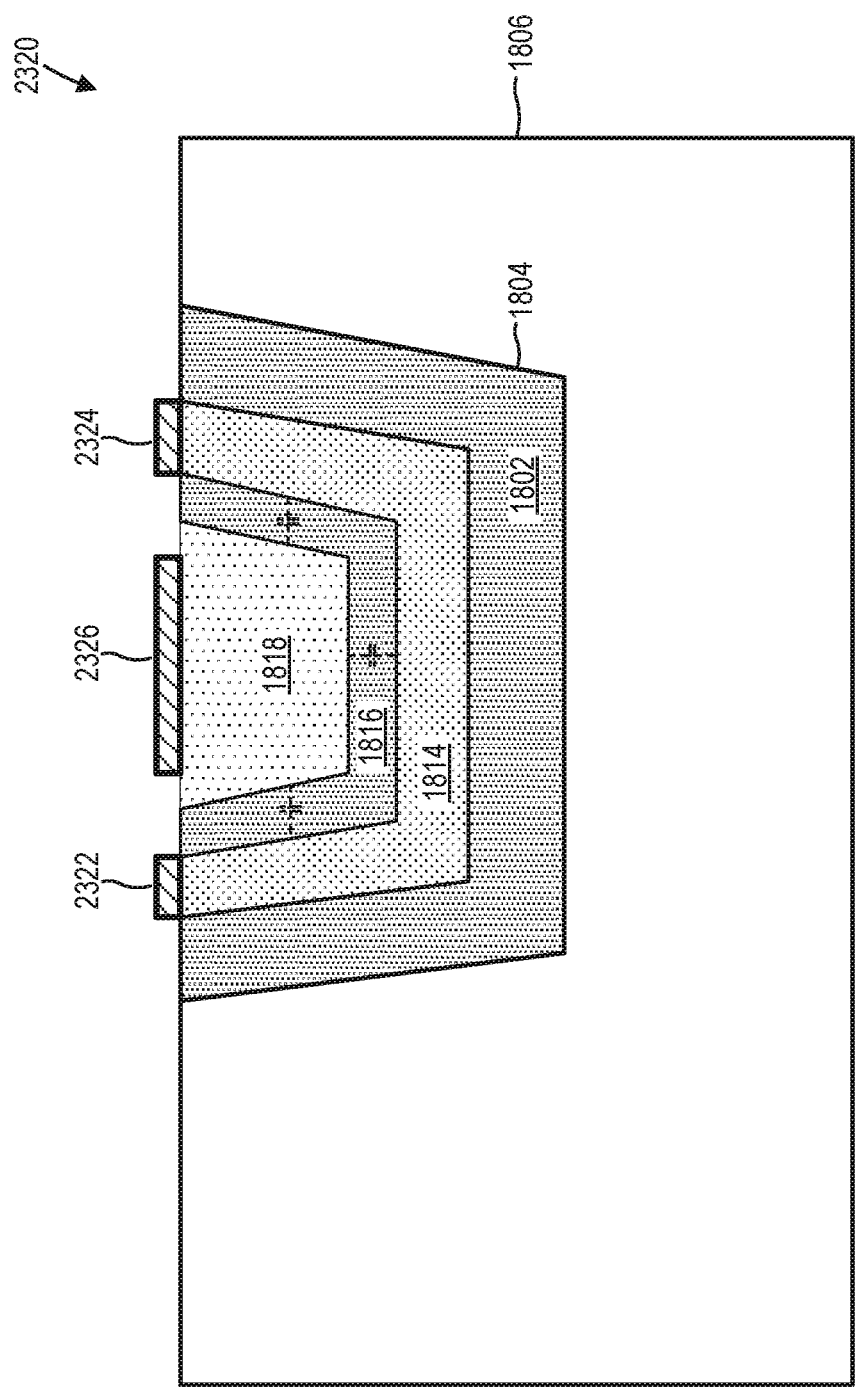
FIG. 24 is a cross-sectional view of the FIG. 23 trench capacitor taken along lines 24A-24A of FIG. 23.

FIG. 23 is a top plan view of a trench capacitor 2320, and FIG. 24 is a cross-sectional view of trench capacitor 2320 taken along lines 24A-24A of FIG. 23. Trench capacitor 2320 is an embodiment of trench capacitor 1820 where electrical interface to a dielectric layer is achieved without using silicon semiconductor structure 1806. Trench capacitor 2320 includes electrodes 2322, 2324, and 2326. Each of electrodes 2322 and 2324 is electrically coupled to first capacitor conductor 1814, and electrode 2326 is electrically coupled to second capacitor conductor 1818. Consequently, spacer dielectric layer 1816 serves as a capacitive dielectric layer in trench capacitor 2320, as symbolically shown by capacitor symbols in FIG. 24.

Figure 25:
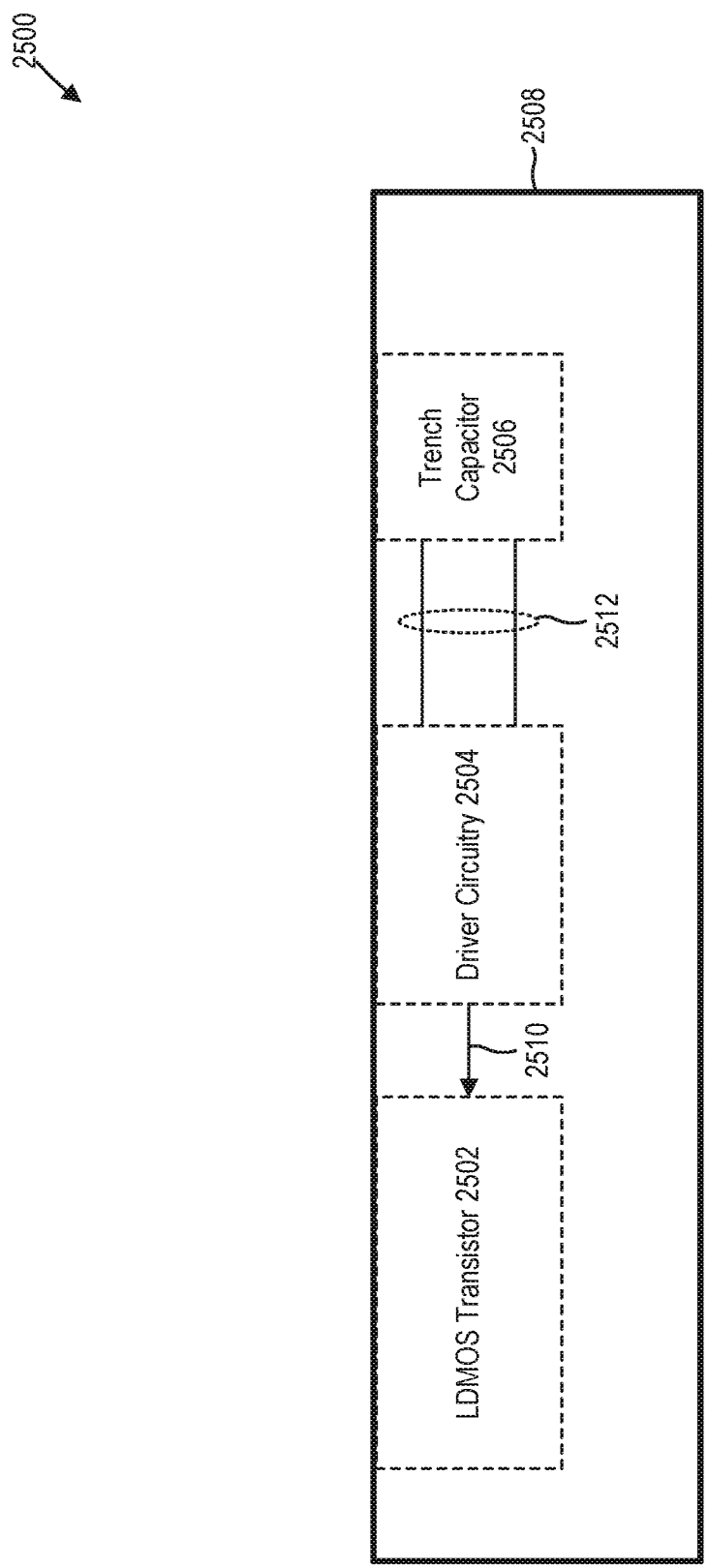
FIG. 25 schematically illustrates an integrated circuit include a LDMOS transistor, driver circuitry, and a trench capacitor, according to an embodiment

The methods disclosed herein for forming vertical gates of LDMOS transistors and for forming trench capacitors can be used to form both LDMOS transistor gates and trench capacitors in a single integrated circuit. For example, FIG. 25 schematically illustrates an integrated circuit 2500 include a LDMOS transistor 2504, driver circuitry 2560, and a trench capacitor 2506, each disposed in a silicon semiconductor structure 2508. LDMOS transistor 2502 is, for example, one of LDMOS transistor 300, LDMOS transistor 500, LDMOS transistor 600, LDMOS transistor 800, or LDMOS transistor 900. Driver circuitry 2504 is configured to generate a gate control signal 2510 to drive the gate of LDMOS transistor 2502, and driver circuitry 2504 is powered from a power rail 2512. Trench capacitor 2506 is electrically coupled across power rail 2512 to provide decoupling on power rail 2512. Trench capacitor 2506 is, for example, one of trench capacitor 1720, trench capacitor 1820, trench capacitor 1920, trench capacitor 2120, or trench capacitor 2320.

Combinations of Features

Features described above may be combined in various ways without departing from the scope hereof. The following examples illustrate some possible combinations:

(A1) A lateral double-diffused metal-oxide-semiconductor (LDMOS) transistor may include a silicon semiconductor structure and a vertical gate. The vertical gate may include (1) a first gate conductor and a second gate conductor each extending from a first outer surface of the silicon semiconductor structure into the silicon semiconductor structure in a thickness direction, (2) a first separation dielectric layer separating the first gate conductor from the second gate conductor within the vertical gate, and (3) a gate dielectric layer separating each of first the gate conductor and the second gate conductor from the silicon semiconductor structure.

(A2) In the LDMOS transistor denoted as (A1), the first separation dielectric layer may separate the first gate conductor from the second gate conductor in each of the thickness direction and a lateral direction, the lateral direction being orthogonal to the thickness direction.

(A3) In any one of the LDMOS transistors denoted as (A1) and (A2), the first gate conductor may be adjacent to a drain region of the LDMOS transistor in the lateral direction.

(A4) In any one of the LDMOS transistors denoted as (A1) through (A3), the second gate conductor may be adjacent to a source region of the LDMOS transistor in the lateral direction.

(A5) In any one of the LDMOS transistors denoted as (A1) through (A4), the silicon semiconductor structure may include (1) a base layer, (2) an n-type layer disposed over the base layer in a thickness direction, (3) a p-body region disposed in the n-type layer, (4) a source n+ region disposed in the p-body region, and (5) a drain n+ region disposed in the n-type layer. Each of the first gate conductor and the second gate conductor may be disposed between the source n+ region and the drain n+ region in the lateral direction.

(A6) The LDMOS transistor denoted as (A5) may further include (1) a source electrode electrically coupled to the source n+ region, (2) a drain electrode electrically coupled to the drain n+ region, and (3) a first gate electrode electrically coupled to the first gate conductor.

(A7) In the LDMOS transistor denoted as (A6), the first gate electrode may be additionally electrically coupled to the second gate conductor.

(A8) The LDMOS transistor denoted as (A6) may further include a second gate electrode electrically coupled to the second gate conductor.

(A9) In any one of the LDMOS transistors denoted as (A5) through (A8), the base layer may be selected from the group consisting of an n-type high-voltage well in a silicon substrate, a p-type silicon substrate, and an n-type epitaxial layer.

(A10) Any one of the LDMOS transistors denoted as (A5) through (A9) may further include a p-type reduced surface field effect (RESURF) layer disposed below the vertical gate in the thickness direction.

(A11) In any one of the LDMOS transistors denoted as (A1) through (A10), the vertical gate may further includes (1) a third gate conductor and (2) a second separation dielectric layer separating the first gate conductor from the third gate conductor within the vertical gate.

(A12) In the LDMOS transistor denoted as (A11), the second separation dielectric layer may separate the first gate conductor from the third gate conductor in the thickness direction.

(A13) In any one of the LDMOS transistors denoted as (A11) and (A12), the gate dielectric layer may further separate the third gate conductor from the silicon semiconductor structure.

(A14) In any one of the LDMOS transistors denoted as (A11) through (A13), the first gate conductor may be adjacent to a drain region of the LDMOS transistor in the lateral direction, the second gate conductor may be adjacent to a source region of the LDMOS transistor in the lateral direction, and the third gate conductor may be adjacent to a well region of the LDMOS transistor in the thickness direction.

(A15) In any one of the LDMOS transistors denoted as (A1) through (A14), the gate dielectric layer may include a least three dielectric sections, each of the at least three dielectric sections separating the gate conductor from the silicon semiconductor structure by a respective separation distance, each of the respective separation distances being different from each other of the respective separation distances.

(A16) In any one of the LDMOS transistors denoted as (A1) through (A15), the first separation dielectric layer may be formed of silicon dioxide.

(A17) In any one of the LDMOS transistors denoted as (A1) through (A15), the first separation dielectric layer may be formed of one or more high-K dielectric materials.

(A18) In the LDMOS transistor denoted as (A17), the one or more high-K dielectric materials may include at least one of $HfO_2$, $TiO_2$, $ZrO_2$, and $HfAlO_x$.

(B1) An integrated circuit may include (1) any one of the LDMOS transistors denoted as (A1) through (A18) and (2) a trench capacitor, including (i) a first capacitor conductor and a second capacitor conductor each extending from the first outer surface of the silicon semiconductor structure into the silicon semiconductor structure in the thickness direction, and (ii) a capacitor dielectric layer separating each of the first capacitor conductor and the second capacitor conductor from the silicon semiconductor structure.

(B2) The integrated circuit denoted as (B1) may further include a spacer dielectric layer separating the first gate conductor from the second gate conductor within the vertical gate.

(B3) In any one of the integrated circuits denoted as (B1) and (B2), the second capacitor conductor may be disposed within the first capacitor conductor, as seen when the trench capacitor is viewed cross sectionally in a plane extending in the thickness direction and in a lateral direction, the lateral direction being orthogonal to the thickness direction.

(B4) In any one of the integrated circuits denoted as (B1) through (B3), the first capacitor conductor may have an U-shape, as seen when the trench capacitor is viewed cross-sectionally in the plane extending in the thickness direction and in the lateral direction.

(B5) Any one of the integrated circuits denoted as (B1) through (B4) may further include (1) an additional dielectric layer disposed over each of the first capacitor conductor and the second capacitor conductor in the thickness direction and (2) an electrically conductive interface layer disposed on the additional dielectric layer in the thickness direction.

(B6) Any one of the integrated circuits denoted as (B1) through (B5) may further include driver circuitry configured to drive the vertical gate of the LDMOS transistor, wherein (1) the driver circuitry is powered from a first power rail and (2) the trench capacitor is electrically coupled across the first power rail.

(C1) A method for forming a vertical gate of a lateral double-diffused metal-oxide-semiconductor (LDMOS) transistor may include the steps of (1) forming a trench dielectric layer in a trench of a silicon semiconductor structure, (2) filling the trench with a first conductive material, (3) removing a portion of the first conductive material from the trench, (4) after the step of removing the portion of the first conductive material from the trench, removing a portion of the trench dielectric layer in a first area of the trench, (5) disposing a first separation dielectric layer on the first conductive material in the trench, (6) forming a source portion of a gate dielectric layer in the first area of the trench, and (7) filling a portion of the trench not containing the first conductive material with a second conductive material.

(C2) The method denoted as (C1) may further include, before filing the trench with the first conductive material, (1) filing the trench with a third conductive material, (2) removing a portion of the third conductive material from the trench, and (3) after the step of removing the portion of the third conductive material from the trench, disposing a second separation dielectric layer on the third conductive material.

(C3) In any one of the methods denoted as (C1) and (C2), the step of removing the portion of the first conductive material from the trench may include (1) patterning the first conductive material with masking material and (2) etching a surface of the first conductive material not covered by the masking material.

(C4) In any one of the methods denoted as (C1) through (C3), the step of disposing the first separation dielectric layer on the first conductive material in the trench may include (1) disposing dielectric material in the trench and (2) removing extraneous dielectric material from a sidewall of the trench.

(C5) Any one of the methods denoted as (C1) through (C4) may further include, after the step of filling the portion of the trench not containing the first conductive material with the second conductive material, (1) disposing a silicide layer on each of the first conductive material and the second conductive material and (2) disposing a first gate electrode on the silicide layer, such that the first gate electrode is electrically coupled to each of the first conductive material and the second conductive material.

(C6) Any one of the methods denoted as (C1) through (C4) may further include, after the step of filling the portion of the trench not containing the first conductive material with the second conductive material, (1) disposing a first silicide layer and a second silicide layer on each of the first conductive material and the second conductive material, respectively and (2) disposing a first gate electrode and a second gate electrode on the first silicide layer and the second silicide layer, respectively, such that the first gate electrode is electrically coupled to the first conductive material and the second gate electrode is electrically coupled to the second conductive material.

(D1) A method for forming an integrated circuit may include (1) forming a vertical gate of a LDMOS transistor according any one of the methods denoted as (C1) through (C6) and (2) executing at least the following steps to form a trench capacitor: (i) forming a capacitor dielectric layer in a second trench of the silicon semiconductor structure, (ii) filling the second trench with a third conductive material, (iii) removing a portion of the third conductive material from the second trench, and (iv) filling a portion of the second trench not containing the third conductive material with a fourth conductive material.

(D2) The method denoted as (D1) may further include after the step of removing the portion of the third conductive material but before the step of filling the second trench with the fourth conductive material, disposing a spacer dielectric layer on the third conductive material in the second trench.

Changes may be made in the above devices, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present devices, methods, and systems, which, as a matter of language, might be said to fall therebetween.

What is claimed is:

1. A lateral double-diffused metal-oxide-semiconductor (LDMOS) transistor, comprising:
   a silicon semiconductor structure; and
   a vertical gate, including:
      a first gate conductor and a second gate conductor each extending from a first outer surface of the silicon semiconductor structure into the silicon semiconductor structure in a thickness direction,
      a first separation dielectric layer separating the first gate conductor from the second gate conductor within the vertical gate in each of the thickness direction and a lateral direction, the lateral direction being orthogonal to the thickness direction, and
      a gate dielectric layer separating each of first the gate conductor and the second gate conductor from the silicon semiconductor structure, wherein:
         the gate dielectric layer separates the first gate conductor from a first source region of the LDMOS transistor by a separation distance $t_2$ in the lateral direction,
         the gate dielectric layer separates the second gate conductor from the first source region of the LDMOS transistor by a separation distance $t_3$ in the lateral direction, and
         the separation distance $t_2$ is greater than the separation distance $t_3$.

2. The LDMOS transistor of claim 1, wherein the first gate conductor is adjacent to a drain region of the LDMOS transistor in the lateral direction.

3. The LDMOS transistor of claim 2, wherein the second gate conductor is adjacent to the first source region of the LDMOS transistor in the lateral direction.

4. The LDMOS transistor of claim 1, wherein:
   the silicon semiconductor structure includes:
      a base layer,
      an n-type layer disposed over the base layer in the thickness direction,
      a p-body region disposed in the n-type layer,
      a source n+ region disposed in the p-body region, and
      a drain n+ region disposed in the n-type layer; and
   each of the first gate conductor and the second gate conductor is disposed between the source n+ region and the drain n+ region in the lateral direction.

5. The LDMOS transistor of claim 4, further comprising:
   a source electrode electrically coupled to the source n+region;
   a drain electrode electrically coupled to the drain n+region; and
   a first gate electrode electrically coupled to the first gate conductor.

6. The LDMOS transistor of claim 5, wherein the first gate electrode is additionally electrically coupled to the second gate conductor.

7. The LDMOS transistor of claim 5, further comprising a second gate electrode electrically coupled to the second gate conductor.

8. The LDMOS transistor of claim 4, further comprising a p-type reduced surface field effect (RESURF) layer disposed below the vertical gate in the thickness direction.

9. The LDMOS transistor of claim 1, wherein the vertical gate further includes:
   a third gate conductor; and
   a second separation dielectric layer separating the first gate conductor from the third gate conductor within the vertical gate.

10. The LDMOS transistor of claim 9, wherein the second separation dielectric layer separates the first gate conductor from the third gate conductor in the thickness direction.

11. The LDMOS transistor of claim 9, wherein the gate dielectric layer further separates the third gate conductor from the silicon semiconductor structure.

12. The LDMOS transistor of claim 9, wherein:
   the first gate conductor is adjacent to a drain region of the LDMOS transistor in the lateral direction;
   the second gate conductor is adjacent to the first source region of the LDMOS transistor in the lateral direction; and the third gate conductor is adjacent to a well region of the LDMOS transistor in the thickness direction.

13. An integrated circuit, comprising:
the LDMOS transistor of claim 1; and
a trench capacitor, including:
- a first capacitor conductor and a second capacitor conductor each extending from the first outer surface of the silicon semiconductor structure into the silicon semiconductor structure in the thickness direction, and
- a capacitor dielectric layer separating each of the first capacitor conductor and the second capacitor conductor from the silicon semiconductor structure.

14. The integrated circuit of claim 13, further comprising a spacer dielectric layer separating the first capacitor conductor from the second capacitor conductor within the vertical gate.

15. The integrated circuit of claim 13, further comprising driver circuitry configured to drive the vertical gate of the LDMOS transistor, wherein:
the driver circuitry is powered from a first power rail; and
the trench capacitor is electrically coupled across the first power rail.

* * * * *